(12) United States Patent
Yanagisawa et al.

(10) Patent No.: US 11,063,094 B2
(45) Date of Patent: Jul. 13, 2021

(54) DISPLAY DEVICE AND ELECTRONIC DEVICE

(71) Applicant: Semiconductor Energy Laboratory Co., Ltd., Kanagawa-ken (JP)

(72) Inventors: Yuichi Yanagisawa, Kanagawa (JP); Takuya Kawata, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/523,242

(22) Filed: Jul. 26, 2019

(65) Prior Publication Data
US 2019/0348481 A1  Nov. 14, 2019

Related U.S. Application Data

(63) Continuation of application No. 15/865,482, filed on Jan. 9, 2018, now Pat. No. 10,367,043, which is a (Continued)

(30) Foreign Application Priority Data

Jul. 25, 2014  (JP) ................... 2014-152036

(51) Int. Cl.
*H01L 27/32* (2006.01)
*H01L 51/52* (2006.01)
*H01L 29/786* (2006.01)

(52) U.S. Cl.
CPC ...... *H01L 27/3244* (2013.01); *H01L 29/7869* (2013.01); *H01L 51/524* (2013.01);
(Continued)

(58) Field of Classification Search
CPC ............... H01L 51/524; H01L 51/5253; H01L 2251/5338; H01L 27/3244; H01L 27/3251; H01L 27/3253; H01L 27/3276
See application file for complete search history.

(56) References Cited

U.S. PATENT DOCUMENTS 6,798,467 B2   9/2004  Tasaki et al.
7,316,964 B2   1/2008  Akiyama
(Continued)

FOREIGN PATENT DOCUMENTS

CN   102738203 A   10/2012
CN   103119505 A    5/2013
(Continued)

OTHER PUBLICATIONS

International Search Report re Application No. PCT/IB2015/055308, dated Dec. 8, 2015.
(Continued)

*Primary Examiner* — Thanhha S Pham
(74) *Attorney, Agent, or Firm* — Husch Blackwell LLP

(57) ABSTRACT

A highly reliable display device. A first flexible substrate and a second flexible substrate overlap each other with a display element positioned therebetween. Side surfaces of at least one of the first substrate and the second substrate which overlap each other are covered with a high molecular material having a light-transmitting property. The high molecular material is more flexible than the first substrate and the second substrate.

24 Claims, 36 Drawing Sheets

Related U.S. Application Data continuation of application No. 14/806,271, filed on Jul. 22, 2015, now Pat. No. 9,876,059.

(52) U.S. Cl.
CPC .... *H01L 51/5253* (2013.01); *H01L 29/78648* (2013.01); *H01L 29/78696* (2013.01); *H01L 2251/5338* (2013.01)

(56) References Cited

U.S. PATENT DOCUMENTS

| | | | |
|---|---|---|---|
| 8,264,144 | B2 | 9/2012 | Oikawa et al. |
| 8,415,208 | B2 | 4/2013 | Takayama et al. |
| 8,436,122 | B2 | 5/2013 | Kho et al. |
| 8,441,007 | B2 | 5/2013 | Arai |
| 8,482,196 | B2 | 7/2013 | Moriwaki |
| 8,629,434 | B2 | 1/2014 | Arai |
| 8,698,131 | B2 | 4/2014 | Gyoda |
| 8,860,306 | B2 | 10/2014 | Oikawa et al. |
| 9,024,524 | B2 | 5/2015 | Moriwaki |
| 9,112,043 | B2 | 8/2015 | Arai |
| 9,130,181 | B2 | 9/2015 | Choi et al. |
| 9,166,192 | B2 | 10/2015 | Yamazaki et al. |
| 9,184,211 | B2 | 11/2015 | Hirakata |
| 9,196,662 | B2 | 11/2015 | Choi et al. |
| 9,331,310 | B2 | 5/2016 | Chida et al. |
| 9,876,059 | B2 * | 1/2018 | Yanagisawa ........ H01L 29/7869 |
| 9,923,174 | B2 | 3/2018 | Chida et al. |
| 9,929,220 | B2 | 3/2018 | Yamazaki et al. |
| 10,074,703 | B2 | 9/2018 | Hirakata |
| 10,079,330 | B2 | 9/2018 | Oikawa et al. |
| 10,205,062 | B2 | 2/2019 | Oikawa et al. |
| 10,361,258 | B2 | 7/2019 | Yamazaki et al. |
| 10,367,043 | B2 * | 7/2019 | Yanagisawa .......... H01L 51/524 |
| 10,510,992 | B2 | 12/2019 | Chida et al. |
| 2002/0113549 | A1 | 8/2002 | Yamazaki et al. |
| 2002/0125817 | A1 | 9/2002 | Yamazaki et al. |
| 2004/0229051 | A1 | 11/2004 | Schaepkens et al. |
| 2010/0052503 | A1 | 3/2010 | Fukagawa |
| 2013/0208075 | A1 | 8/2013 | Lu et al. |
| 2013/0308075 | A1 | 11/2013 | Watanabe |
| 2014/0065430 | A1 | 3/2014 | Yamazaki et al. |
| 2014/0159037 | A1 | 6/2014 | Kwon et al. |
| 2014/0183522 | A1 | 7/2014 | Cha et al. |
| 2014/0367661 | A1 * | 12/2014 | Akagawa ............ H01L 51/5253 257/40 |
| 2015/0048349 | A1 | 2/2015 | Kawata et al. |
| 2019/0189856 | A1 | 6/2019 | Oikawa et al. |

FOREIGN PATENT DOCUMENTS

| | | |
|---|---|---|
| CN | 103681756 A | 3/2014 |
| EP | 2 704 196 A1 | 3/2014 |
| EP | 2 750 197 A2 | 7/2014 |
| EP | 3 454 375 A1 | 3/2019 |
| JP | 63-058394 A | 3/1988 |
| JP | 11-174417 A | 7/1999 |
| JP | 2002-287119 A | 10/2002 |
| JP | 2003-174153 A | 6/2003 |
| JP | 2003-222914 A | 8/2003 |
| JP | 2003-229509 A | 8/2003 |
| JP | 2004-072050 A | 3/2004 |
| JP | 3124578 U | 8/2006 |
| JP | 2010-040522 A | 2/2010 |
| JP | 2010-050173 A | 3/2010 |
| JP | 2010-170110 A | 8/2010 |
| JP | 2010-182668 A | 8/2010 |
| JP | 2010-244694 A | 10/2010 |
| JP | 2011-014483 A | 1/2011 |
| JP | 2011-199192 A | 10/2011 |
| JP | 2012-209353 A | 10/2012 |
| JP | 2013-076743 A | 4/2013 |
| JP | 2013-251255 A | 12/2013 |
| JP | 2014-029853 A | 2/2014 |
| JP | 2014-049436 A | 3/2014 |
| JP | 2014-063723 A | 4/2014 |
| JP | 2014-131047 A | 7/2014 |
| KR | 2014-0029181 A | 3/2014 |
| TW | 200723949 | 6/2007 |
| TW | 201106772 | 2/2011 |
| WO | WO 2007/049589 A1 | 5/2007 |
| WO | WO 2010/005064 A1 | 1/2010 |
| WO | WO 2012/042787 A1 | 4/2012 |

OTHER PUBLICATIONS

Written Opinion re Application No. PCT/IB2015/055308, dated Dec. 8, 2015.

Chinese Office Action re Application No. CN 201580040196.X, dated Sep. 28, 2018.

"Young's Modulus," Wikipedia, https://zh.wikipedia.org/zh-tw/%E6%9D%A8%E6%B0%8F%E6%A8%A1%E9%87%8F; printed Jun. 10, 2019. (with the corresponding English language page on Wikipedia).

Taiwanese Office Action (Application No. 104123557) dated Jul. 14, 2020.

\* cited by examiner

100

FIG. 18A1
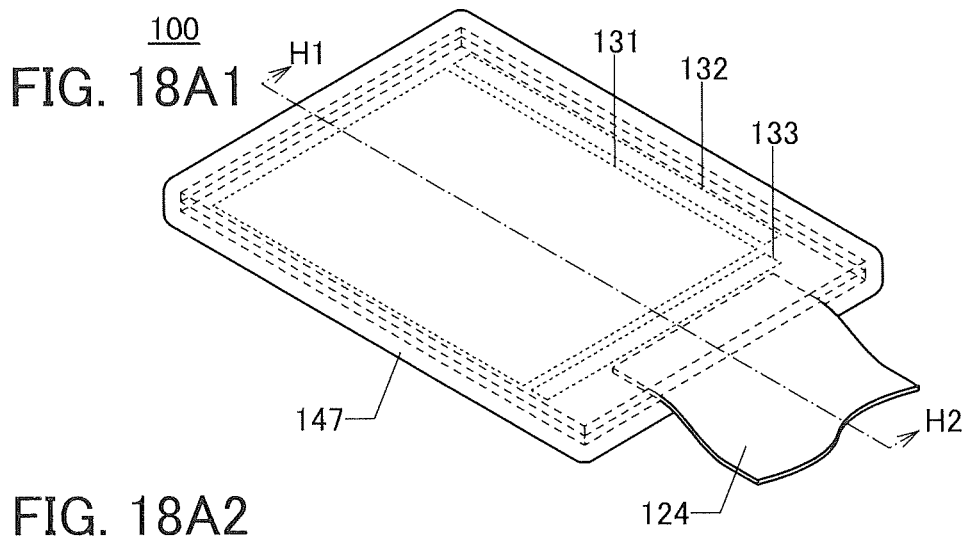
FIG. 18A2
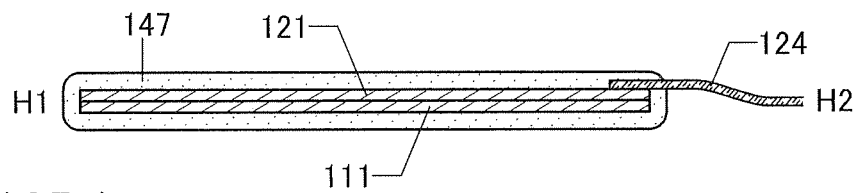
FIG. 18B1
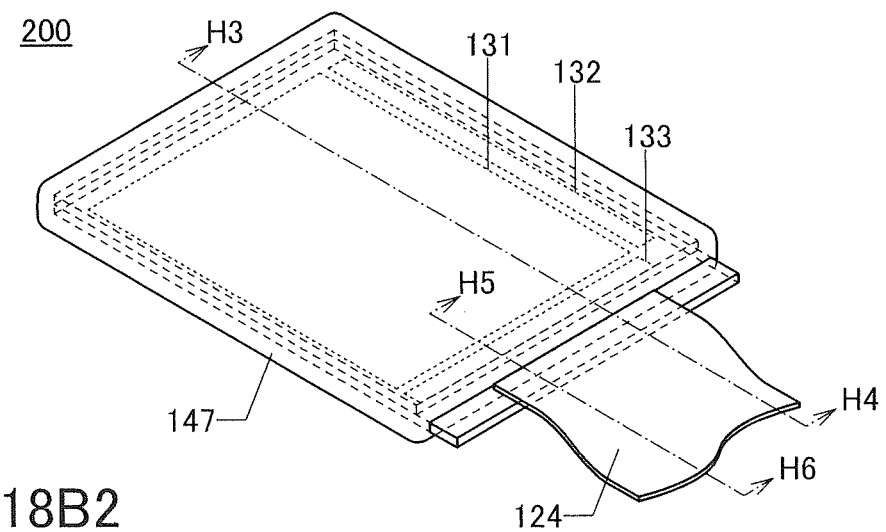
FIG. 18B2
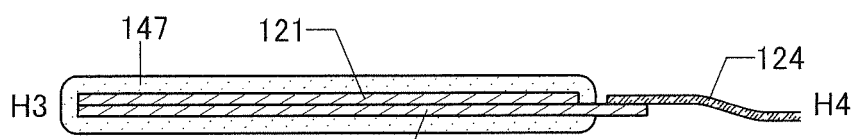
FIG. 18B3
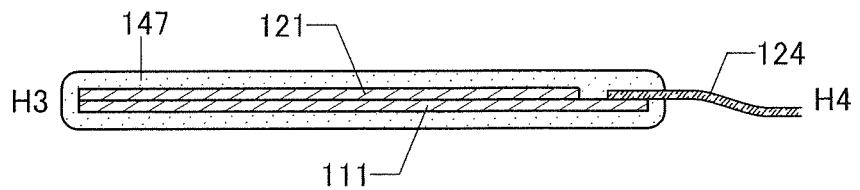

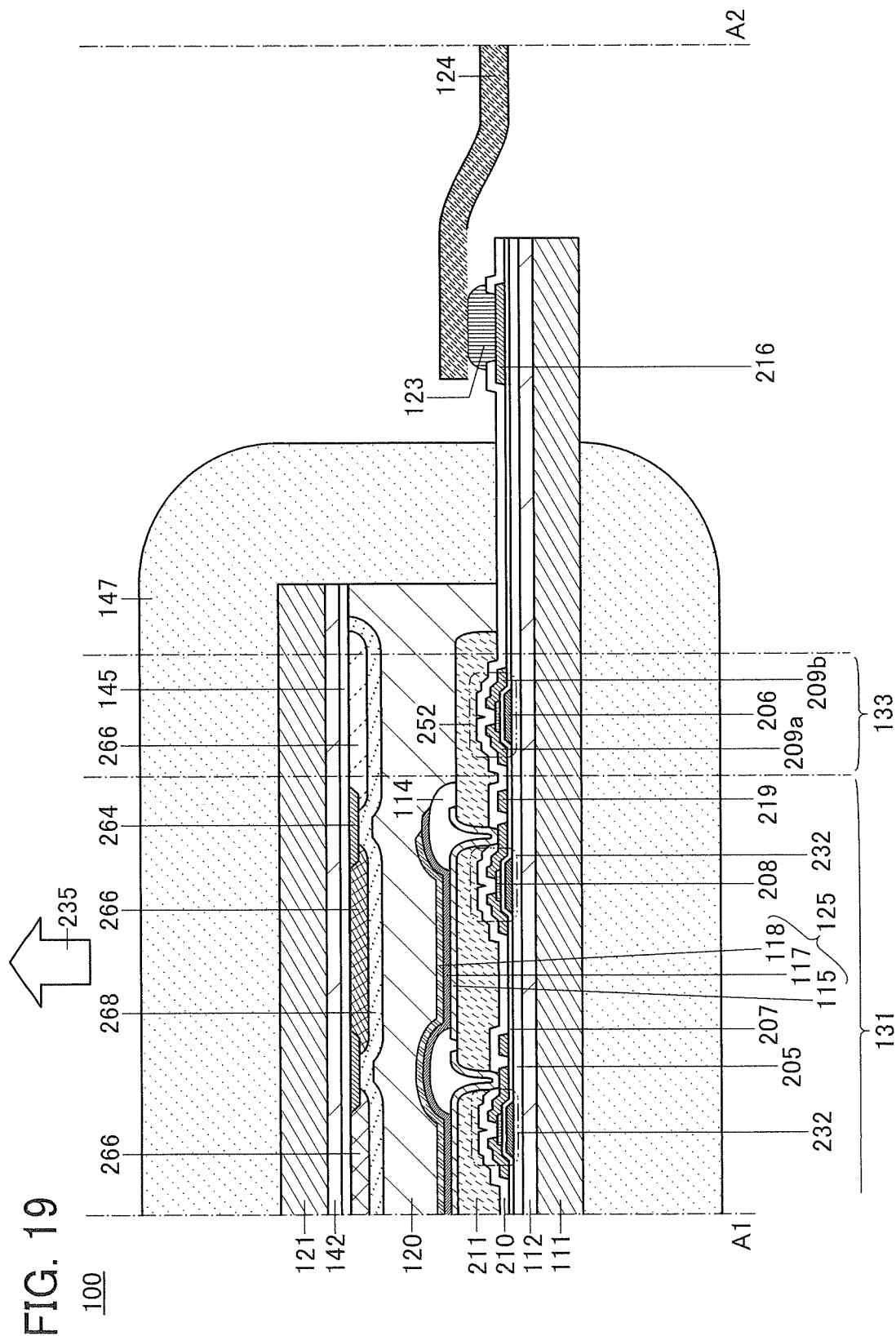

FIG. 22A1
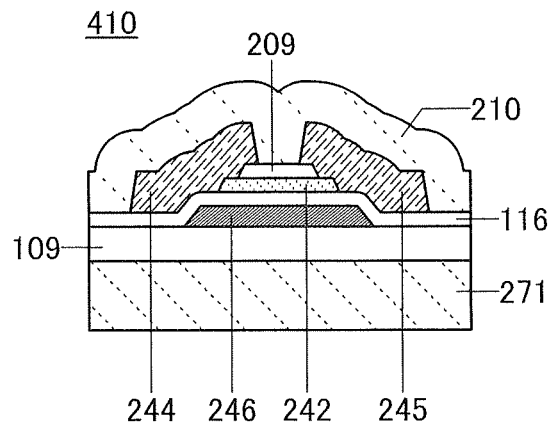
FIG. 22A2
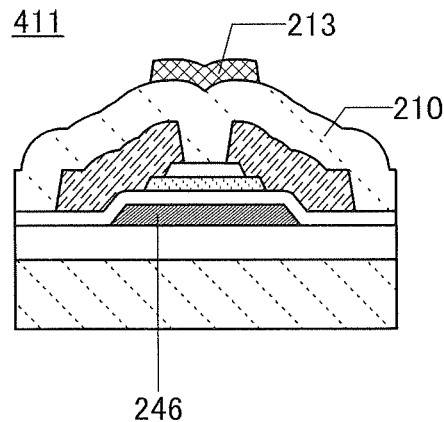
FIG. 22B1
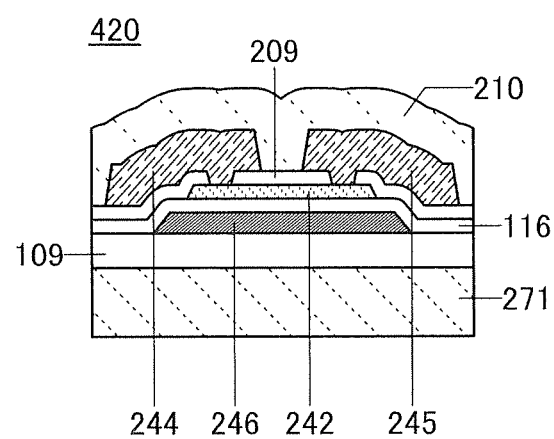
FIG. 22B2
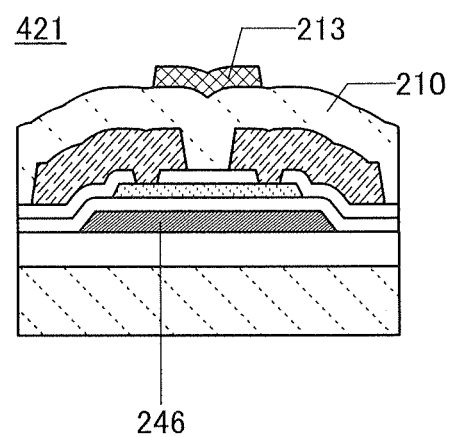
FIG. 22C1
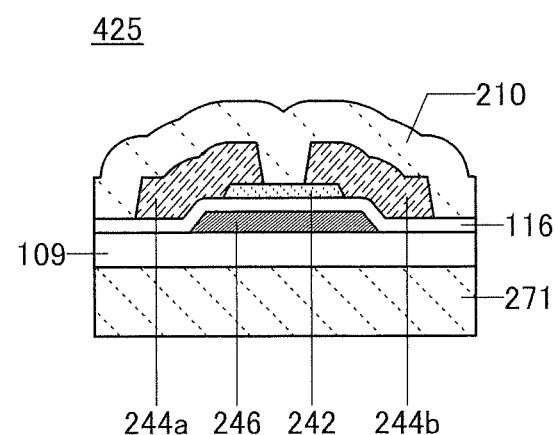
FIG. 22C2
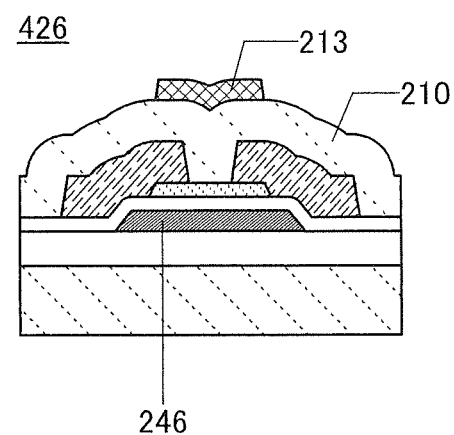

FIG. 23A1
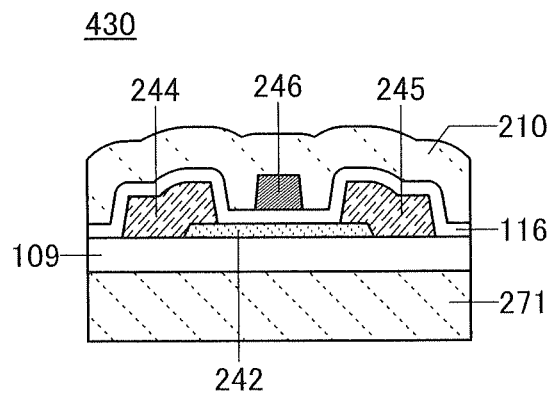
FIG. 23A2
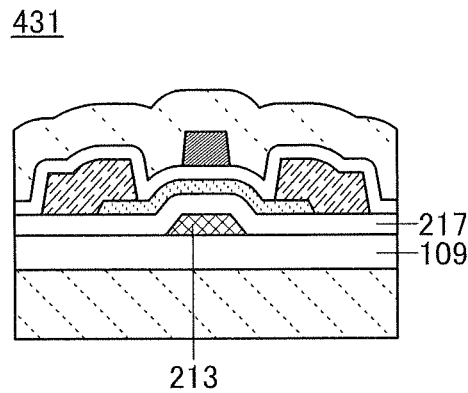
FIG. 23A3
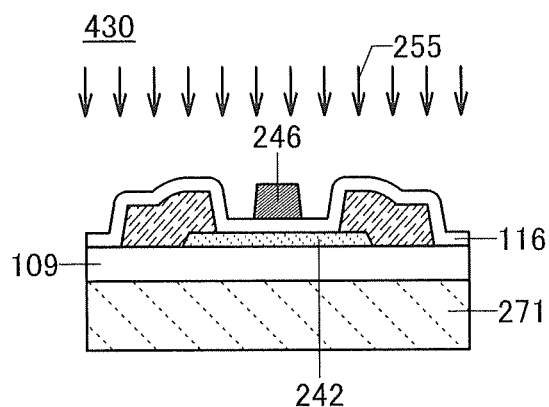
FIG. 23B1
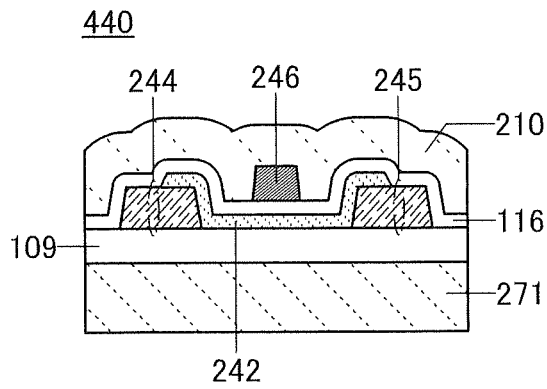
FIG. 23B2
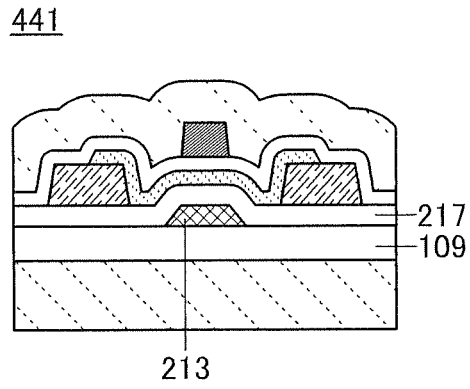

FIG. 24A1
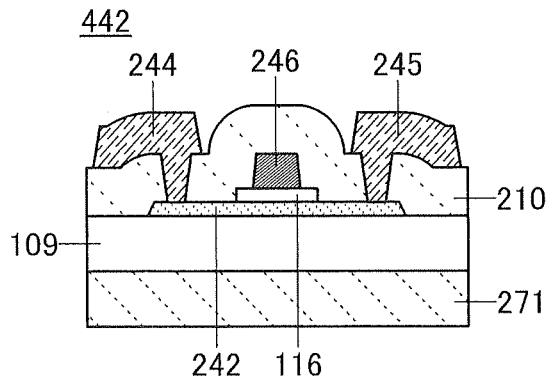
FIG. 24A2
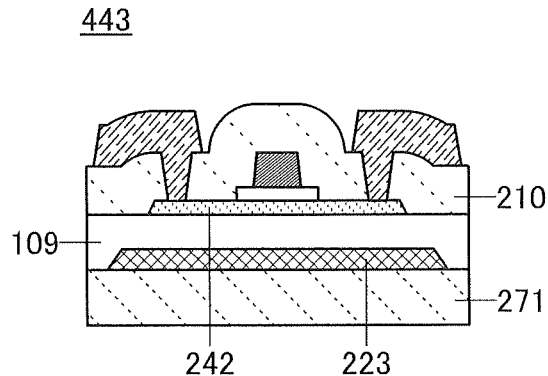
FIG. 24A3
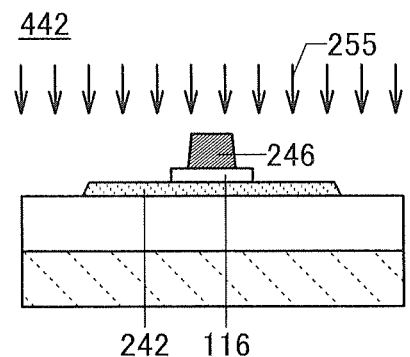
FIG. 24B1
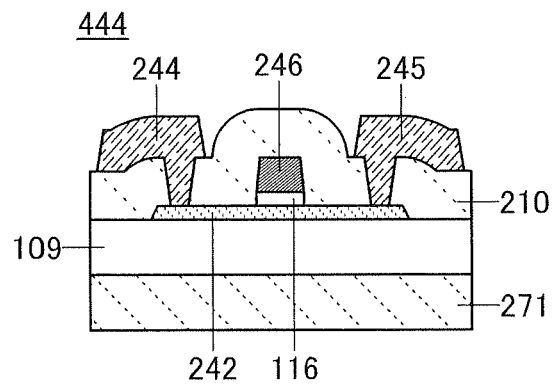
FIG. 24B2
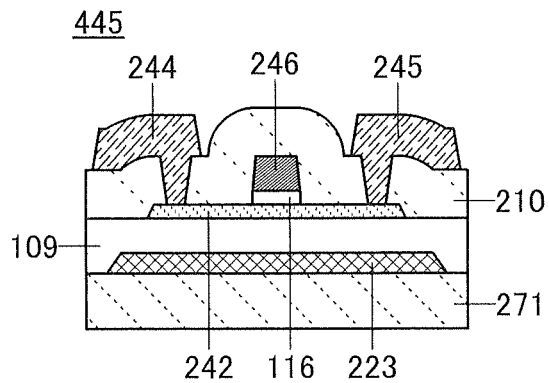
FIG. 24C1
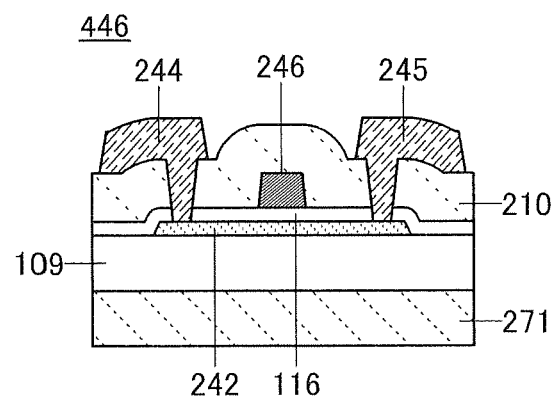
FIG. 24C2
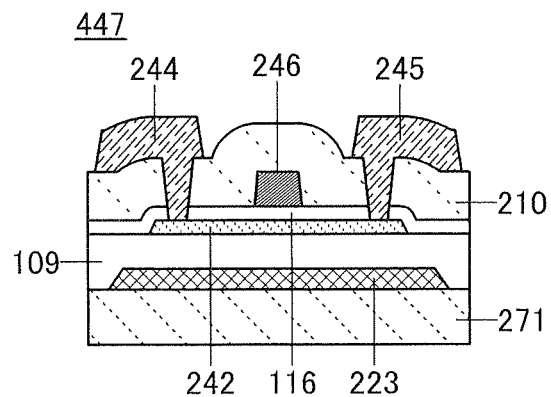

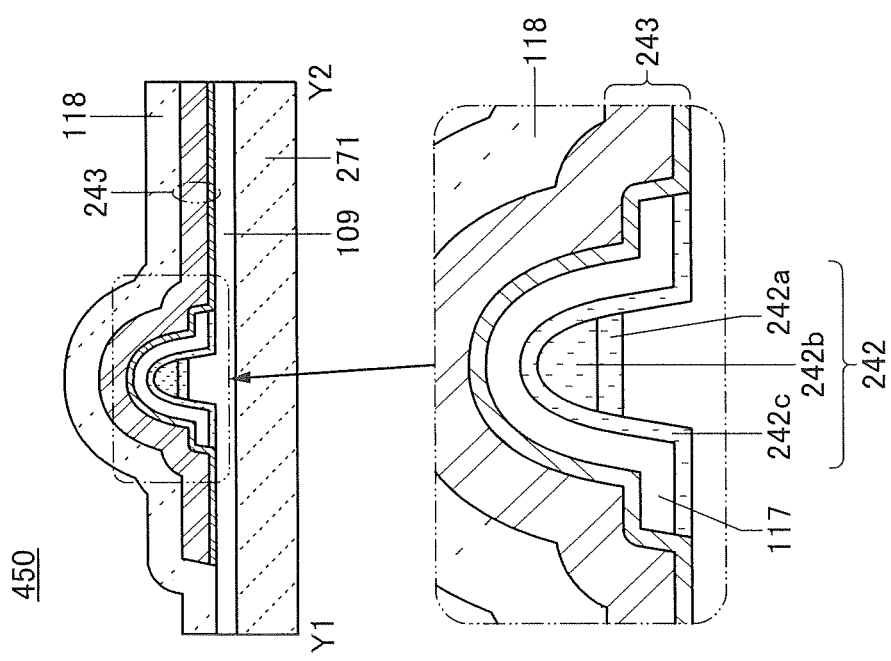
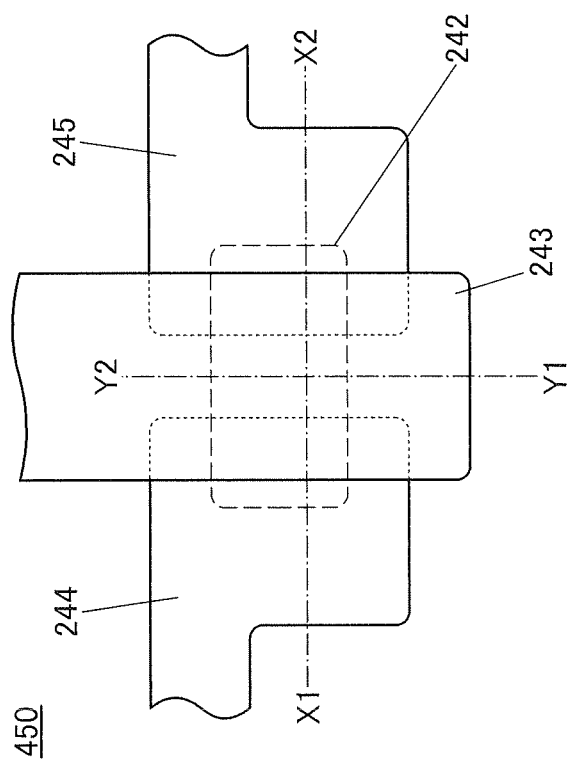
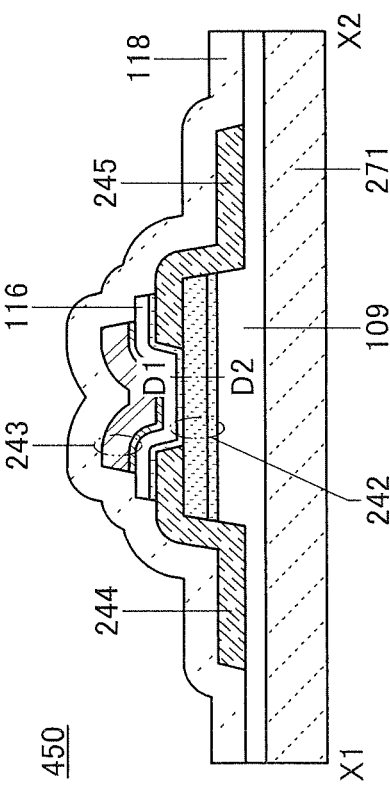

451

451

451

452

452

452

DISPLAY DEVICE AND ELECTRONIC DEVICE

This application is a continuation of copending U.S. application Ser. No. 15/865,482, filed on Jan. 9, 2018 which is a continuation of U.S. application Ser. No. 14/806,271, filed on Jul. 22, 2015 (now U.S. Pat. No. 9,876,059 issued Jan. 23, 2018) which are all incorporated herein by reference.

TECHNICAL FIELD

One embodiment of the present invention relates to a display device. One embodiment of the present invention also relates to a method for manufacturing the display device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. One embodiment of the present invention relates to a memory device, a processor, a driving method thereof, or a manufacturing method thereof.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an imaging device, an electronic device, and the like include a semiconductor device in some cases.

BACKGROUND ART

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the display elements can have flexibility; therefore, the use of a flexible substrate for the display device has been proposed.

As a method for manufacturing a display device using a flexible substrate, a technique is known in which a semiconductor element such as a thin film transistor is manufactured over a substrate such as a glass substrate or a quartz substrate, for example, the semiconductor element is fixed to another substrate (e.g., a flexible substrate) by using an organic resin, and then the semiconductor element is transferred from the glass substrate or the quartz substrate to the other substrate (Patent Document 1).

In addition, a technique for enhancing the mechanical strength of a display device by sandwiching an organic EL panel formed using a glass substrate with a thickness of greater than or equal to 20 µm and less than or equal to 50 µm between two flexible sheets is known (Patent Document 2).

Display devices are expected to be applied to a variety of uses and become diversified. For example, a smartphone and a tablet terminal with a touch panel are being developed as portable information terminals.

REFERENCE

Patent Document

[Patent Document 1] Japanese Published Patent Application No. 2003-174153
[Patent Document 2] Japanese Published Patent Application No. 2010-244694

DISCLOSURE OF INVENTION

To protect a surface of a light-emitting element and prevent entry of impurity, such as moisture, from the outside, an additional substrate is attached to a light-emitting element formed over a substrate in some cases. However, there is a problem in that impurity such as moisture that enters from the outer periphery of the attached substrates (an edge of the substrates) contributes to a decrease in display quality and a decrease in reliability. To avoid this problem, the conventional display device needs a long distance from an edge of a substrate to a display region. As a result, a region that is outer than the display region and that does not contribute to display (hereinafter also referred to as frame) is wide, which inhibits an improvement in the productivity or the design flexibility of a display device and a semiconductor device including the display device.

Moreover, in the case where an organic EL panel is sandwiched between two flexible sheets as disclosed in Patent Document 2, impurity that enters an edge of the flexible sheets may cause a deterioration in display image or a decrease in reliability. In addition, in Patent Document 2, the flexible sheets are larger than the organic EL panel, which inevitably widens the frame including the flexible sheets.

An object of one embodiment of the present invention is to provide a highly reliable display device and a method for manufacturing the display device. Another object of one embodiment of the present invention is to provide a display device with high design flexibility and a method for manufacturing the display device.

Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like that is unlikely to be broken.

Another object of one embodiment of the present invention is to provide a display device, electronic device, or the like with low power consumption. Another object of one embodiment of the present invention is to provide a display device, electronic device, or the like with high productivity. Another object of one embodiment of the present invention is to provide a novel display device, electronic device, or the like.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a display device including a first substrate, a second substrate, and a first layer. The first substrate and the second substrate overlap each other with a display element positioned therebetween. The first layer covers the first substrate in a region where the first substrate and the second substrate overlap each other, the second substrate in the region where the first substrate and the second substrate overlap each other, a side surface of the first substrate, and a side surface of the second substrate.

For the first layer, a silicone resin (silicone rubber) or a fluorine resin (fluorine rubber) may be used, for example. The first layer can be formed by providing a liquid high molecular material on the periphery of the first substrate and the second substrate which overlap each other and curing the liquid high molecular material. Since the first layer is seamless, by covering the outer periphery (an edge of substrates) of the overlapped first and second substrates with the first layer, impurity such as moisture can be prevented from entering a display region.

Another embodiment of the present invention is a display device including a first substrate, a second substrate, and a first layer. The first substrate and the second substrate overlap each other with a display element positioned therebetween. The first layer covers the first substrate in a region where the first substrate and the second substrate overlap each other, the second substrate in a region where the first substrate and the second substrate overlap each other, and at least one of a side surface of the first substrate and a side surface of the second substrate.

One embodiment of the present invention can provide a highly reliable display device and a manufacturing method thereof. Another embodiment of the present invention can provide a display device with high design flexibility and a manufacturing method thereof.

One embodiment of the present invention provides a display device, electronic device, or the like having high visibility. One embodiment of the present invention provides a display device, electronic device, or the like having high display quality. One embodiment of the present invention provides a display device, electronic device, or the like having high reliability. One embodiment of the present invention provides a display device, electronic device, or the like that is unlikely to be broken. One embodiment of the present invention provides a display device, electronic device, or the like with low power consumption. One embodiment of the present invention provides a display device, electronic device, or the like with high productivity. One embodiment of the present invention provides a novel display device, electronic device, or the like.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF DRAWINGS

FIGS. 18A1 and 18A2 and FIGS. 18B1 to 18B3 illustrate embodiments of a display device.
FIG. 19 is a cross-sectional view illustrating one embodiment of a display device.
FIGS. 22A1, 22A2, 22B1, 22B2, 22C1, and 22C2 each illustrate one embodiment of a transistor.
FIGS. 23A1 to 23A3, 23B1, and 23B2 each illustrate one embodiment of a transistor.
FIGS. 24A1 to 24A3, 24B1, 24B2, 24C1, and 24C2 each illustrate one embodiment of a transistor.
FIGS. 25A to 25C illustrate one embodiment of a transistor.

BEST MODE FOR CARRYING OUT THE INVENTION

Figure 1:
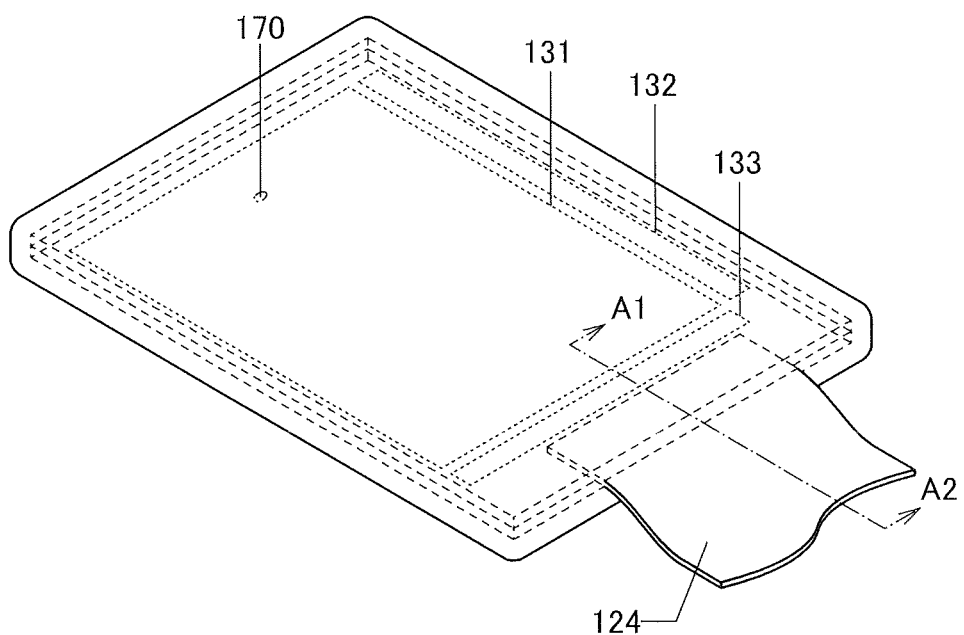
FIG. 1 illustrates one embodiment of a display device.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), a perspective view, or the like, some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor and a gate electrode overlap with each other, a portion where a current flows in a semiconductor when the transistor is on, or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

Note that in this specification and the like, an "on state" of a transistor refers to a state in which a source and a drain of the transistor are electrically short-circuited (also referred to as being "brought into conduction"). Furthermore, an "off state" of the transistor refers to a state in which the source and the drain of the transistor are electrically disconnected (also referred to as being "brought out of conduction".)

In this specification and the like, in some cases, "on-state current" means a current which flows between a source and a drain when a transistor is on, and "off-state current" means a current which flows between a source and a drain when a transistor is off.

The off-state current of a transistor depends on a voltage between a gate and a source (also referred to as Vgs) in some cases. Thus, "the off-state current of a transistor is lower than or equal to I" means "there is Vgs with which the off-state current of the transistor becomes lower than or equal to I" in some cases. The off-state current of a transistor may refer to a current at a certain Vgs or a current at Vgs in a certain voltage range.

As an example, the assumption is made of an n-channel transistor where the threshold voltage Vth is 0.5 V and the current flowing between a source and a drain (hereinafter also referred to as Ids) is $1\times10^{-9}$ A at Vgs of 0.5 V, $1\times10^{-13}$ A at Vgs of 0.1 V, $1\times10^{-19}$ A at Vgs of $-0.5$ V, and $1\times10^{-22}$ A at Vgs of $-0.8$ V. The Ids of the transistor is $1\times10^{-19}$ A or lower at Vgs of $-0.5$ V or at Vgs in the range of $-0.8$ V to $-0.5$ V; therefore, it can be said that the off-state current of the transistor is $1\times10^{-19}$ A or lower. Since there is Vgs at which the drain current of the transistor is $1\times10^{-22}$ A or lower, it can be said that the off-state current of the transistor is $1\times10^{-22}$ A or lower.

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage between its drain and source (hereinafter also referred to as Vds) in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

The channel width refers to, for example, the length of a portion where a source and a drain face each other in a region where a semiconductor and a gate electrode overlap with each other, a portion where a current flows in a semiconductor when a transistor is on, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are calculated, a surrounded channel width might be used for the calculation. In that case, a value might be different from one calculated by using an effective channel width.

Embodiment 1

A structure example of a display device 100 of one embodiment of the present invention is described with reference to FIG. 1, FIGS. 2A to 2C, FIG. 3, FIGS. 4A to 4C, FIGS. 5A and 5B, FIGS. 6A and 6B, and FIGS. 7A and 7B. Note that the display device 100 disclosed in this specification is a display device in which a light-emitting element is used as a display element. As the display device 100 of one embodiment of the present invention, a display device having a top-emission structure is described as an example. Note that the display device 100 of one embodiment of the present invention can be a display device having a bottom-emission structure or a dual-emission structure.

<Structure of Display Device>

Figure 2A:
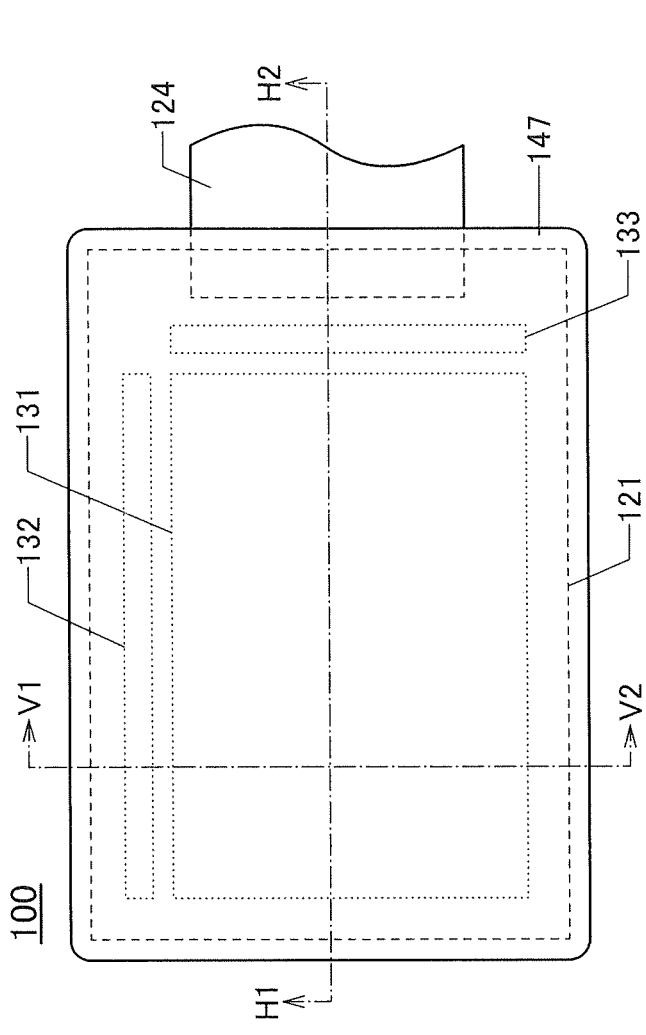
FIGS. 2A to 2C are a plan view and cross-sectional views illustrating one embodiment of a display device.
Figure 2B:
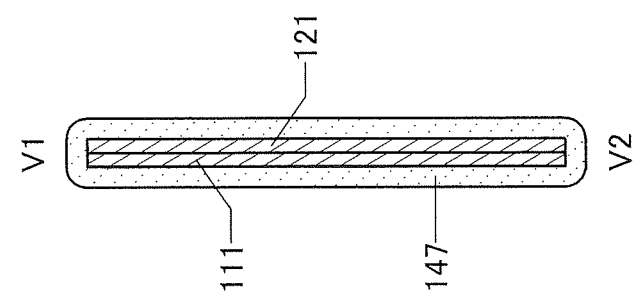
Figure 2C:
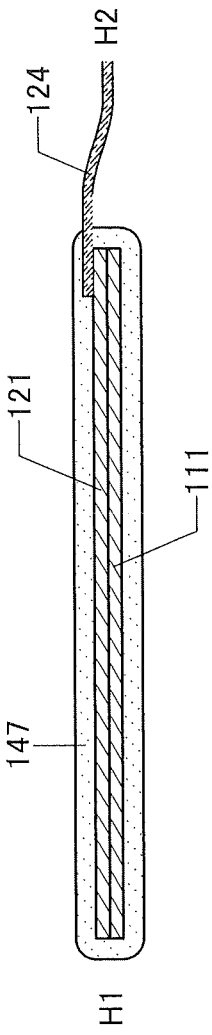
Figure 3:
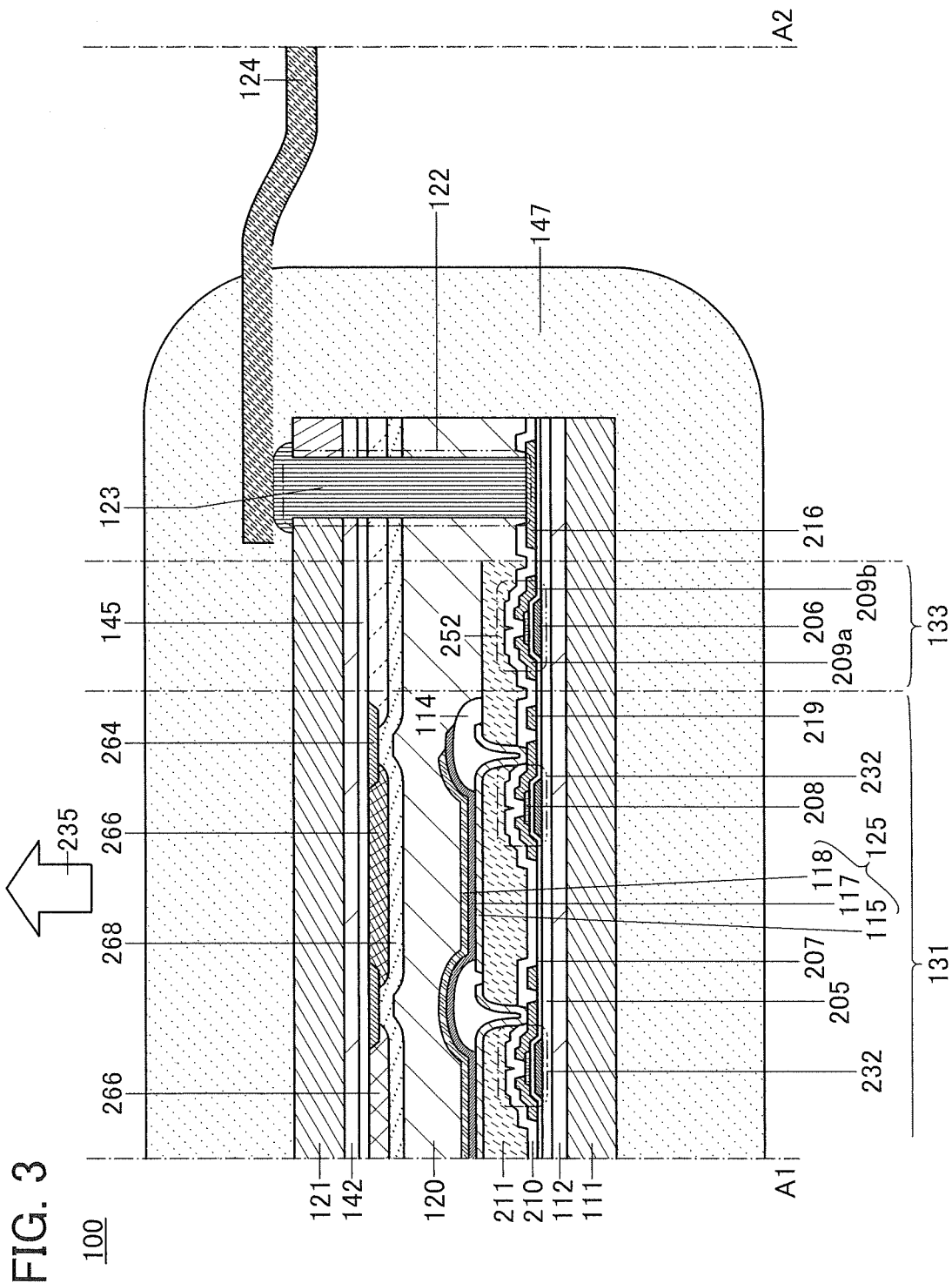
FIG. 3 is a cross-sectional view illustrating one embodiment of a display device.

FIG. 1 is a perspective view of the display device 100 to which an external electrode 124 is connected and which is covered with the layer 147. FIG. 2A is a plan view of the light-emitting device 100. FIG. 2B is a cross-sectional view taken along the dashed-dotted line V1-V2 in FIG. 2A. FIG. 2C is a cross-sectional view taken along the dashed-dotted line H1-H2 in FIG. 2A. FIG. 3 is a detailed cross-sectional view taken along the dashed-dotted line A1-A2 in FIG. 1. Note that FIG. 3 more specifically illustrates part of the cross section in FIG. 2C.

The display device 100 described in this embodiment includes a display region 131, a circuit 132, and a circuit 133. The display device 100 also includes a terminal electrode 216 and a light-emitting element 125 including an electrode 115, an EL layer 117, and an electrode 118. A plurality of light-emitting elements 125 are formed in the display region 131. A transistor 232 for controlling the amount of light emitted from the light-emitting element 125 is connected to each of the light-emitting elements 125.

The external electrode 124 and the terminal electrode 216 are electrically connected to each other through an anisotropic conductive connection layer 123. A part of the terminal electrode 216 is electrically connected to the circuit 132, and another part of the terminal electrode 216 is electrically connected to the circuit 133.

The circuit 132 and the circuit 133 each include a plurality of transistors 252. The circuit 132 and the circuit 133 each have a function of determining which of the light-emitting elements 125 in the display region 131 is supplied with a signal through the external electrode 124.

The transistor 232 and the transistor 252 each include a gate electrode 206, a gate insulating layer 207, a semiconductor layer 208, a source electrode 209a, and a drain electrode 209b. A wiring 219 is formed in the same layer where the source electrode 209a and the drain electrode 209b are formed. In addition, an insulating layer 210 is formed over the transistor 232 and the transistor 252, and an insulating layer 211 is formed over the insulating layer 210. The electrode 115 is formed over the insulating layer 211. The electrode 115 is electrically connected to the drain electrode 209b through an opening formed in the insulating layer 210 and the insulating layer 211. A partition 114 is formed over the electrode 115, and the EL layer 117 and the electrode 118 are formed over the electrode 115 and the partition 114.

In the display device 100, a substrate 111 and a substrate 121 are attached to each other with a bonding layer 120 provided therebetween.

One surface of the substrate 111 is provided with an insulating layer 205 with a bonding layer 112 positioned therebetween. One surface of the substrate 121 is provided with an insulating layer 145 with a bonding layer 142 positioned therebetween. The one surface of the substrate 121 is provided with a light-blocking layer 264 with the insulating layer 145 positioned therebetween. The one surface of the substrate 121 is also provided with a coloring layer 266 and an overcoat layer 268 with the insulating layer 145 positioned therebetween.

The insulating layer 205 functions as a base layer and can prevent or reduce diffusion of moisture or impurity elements from the substrate 111, the bonding layer 112, or the like to the transistor or the light-emitting element. The insulating layer 145 functions as a base layer and can prevent or reduce diffusion of moisture or impurity elements from the substrate 121, the bonding layer 142, or the like to the transistor or the light-emitting element.

The insulating layer 205 and the insulating layer 145 are preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 and the insulating layer 145 can be formed by a sputtering method, a CVD method, a thermal oxidation method, a coating method, a printing method, or the like.

For example, a flexible material such as an organic resin material can be used for the substrate 111 and the substrate 121. In the case where the display device 100 has a bottom-emission structure or a dual-emission structure, a material having a light-transmitting property with respect to light emitted from the EL layer 117 is used for the substrate 111. In the case where the display device 100 has a top-emission structure or a dual-emission structure, a material having a light-transmitting property with respect to light emitted from the EL layer 117 is used for the substrate 121.

If the mechanical strength of a material used for the substrate 111 and the substrate 121 is too low, the substrates easily become deformed at the time of manufacture of the display device 100, which reduces yield and thus, contributes to a reduction in productivity. Yet, if the mechanical strength of the material used for the substrate 111 and the substrate 121 is too high, the display device becomes difficult to bend. An index of the mechanical strength of a material is a Young's modulus. The Young's modulus of a material suitable for the substrate 111 and the substrate 121 is larger than or equal to 1 GPa ($1 \times 10^9$ Pa) and smaller than or equal to 100 GPa ($100 \times 10^9$ Pa), preferably larger than or equal to 2 GPa and smaller than or equal to 50 GPa, further preferably larger than or equal to 2 GPa and smaller than or equal to 20 GPa. Note that in measurement of a Young's modulus, ISO527, JISK7161, JISK7162, JISK7127, ASTMD638, ASTMD882, or the like can be referred to.

The thickness of each of the substrate 111 and the substrate 121 is preferably greater than or equal to 5 μm and less than or equal to 100 μm, further preferably greater than or equal to 10 μm and less than or equal to 50 μm. One or both of the substrate 111 and the substrate 121 may be a stacked-layer substrate that includes a plurality of layers.

It is preferable that the substrate 111 and the substrate 121 be formed using the same material and have the same thickness. However, depending on the purpose, the substrates 111 and 121 may be formed using different materials or have different thicknesses.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and polytetrafluoroethylene (PTFE). Furthermore, when a light-transmitting property is not necessary, a non-light-transmitting substrate may be used. For example, aluminum or the like may be used for the substrate 121 or the substrate 111.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film.

Note that a structure in which a fibrous body is impregnated with an organic resin (also called prepreg) may be used as the substrate 111 and the substrate 121.

With such substrates, a non-breakable display device can be provided. Alternatively, a lightweight display device can be provided. Alternatively, an easily bendable display device can be provided.

For the layer 147, a material that is more flexible than the substrates 111 and 121 is used. For example, a material having a smaller Young's modulus than the substrate 111 is used for the layer 147.

The Young's modulus of the material used for the layer 147 is preferably smaller than or equal to one fiftieth, further preferably smaller than or equal to one hundredth, still further preferably smaller than or equal to one five hundredth of the Young's modulus of the materials used for the substrates 111 and 121.

Examples of a material that can be used for the layer 147 include a viscoelastic high molecular material such as silicone rubber or fluorine rubber. The material used for the layer 147 preferably has a light-transmitting property.

A material with a small Young's modulus more easily becomes deformed than a material with a large Young's modulus does; therefore, internal stress generated by deformation is easily dispersed in the former. When a material with a Young's modulus smaller than that of the substrate 111 and the substrate 121 is used for the layer 147, local stress generated in the substrate 111 and the substrate 121 at the time of bending can be relaxed, whereby the substrate 111 and the substrate 121 can be prevented from being broken. The layer 147 also functions as a buffer dispersing external physical pressure and impact.

The layer 147 can prevent the minimum radius of curvature of a bent portion from being smaller than the thickness of the layer 147. Therefore, breakage of the substrate 111 or the substrate 121 due to bending at an excessively small radius of curvature can be prevented.

In one embodiment of the present invention, the display device 100 can be prevented from being broken even when the minimum curvature radius of the substrate 111 or 121 that is positioned on the inner side of a bent portion is 1 mm or less.

The thickness of the layer 147 is preferably greater than or equal to 2 times and less than or equal to 100 times that of the substrate 111 and the substrate 121, further preferably greater than or equal to 5 times and less than or equal to 50 times that of the substrate 121. When the layer 147 is thicker than the substrate 111 and the substrate 121, stress relaxation and the effect of buffers can be enhanced.

Depending on the usage of the display device, the layer 147 may have a stacked structure formed of a plurality of layers.

In one embodiment of the present invention, a display device that is resistant to external impact and unlikely to be broken can be provided.

In one embodiment of the present invention, a highly reliable display device can be provided which is unlikely to be broken even when it is repeatedly bent and stretched.

The layer 147 that covers the edges (a side surfaces) of the substrate 111 and the substrate 121 can prevent entry of impurity such as moisture from the edges. Therefore, the display device 100 can have high reliability and high display quality even when the frame of the display device 100 is narrowed. In one embodiment of the present invention, the productivity and design flexibility of the display device 100 can be improved. Furthermore, the productivity and design flexibility of a semiconductor device including the display device of one embodiment of the present invention can be improved.

<Example of Pixel Circuit Configuration>

Figure 4A:
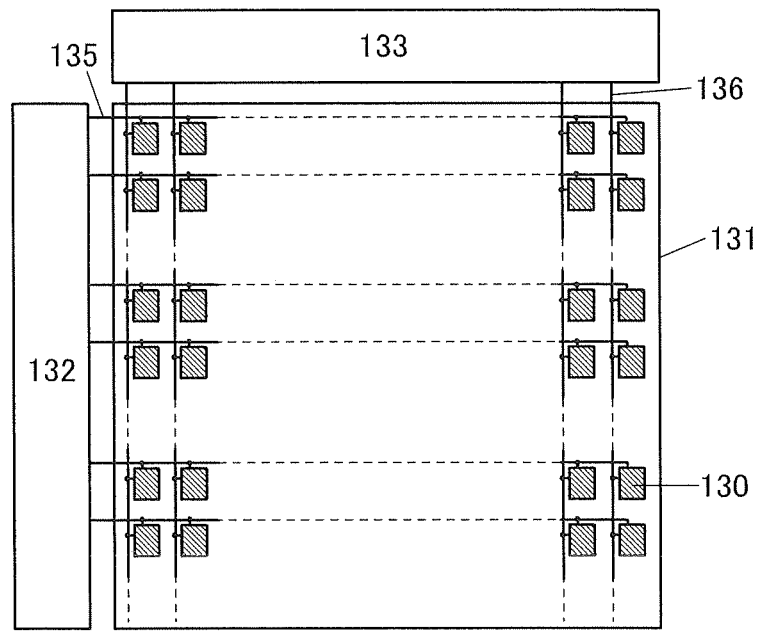
FIGS. 4A to 4C are a block diagram and circuit diagrams illustrating embodiments of a display device.

Next, an example of a specific configuration of the display device 100 is described with reference to FIGS. 4A to 4C. FIG. 4A is a block diagram illustrating the configuration of the display device 100. The display device 100 includes the display region 131, the circuit 132, and the circuit 133. The circuit 132 functions as a scan line driver circuit, for example, and the circuit 133 functions as a signal line driver circuit, for example.

The display device 100 includes m scan lines 135 which are arranged parallel or substantially parallel to each other and whose potentials are controlled by the circuit 132, and n signal lines 136 which are arranged parallel or substantially parallel to each other and whose potentials are controlled by the circuit 133. The display region 131 includes a plurality of pixels 130 arranged in a matrix.

Each of the scan lines 135 is electrically connected to the n pixels 130 in the corresponding row among the pixels 130 arranged in m rows and n columns in the display region 131. Each of the signal lines 136 is electrically connected to the m pixels 130 in the corresponding column among the pixels 130 arranged in m rows and n columns. Note that m and n are each an integer of 1 or more.

Figure 5A:
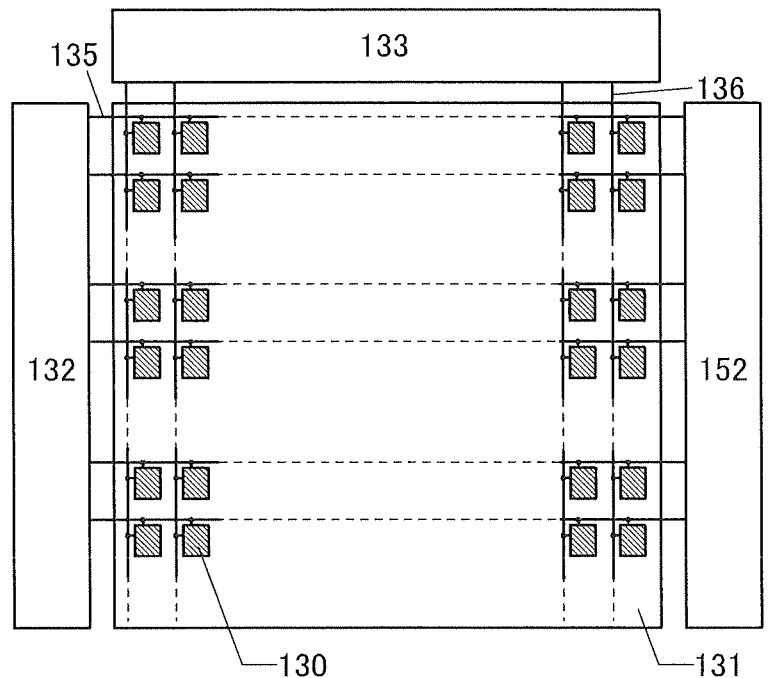
FIGS. 5A and 5B are block diagrams illustrating embodiments of a display device.
Figure 5B:
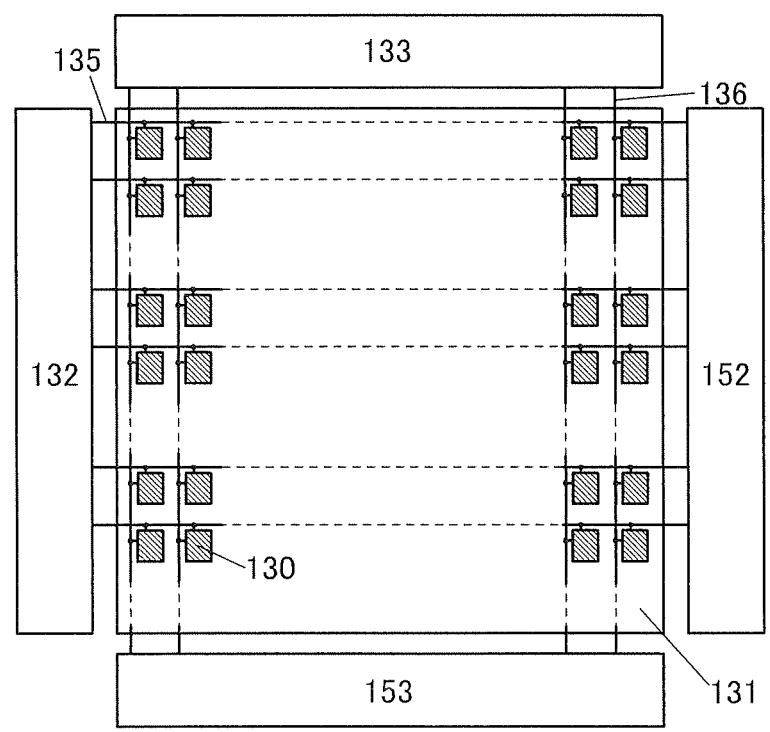

As illustrated in FIG. 5A, a circuit 152 may be provided on the opposite side of the display region 131 from the circuit 132. Furthermore, as illustrated in FIG. 5B, a circuit 153 may be provided on the opposite side of the display region 131 from the circuit 133. FIGS. 5A and 5B each illustrate an example in which each scan line 135 is connected to the circuit 152 and the circuit 132. However, the connection relation is not limited to this. For example, each scan line 135 may be connected to one of the circuit 132 and the circuit 152. FIG. 5B illustrates an example in which each signal line 136 is connected to the circuit 153 and the circuit 133. However, the connection relation is not limited to this. For example, each signal line 136 may be connected to one of the circuit 133 and the circuit 153. The circuits 132, 133, 152, and 153 may have a function other than the function of driving the pixel 130.

In some cases, the circuits 132, 133, 152, and 153 may be collectively called a driver circuit portion. The pixel 130 includes a pixel circuit 137 and a display element. The pixel circuit 137 is a circuit that drives the display element. A transistor included in the driver circuit portion and a transistor included in the pixel circuit 137 can be formed at the same time. Part or the entire driver circuit portion may be formed over another substrate and electrically connected to the display device 100. For example, part or the entire driver circuit portion may be formed over a single crystal substrate and electrically connected to the display device 100.

Figure 4B:
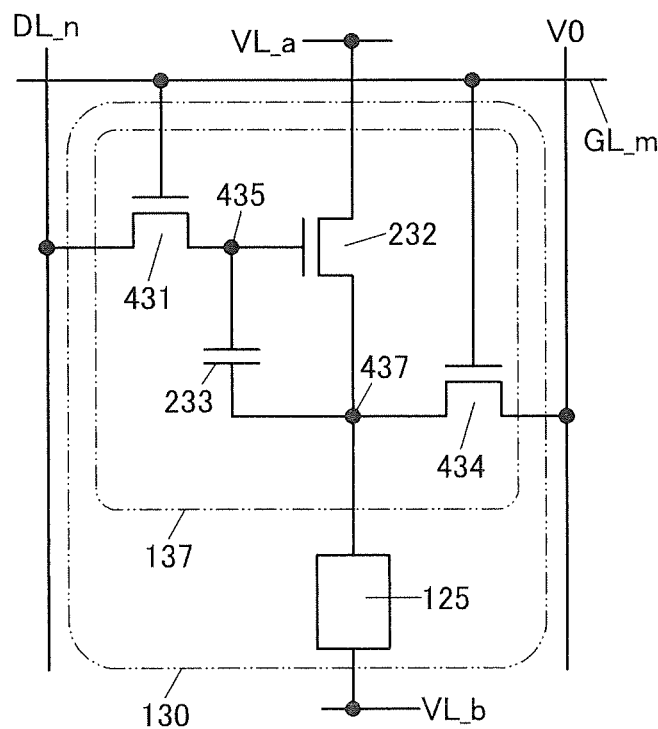
Figure 4C:
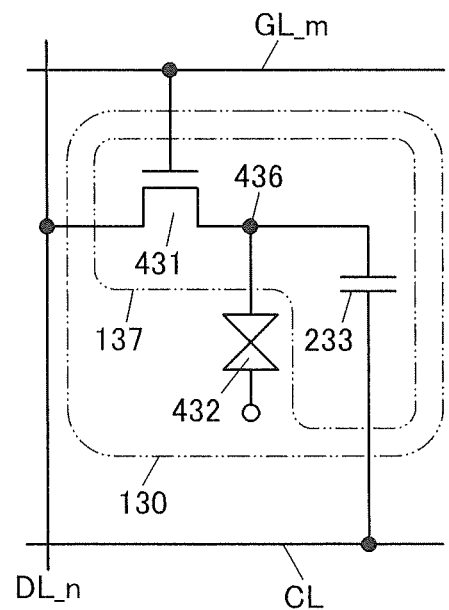

FIGS. 4B and 4C illustrate circuit configurations that can be used for the pixels 130 in the display device illustrated in FIG. 4A.

[Example of Pixel Circuit for Light-Emitting Display Device]

The pixel circuit 137 illustrated in FIG. 4B includes a transistor 431, a capacitor 233, the transistor 232, and a transistor 434. The pixel circuit 137 is electrically connected to the light-emitting element 125 that can function as a display element.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) or the like can be used, for example. Note that the light-emitting element 125 is not limited to organic EL elements; an inorganic EL element including an inorganic material can be used, for example.

As a power supply potential, a potential on the relatively high potential side or a potential on the relatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

For example, a high power supply potential VDD is supplied to one of the potential supply line VL_a and the potential supply line VL_b, and a low power supply potential VSS is supplied to the other.

In the display device including the pixel circuit 137 in FIG. 4B, the pixel circuits 137 are sequentially selected row by row by the circuit 132, whereby the transistors 431 and 434 are turned on and a data signal is written to the nodes 435.

When the transistors 431 and 434 are turned off, the pixel circuits 137 in which the data has been written to the nodes 435 are brought into a holding state. Further, the amount of current flowing between the source electrode and the drain electrode of the transistor 232 is controlled in accordance with the potential of the data written to the node 435. The light-emitting element 125 emits light with a luminance corresponding to the amount of flowing current. This operation is sequentially performed row by row; thus, an image is displayed.

[Example of Pixel Circuit for Liquid Crystal Display Device]

The pixel circuit 137 illustrated in FIG. 4C includes the transistor 431 and the capacitor 233. The pixel circuit 137 is electrically connected to a liquid crystal element 432 that can function as a display element.

The potential of one of a pair of electrodes of the liquid crystal element 432 is set according to the specifications of the pixel circuits 137 as appropriate. The alignment state of the liquid crystal element 432 depends on data written to a node 436. A common potential may be applied to one of the pair of electrodes of the liquid crystal element 432 included in each of the plurality of pixel circuits 137. Further, the potential supplied to one of a pair of electrodes of the liquid crystal element 432 in the pixel circuit 137 in one row may be different from the potential supplied to one of a pair of electrodes of the liquid crystal element 432 in the pixel 137 in another row.

As examples of a driving method of the display device including the liquid crystal element 432, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element 432 may be formed using a liquid crystal composition including liquid crystal exhibiting a blue phase and a chiral material. The liquid crystal exhibiting a blue phase has a short response time of 1 msec or less. Since the liquid crystal exhibiting a blue phase is optically isotropic, alignment treatment is not necessary and viewing angle dependence is small.

In the pixel circuit 137 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel circuit 137 as appropriate. The capacitor 233 functions as a storage capacitor for storing data written to the node 436.

For example, in the display device including the pixel circuit 137 in FIG. 4C, the pixel circuits 137 are sequentially selected row by row by the circuit 132, whereby the transistors 431 are turned on and a data signal is written to the nodes 436.

When the transistors 431 are turned off, the pixel circuits 137 in which the data signal has been written to the nodes 436 are brought into a holding state. This operation is sequentially performed row by row; thus, an image is displayed on a display region 231.

[Display Element]

The display device of one embodiment of the present invention can employ various modes and can include various display elements. Examples of the display element include a display medium whose contrast, luminance, reflectance, transmittance, or the like is changed by electrical or magnetic effect, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube.

Alternatively, quantum dots may be used as the display element. Examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by metal organic chemical vapor deposition (MOCVD). Note that when the graphene is provided, the GaN semiconductor layers included in the LED can also be formed by a sputtering method.

<Example of Pixel Configuration for Achieving Color Display>

Figure 6A:
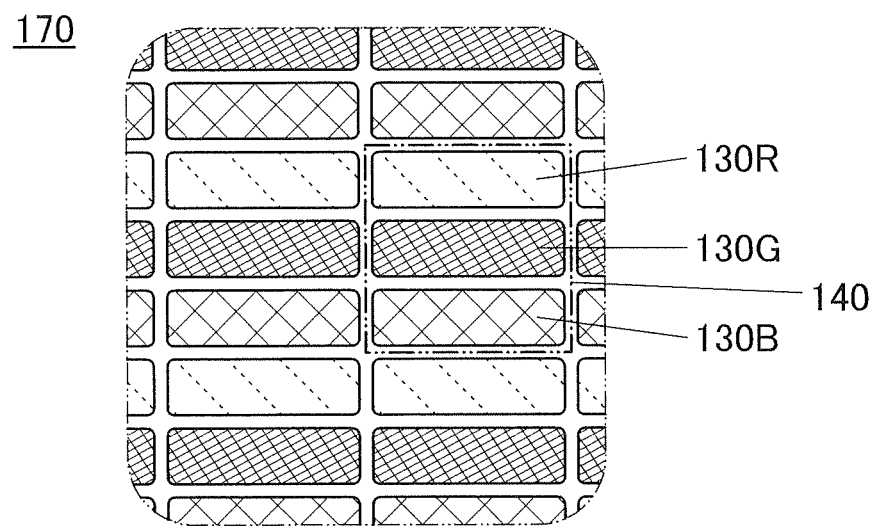
FIGS. 6A and 6B each illustrate an example of a pixel configuration of one embodiment of a display device.
Figure 6B:
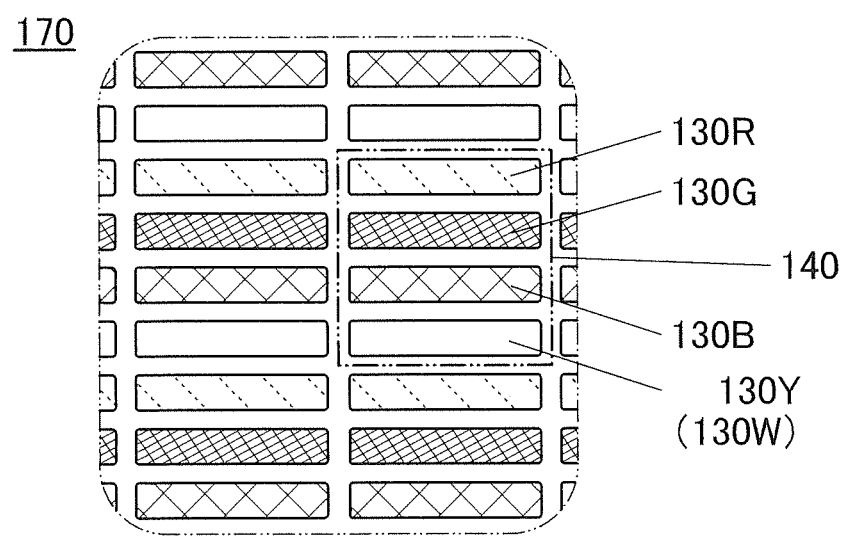

Here, examples of a pixel configuration for achieving color display are described with reference to FIGS. 6A and 6B. FIGS. 6A and 6B and FIGS. 7A and 7B are enlarged plan views of a region 170 in the display region 131 of FIG. 1. As illustrated in FIG. 6A, for example, each pixel 130 may function as a subpixel and three pixels 130 may be collectively used as one pixel 140. The use of a red, a green, and a blue coloring layers as the coloring layers 266 for the three pixels 130 enables full-color display. In FIG. 6A, the pixel 130 emitting red light, the pixel 130 emitting green light, and the pixel 130 emitting blue light are illustrated as a pixel 130R, a pixel 130G, and a pixel 130B, respectively. The colors of the coloring layers 266 may be a color other than red, green, and blue; for example, the colors of the coloring layer 266 may be yellow, cyan, magenta, or the like.

As illustrated in FIG. 6B, each pixel 130 may function as a subpixel and four pixels 130 may be collectively used as one pixel 140. For example, the coloring layers 266 corresponding to the four pixels 130 may be red, green, blue, and yellow. In FIG. 6B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of subpixels (pixels 130) included in one pixel 140, the color reproducibility can be particularly improved.

Alternatively, the coloring layers 266 corresponding to the four pixels 130 may be red, green, blue, and white (see FIG. 6B). With the pixel 130 emitting white light (pixel 130W), the luminance of the display region can be increased. Note that in the case where the pixel 130W emitting white light is provided, it is not necessary to provide the coloring layer 266 for the pixel 130W. Without the coloring layer 266 for the pixel 130W, there is no luminance reduction at the time of transmitting light through the coloring layer 266; thus, the luminance of the display region can be increased. Moreover, power consumption of the display device can be reduced. On the other hand, color temperature of white light can be controlled with the coloring layer 266 for the pixel 130W. Thus, the display quality of the display device can be improved. Depending on the intended use of the display device, each pixel 130 may function as a subpixel and two pixels 130 may be collectively used as one pixel 140.

Figure 7A:
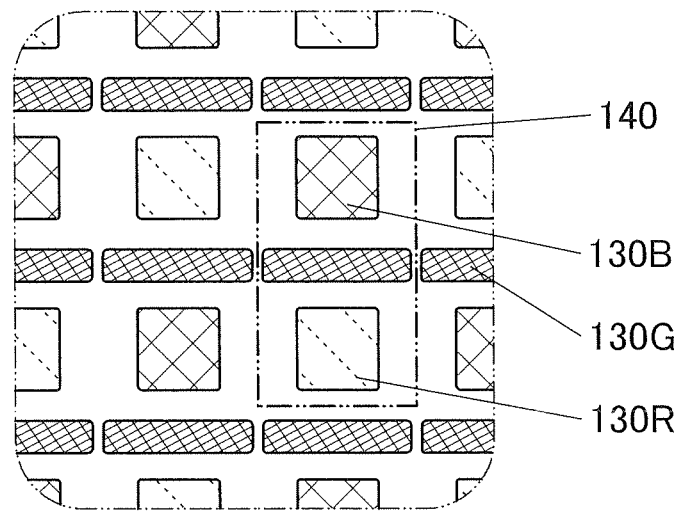
FIGS. 7A and 7B each illustrate an example of a pixel configuration of one embodiment of a display device.
Figure 7B:
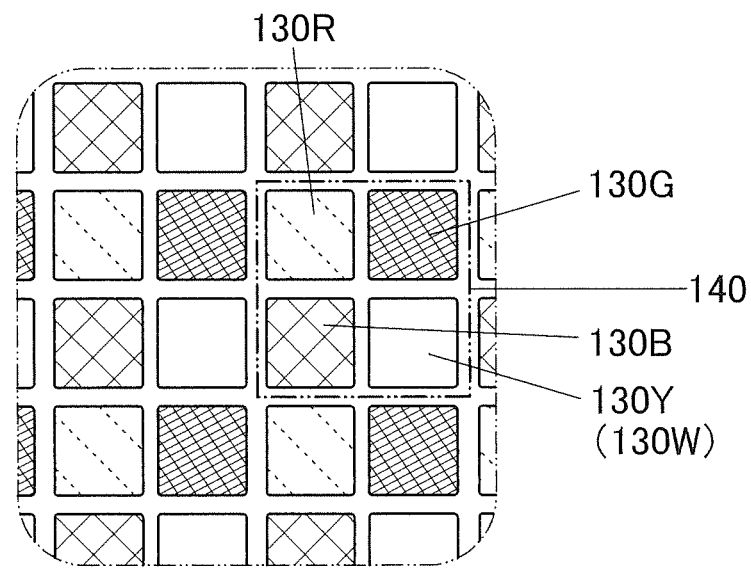

In the case where the four pixels 130 are collectively used as one pixel 140, the four pixels 130 may be arranged in a matrix, as in FIG. 7B. In addition, in the case where the four pixels 130 are collectively used as one pixel 140, a pixel that emits light of cyan, magenta, or the like may be used instead of the pixel 130Y or the pixel 130W. A plurality of pixels 130 that emit light of the same color may be provided in the pixel 140.

Note that the occupation areas or shapes of the pixels 130 included in the pixel 140 may be the same or different. In addition, arrangement is not limited to stripe arrangement or matrix arrangement. For example, delta arrangement, Bayer arrangement, pentile arrangement, or the like can be used. FIG. 7A illustrates an example of pentile arrangement.

This embodiment can be implemented in an appropriate combination with any of the structures described in the other embodiments.

Embodiment 2

In this embodiment, an example of a method for manufacturing the display device 100 is described with reference to FIGS. 8A to 8D, FIGS. 9A to 9D, FIGS. 10A to 10D, FIGS. 11A and 11B, FIGS. 12A and 12B, FIGS. 13A and 13B, FIGS. 14A and 14B, FIGS. 15A and 15B, FIGS. 16A to 16C, FIG. 17, FIGS. 18A1 to 18B3, FIG. 19, and FIGS.

20A and 20B. Note that FIGS. 8A to 8D, FIGS. 9A to 9D, FIGS. 11A and 11B, FIGS. 12A and 12B, FIGS. 13A and 13B, FIGS. 14A and 14B, and FIGS. 20A and 20B correspond to the cross section taken along the dashed-dotted line A1-A2 in FIG. 1.

<Example of Method for Manufacturing Display Device>

[Formation of Separation Layer]

Figure 8A:
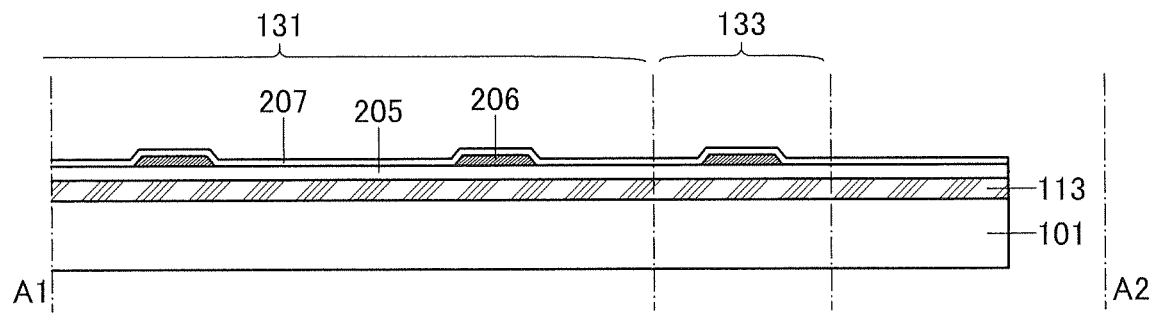
FIGS. 8A to 8D are cross-sectional views illustrating an example of a method for fabricating a display device.
Figure 8B:
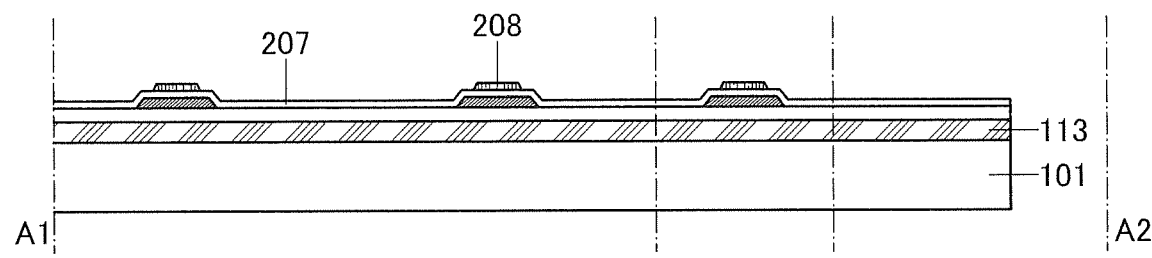

First, a separation layer 113 is formed over a substrate 101 (see FIG. 8A). As the substrate 101, a glass substrate, a quartz substrate, a sapphire substrate, a ceramic substrate, a metal substrate, or the like can be used. Alternatively, a plastic substrate having heat resistance to the processing temperature in this embodiment may be used.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like can be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements.

The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, a material containing tungsten, a material containing molybdenum, or a material containing tungsten and molybdenum is preferably used. Alternatively, in the case where the separation layer 113 has a single-layer structure, an oxide or oxynitride of tungsten, an oxide or oxynitride of molybdenum, or an oxide or oxynitride of a material containing tungsten and molybdenum is preferably used.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an oxide insulating layer is formed in contact therewith, so that the layer containing an oxide of tungsten is formed at the interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, a glass substrate is used as the substrate 101. As the separation layer 113, a tungsten layer is formed over the substrate 101 by a sputtering method.

[Formation of Insulating Layer]

Next, the insulating layer 205 is formed as a base layer over the separation layer 113 (see FIG. 8A). The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 may have, for example, a two-layer structure of silicon oxide and silicon nitride or a five-layer structure in which materials selected from the above are combined. The insulating layer 205 can be formed by a sputtering method, a CVD method, a thermal oxidation method, a coating method, a printing method, or the like.

The thickness of the insulating layer 205 is greater than or equal to 30 nm and less than or equal to 500 nm, preferably greater than or equal to 50 nm and less than or equal to 400 nm.

The insulating layer 205 can prevent or reduce diffusion of impurity elements from the substrate 101, the separation layer 113, or the like. Even after the substrate 101 is replaced with the substrate 111, the insulating layer 205 can prevent or reduce diffusion of impurity elements into the light-emitting element 125 from the substrate 111, the bonding layer 112, or the like. In this embodiment, the insulating layer 205 is formed by stacking a 200-nm-thick silicon oxynitride film and a 50-nm-thick silicon nitride oxide film by a plasma CVD method.

[Formation of Gate Electrode]

Next, the gate electrode 206 is formed over the insulating layer 205 (see FIG. 8A). The gate electrode 206 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 206 may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the gate electrode 206 is stacked over the insulating layer 205 by a sputtering method, a CVD method, an evaporation method, or the like, and a resist mask is formed over the conductive film by a photolithography process. Next, part of the conductive film to be the gate electrode 206 is etched with the use of the resist mask to form the gate electrode 206. At the same time, a wiring and another electrode can be formed.

The conductive film may be etched by a dry etching method, a wet etching method, or both a dry etching method and a wet etching method. Note that in the case where the conductive film is etched by a dry etching method, ashing treatment may be performed before the resist mask is removed, whereby the resist mask can be easily removed using a stripper.

Note that the gate electrode 206 may be formed by an electrolytic plating method, a printing method, an inkjet method, or the like instead of the above formation method.

The thickness of the gate electrode 206 is greater than or equal to 5 nm and less than or equal to 500 nm, preferably greater than or equal to 10 nm and less than or equal to 300 nm, more preferably greater than or equal to 10 nm and less than or equal to 200 nm.

The gate electrode 206 may be formed using a light-blocking conductive material, whereby external light can be prevented from reaching the semiconductor layer 208 from the gate electrode 206 side. As a result, a variation in electrical characteristics of the transistor due to light irradiation can be suppressed.

[Formation of Gate Insulating Layer]

Next, the gate insulating layer 207 is formed (see FIG. 8A). The gate insulating layer 207 can be formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, and the like.

The gate insulating layer 207 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced. For example, a stacked layer of silicon oxynitride and hafnium oxide may be used.

The thickness of the gate insulating layer 207 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The gate insulating layer 207 can be formed by a sputtering method, a CVD method, an evaporation method, or the like.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

The gate insulating layer 207 can have a stacked-layer structure in which a nitride insulating layer and an oxide insulating layer are stacked in this order from the gate electrode 206 side. When the nitride insulating layer is provided on the gate electrode 206 side, hydrogen, nitrogen, an alkali metal, an alkaline earth metal, or the like can be prevented from moving from the gate electrode 206 side to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, an "impurity" in this specification and the like includes hydrogen, nitrogen, an alkali metal, an alkaline earth metal, or the like.

In the case where an oxide semiconductor is used for the semiconductor layer 208, the density of defect states at the interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer. This is because the density of defect states at the interface between the gate insulating layer 207 and the semiconductor layer 208 can be further reduced.

In the case where the gate insulating layer 207 is a stacked layer of a nitride insulating layer and an oxide insulating layer as described above, it is preferable that the nitride insulating layer be thicker than the oxide insulating layer.

The nitride insulating layer has a dielectric constant higher than that of the oxide insulating layer; therefore, an electric field generated from the gate electrode 206 can be efficiently transmitted to the semiconductor layer 208 even when the gate insulating layer 207 has a large thickness. When the gate insulating layer 207 has a large total thickness, the withstand voltage of the gate insulating layer 207 can be increased. Accordingly, the reliability of the semiconductor device can be improved.

The gate insulating layer 207 can have a stacked-layer structure in which a first nitride insulating layer with few defects, a second nitride insulating layer with a high blocking property against hydrogen, and an oxide insulating layer are stacked in that order from the gate electrode 206 side. When the first nitride insulating layer with few defects is used in the gate insulating layer 207, the withstand voltage of the gate insulating layer 207 can be improved. Particularly when an oxide semiconductor is used for the semiconductor layer 208, the use of the second nitride insulating layer with a high blocking property against hydrogen in the gate insulating layer 207 makes it possible to prevent hydrogen contained in the gate electrode 206 and the first nitride insulating layer from moving to the semiconductor layer 208.

An example of a method for forming the first and second nitride insulating layers is described below. First, a silicon nitride film with few defects is formed as the first nitride insulating layer by a plasma CVD method in which a mixed gas of silane, nitrogen, and ammonia is used as a source gas. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against hydrogen are stacked can be formed.

The gate insulating layer 207 can have a structure in which a third nitride insulating layer with a high blocking property against an impurity, the first nitride insulating layer with few defects, the second nitride insulating layer with a high blocking property against hydrogen, and the oxide insulating layer are stacked in that order from the gate electrode 206 side. When the third nitride insulating layer with a high blocking property against an impurity is provided in the gate insulating layer 207, hydrogen, nitrogen, alkali metal, alkaline earth metal, or the like, can be prevented from moving from the gate electrode 206 to the semiconductor layer 208.

An example of a method for forming the first to third nitride insulating layers is described below. First, a silicon nitride film with a high blocking property against an impurity is formed as the third nitride insulating layer by a plasma CVD method in which a mixed gas of silane, nitrogen, and ammonia is used as a source gas. Next, a silicon nitride film with few defects is formed as the first nitride insulating layer by increasing the flow rate of ammonia. Then, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against an impurity are stacked can be formed.

Moreover, in the case of forming a gallium oxide film as the gate insulating layer 207, an MOCVD method can be employed.

Note that the threshold voltage of a transistor can be changed by stacking the semiconductor layer 208 in which a channel of the transistor is formed and an insulating layer containing hafnium oxide with an oxide insulating layer provided therebetween and injecting electrons into the insulating layer containing hafnium oxide.

[Formation of Semiconductor Layer]

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

First, a semiconductor film for forming the semiconductor layer 208 is formed by a CVD method such as a plasma CVD method, an LPCVD method, a metal CVD method, or an MOCVD method, an ALD method, a sputtering method, an evaporation method, or the like. When the semiconductor film is formed by an MOCVD method, damage to a surface where the semiconductor layer is formed can be reduced.

Next, a resist mask is formed over the semiconductor film, and part of the semiconductor film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, fabrication cost can be reduced.

Note that the etching of the semiconductor film may be performed by either one or both of a dry etching method and a wet etching method. After the etching of the semiconductor film, the resist mask is removed (see FIG. 8B).

[Formation of Source Electrode, Drain Electrode, and the Like]

Figure 8C:
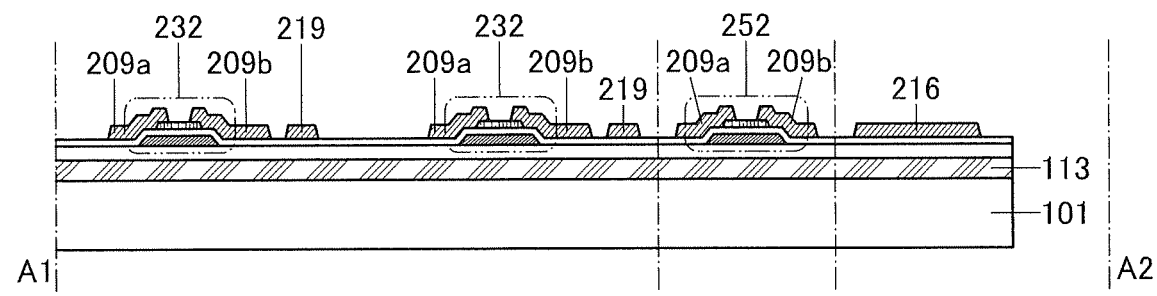

Next, the source electrode 209a, the drain electrode 209b, the wiring 219, and the terminal electrode 216 are formed (see FIG. 8C). First, a conductive film, which forms the source electrode 209a, the drain electrode 209b, the wiring 219, and the terminal electrode 216, is formed over the gate insulating layer 207 and the semiconductor layer 208.

The conductive film can have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a tungsten film, a copper film, and a tungsten film are stacked in this order.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and a conductive material containing nitrogen. It is also possible to use a stacked-layer structure formed using a material containing the above metal element, a conductive material containing oxygen, and a conductive material containing nitrogen.

The thickness of the conductive film is greater than or equal to 5 nm and less than or equal to 500 nm, preferably greater than or equal to 10 nm and less than or equal to 300 nm, more preferably greater than or equal to 10 nm and less than or equal to 200 nm. In this embodiment, a 300-nm-thick tungsten film is formed as the conductive film.

Then, part of the conductive film is selectively etched using a resist mask to form the source electrode 209a, the drain electrode 209b, the wiring 219, and the terminal electrode 216 (including other electrodes and wirings formed using the same layer). The resist mask can be formed by a photolithography method, a printing method, an inkjet method, or the like as appropriate. Formation of the resist mask by an inkjet method needs no photomask; thus, fabrication cost can be reduced.

The conductive film may be etched by a dry etching method, a wet etching method, or both a dry etching method and a wet etching method. Note that an exposed portion of the semiconductor layer 208 is removed by the etching step in some cases. After the etching of the conductive film, the resist mask is removed.

With the source electrode 209a and the drain electrode 209b, the transistor 232 and the transistor 252 are completed.

[Formation of Insulating Layer]

Figure 8D:
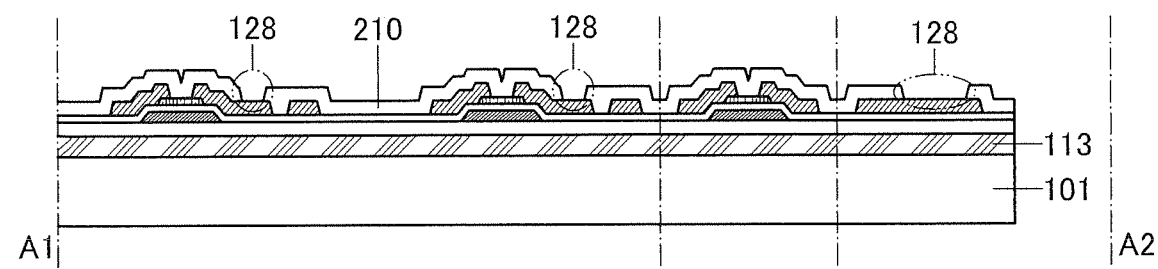

Next, the insulating layer 210 is formed over the source electrode 209a, the drain electrode 209b, the wiring 219, and the terminal electrode 216 (see FIG. 8D). The insulating layer 210 can be formed using a material and a method similar to those of the insulating layer 205.

In the case where an oxide semiconductor is used for the semiconductor layer 208, an insulating layer containing oxygen is preferably used for at least part of the insulating layer 210 that is in contact with the semiconductor layer 208.

For example, in the case where the insulating layer 210 is a stack of a plurality of layers, at least a layer that is in contact with the semiconductor layer 208 is preferably formed using silicon oxide.

[Formation of Opening]

Next, part of the insulating layer 210 is selectively etched using a resist mask to form an opening 128 (see FIG. 8D). At the same time, another opening that is not illustrated can also be formed. The resist mask can be formed by a photolithography method, a printing method, an inkjet method, or the like as appropriate. Formation of the resist mask by an inkjet method needs no photomask; thus, fabrication cost can be reduced.

The insulating layer 210 may be etched by a dry etching method, a wet etching method, or both a dry etching method and a wet etching method.

The drain electrode 209b and the terminal electrode 216 are partly exposed by the formation of the opening 128. The resist mask is removed after the formation of the opening 128.

[Formation of Planarization Film]

Figure 9A:
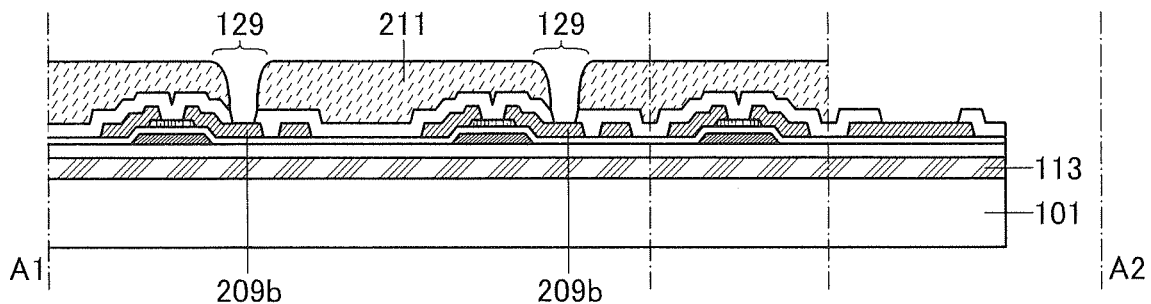
FIGS. 9A to 9D are cross-sectional views illustrating an example of a method for fabricating a display device.

Next, the insulating layer 211 is formed over the insulating layer 210 (see FIG. 9A). The insulating layer 211 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can make polishing treatment unnecessary. As the insulating material with a planarization function, for example, an organic material such as a polyimide resin or an acrylic resin can be used. Besides such organic materials, a low-dielectric constant material (a low-k material) or the like can be used. Note that the insulating layer 211 may be formed by stacking a plurality of insulating layers formed of any of these materials.

Part of the insulating layer 211 that overlaps with the opening 128 is removed to form an opening 129. At the same time, another opening that is not illustrated is also formed. In addition, the insulating layer 211 in a region to which the external electrode 124 is connected later is removed. Note that the opening 129 or the like can be formed in such a manner that a resist mask is formed by a photolithography process over the insulating layer 211 and a region of the insulating layer 211 that is not covered with the resist mask is etched. A surface of the drain electrode 209b is exposed by the formation of the opening 129.

When the insulating layer 211 is formed using a photosensitive material, the opening 129 can be formed without the resist mask. In this embodiment, a photosensitive polyimide resin is used to form the insulating layer 211 and the opening 129.

[Formation of Anode]

Figure 9B:
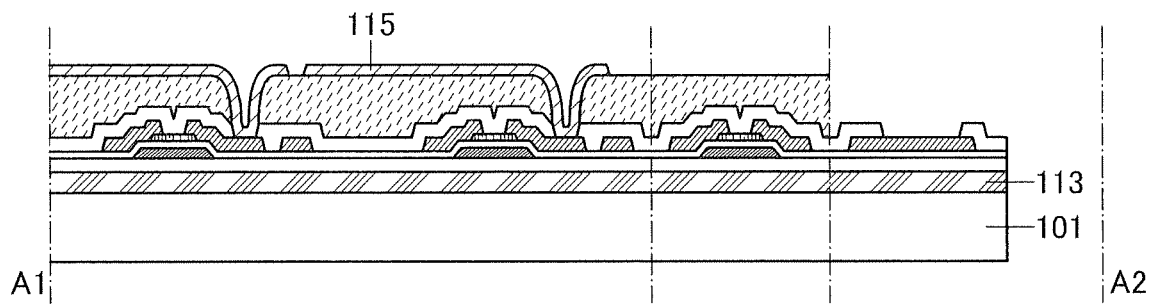

Next, the electrode 115 is formed over the insulating layer 211 (see FIG. 9B). The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117, and a layer having high reflectance (e.g., aluminum, an alloy containing aluminum, or silver) may be provided in contact with the layer.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, fabrication cost can be reduced. The resist mask is removed after the formation of the electrode 115.

[Formation of Partition]

Figure 9C:
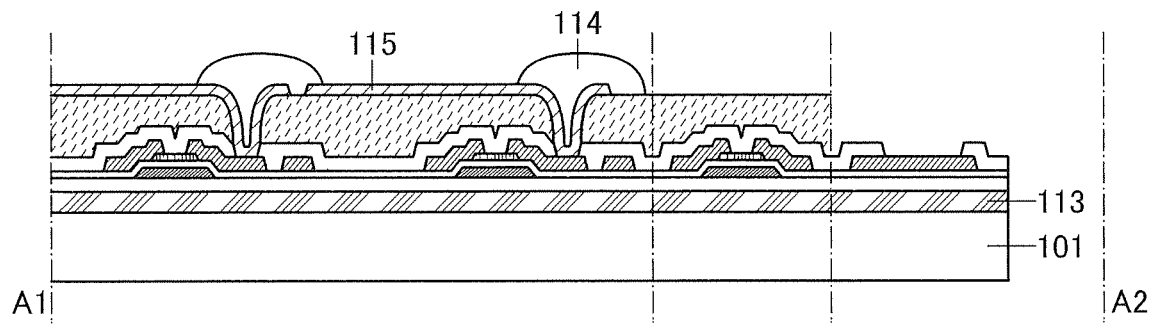
Figure 9D:
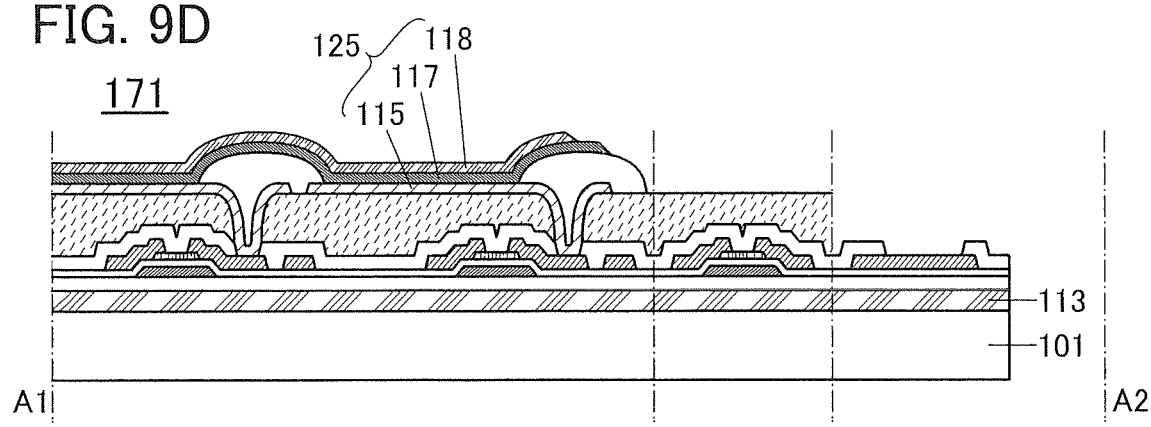

Next, the partition 114 is formed (see FIG. 9C). The partition 114 is provided in order to prevent an unintended electrical short-circuit between light-emitting elements 125 in adjacent pixels and unintended light emission from the light-emitting element 125. In the case of using a metal mask for formation of the EL layer 117 described later, the partition 114 has a function of preventing the contact of the metal mask with the electrode 115. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

A structure of the EL layer 117 is described in Embodiment 6.

[Formation of Cathode]

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118.

In the case where light emitted from the EL layer 117 is extracted through the electrode 118, the electrode 118 preferably has a property of transmitting visible light. The light-emitting element 125 includes the electrode 115, the EL layer 117, and the electrode 118 (see FIG. 9D).

In this embodiment, the substrate 101 including the transistor 232 and the light-emitting element 125 is referred to as an element substrate 171.

[Formation of Counter Substrate]

Figure 10A:
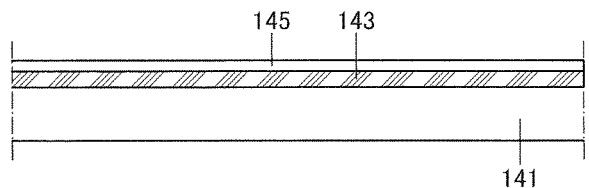
FIGS. 10A to 10D are cross-sectional views illustrating an example of a method for fabricating a display device.

The separation layer 143 and the insulating layer 145 are formed over the element formation substrate 141 (see FIG. 10A). The element formation substrate 141 can be formed using a material similar to that of the substrate 101. The separation layer 143 can be formed using a material and a method similar to those of the separation layer 113. The insulating layer 145 can be formed using a material and a method similar to those of the insulating layer 205.

Figure 10B:
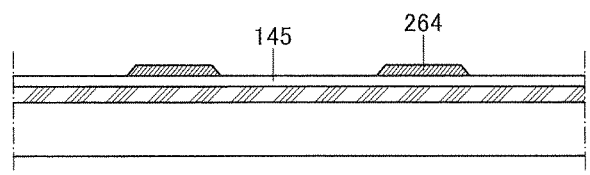
Figure 10C:
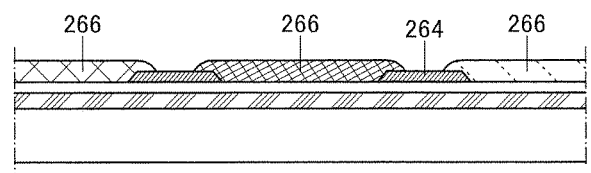

Next, the light-blocking layer 264 is formed over the insulating layer 145 (see FIG. 10B). After that, the coloring layer 266 is formed (see FIG. 10C).

The light-blocking layer 264 and the coloring layer 266 each are formed in a desired position with any of various materials by a printing method, an inkjet method, a photolithography method, or the like.

Figure 10D:
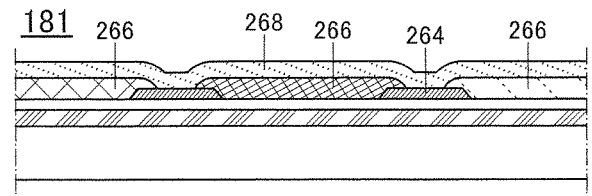

Next, the overcoat layer 268 is formed over the light-blocking layer 264 and the coloring layer 266 (see FIG. 10D).

For the overcoat layer 268, an organic insulating layer of an acrylic resin, an epoxy resin, polyimide, or the like can be used. With the overcoat layer 268, for example, an impurity or the like contained in the coloring layer 266 can be prevented from diffusing into the light-emitting element 125 side. Note that the overcoat layer 268 is not necessarily formed.

A light-transmitting conductive film may be formed as the overcoat layer 268. The light-transmitting conductive film is formed as the overcoat layer 268, so that the light 235 emitted from the light-emitting element 125 can be transmitted through the overcoat layer 268 and layers overlapping with the overcoat layer 268, while ionized impurities can be prevented from passing through the overcoat layer 268.

The light-transmitting conductive film can be formed using, for example, indium oxide, indium tin oxide (ITO), indium zinc oxide, zinc oxide, or zinc oxide to which gallium is added. Graphene or a metal film that is thin enough to have a light-transmitting property can also be used.

Through the above-described steps, the components such as the coloring layer 266 can be formed over the element formation substrate 141. In this embodiment, the element formation substrate 141 including the coloring layer 266 and the like is referred to as a counter substrate 181.

[Attachment of Element Substrate to Counter Substrate]

Figure 11A:
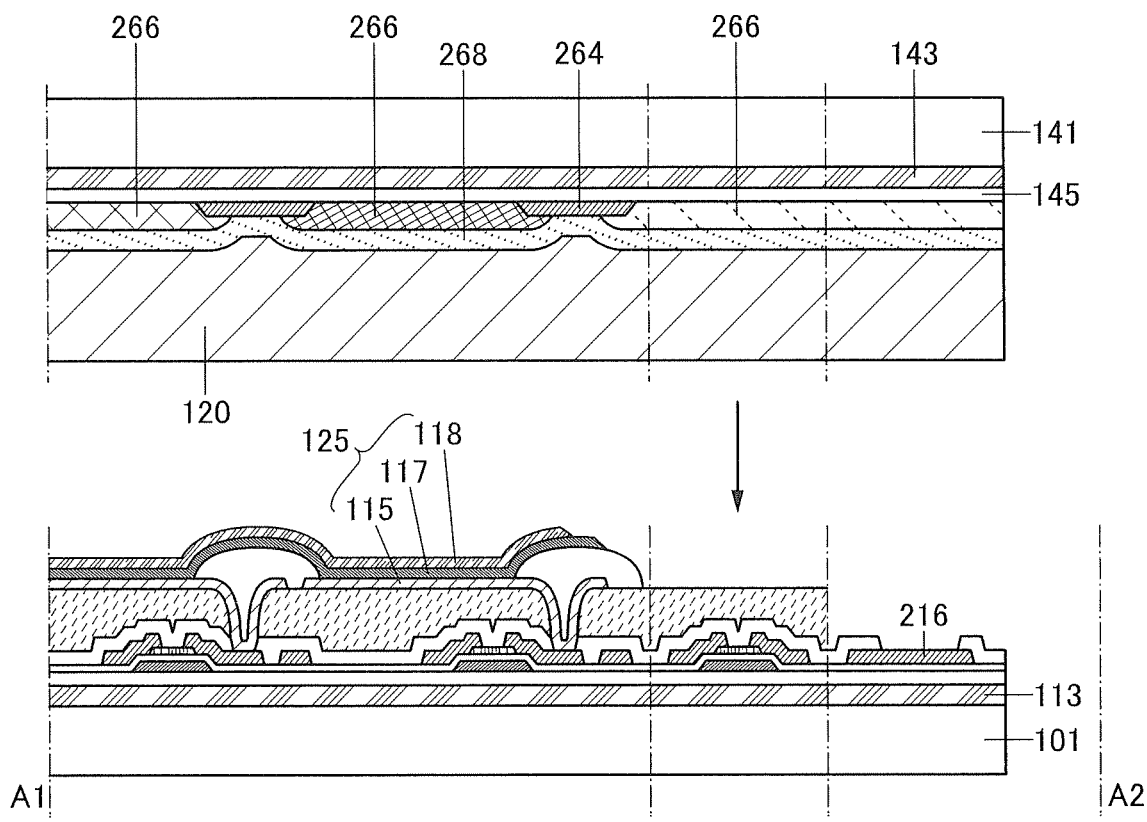
FIGS. 11A and 11B are cross-sectional views illustrating an example of a method for fabricating a display device.

Next, the element substrate 171 is attached to the counter substrate 181 with bonding layer 120 positioned therebetween such that the light-emitting element 125 included in the element substrate 171 faces the coloring layer 266 included in the counter substrate 181 (see FIG. 11A).

A light curable adhesive, a reactive curable adhesive, a thermosetting adhesive, or an anaerobic adhesive can be used as the bonding layer 120. For example, an epoxy resin, an acrylic resin, or an imide resin can be used. In a top-emission structure, a drying agent (e.g., zeolite) having a size less than or equal to the wavelength of light or a filler (e.g., titanium oxide or zirconium) with a high refractive index is preferably mixed into the bonding layer 120, in which case the efficiency of extracting light emitted from the EL layer 117 can be improved.

[Separation of Substrate 101 from Insulating Layer]

Figure 11B:
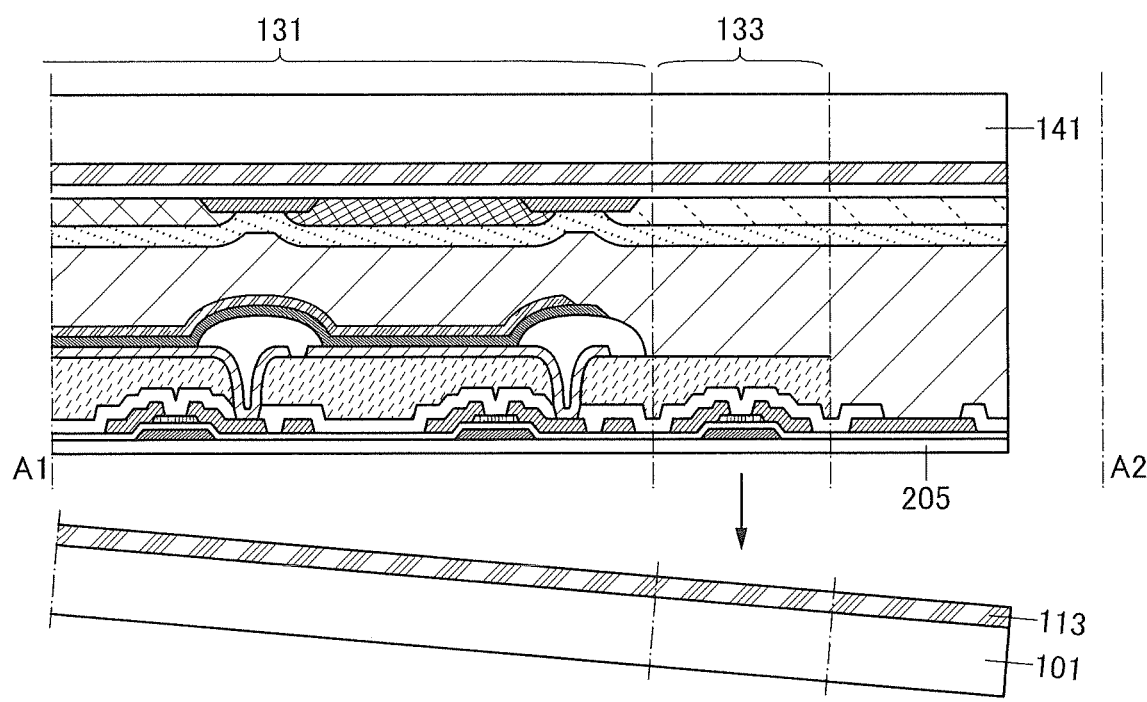

Next, the substrate 101 and the separation layer 113 are separated from the insulating layer 205 (see FIG. 11B). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. Alternatively, the cut is sprayed with a mist of water. A portion between the separation layer 113 and the insulating layer 205 absorbs water through capillarity action, so that the substrate 101 with the separation layer 113 can be separated easily from the insulating layer 205.

[Bonding of Substrate 111]

Figure 12A:
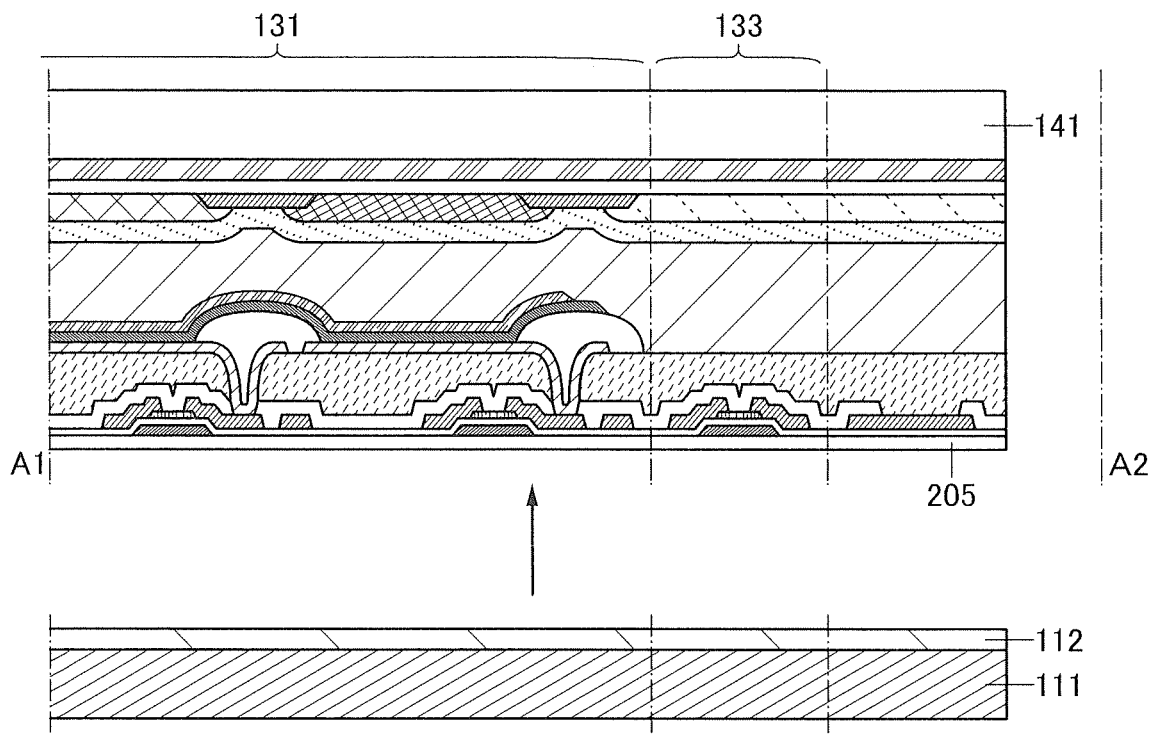
FIGS. 12A and 12B are cross-sectional views illustrating an example of a method for fabricating a display device.
Figure 12B:
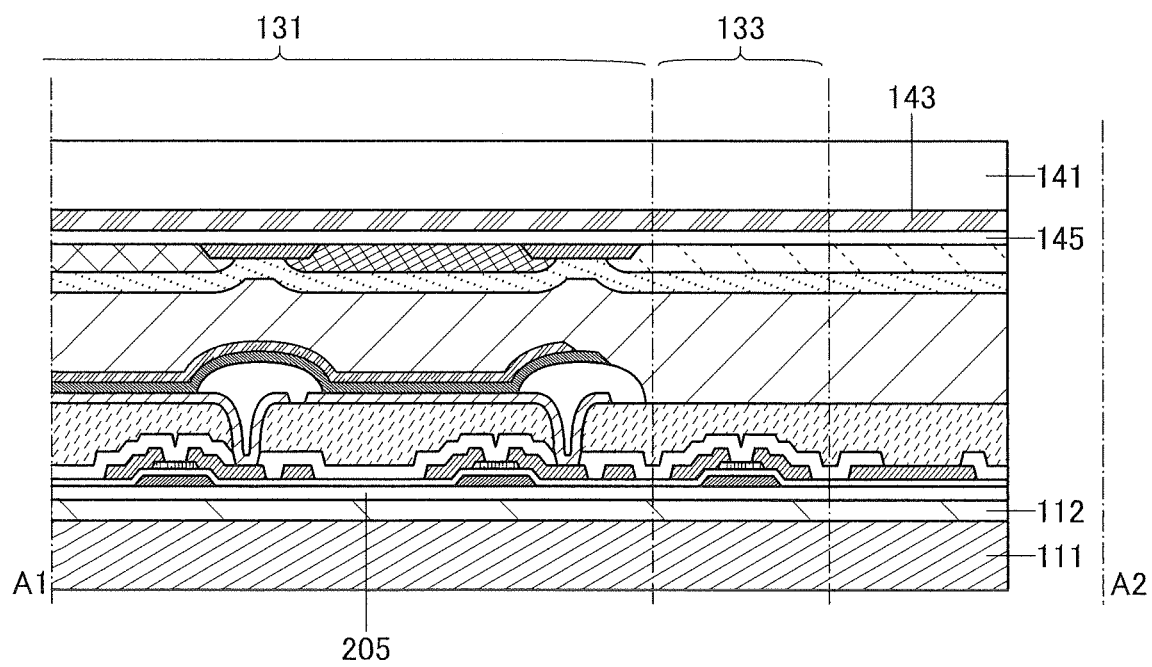

Next, the substrate 111 is attached to the insulating layer 205 with the bonding layer 112 therebetween (see FIGS. 12A and 12B). The bonding layer 112 can be formed using a material similar to that of the bonding layer 120. In this embodiment, a 20-μm-thick aramid (polyamide resin) with a Young's modulus of 10 GPa is used for the substrate 111.

[Separation of Element Formation Substrate 141 from Insulating Layer]

Figure 13A:
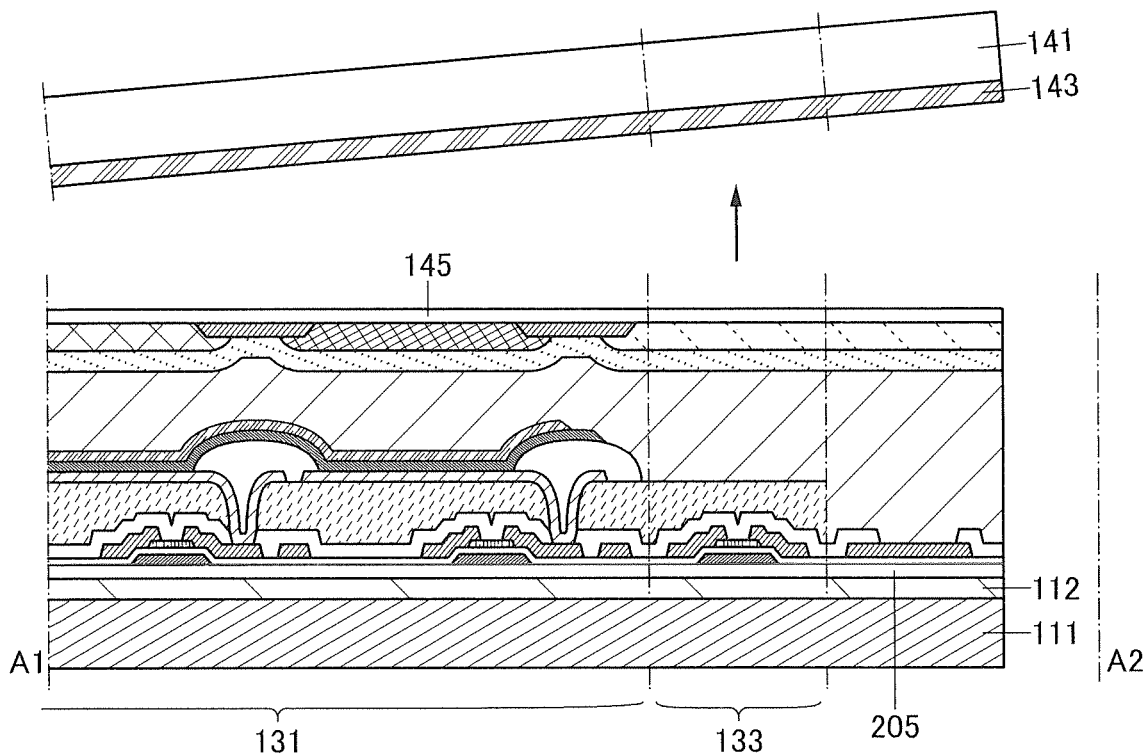
FIGS. 13A and 13B are cross-sectional views illustrating an example of a method for fabricating a display device.

Next, the element formation substrate 141 with the separation layer 143 is separated from the insulating layer 145 (see FIG. 13A). The element formation substrate 141 can be separated in a manner similar to that of the above-described separation method of the substrate 101.

[Bonding of Substrate 121]

Figure 13B:
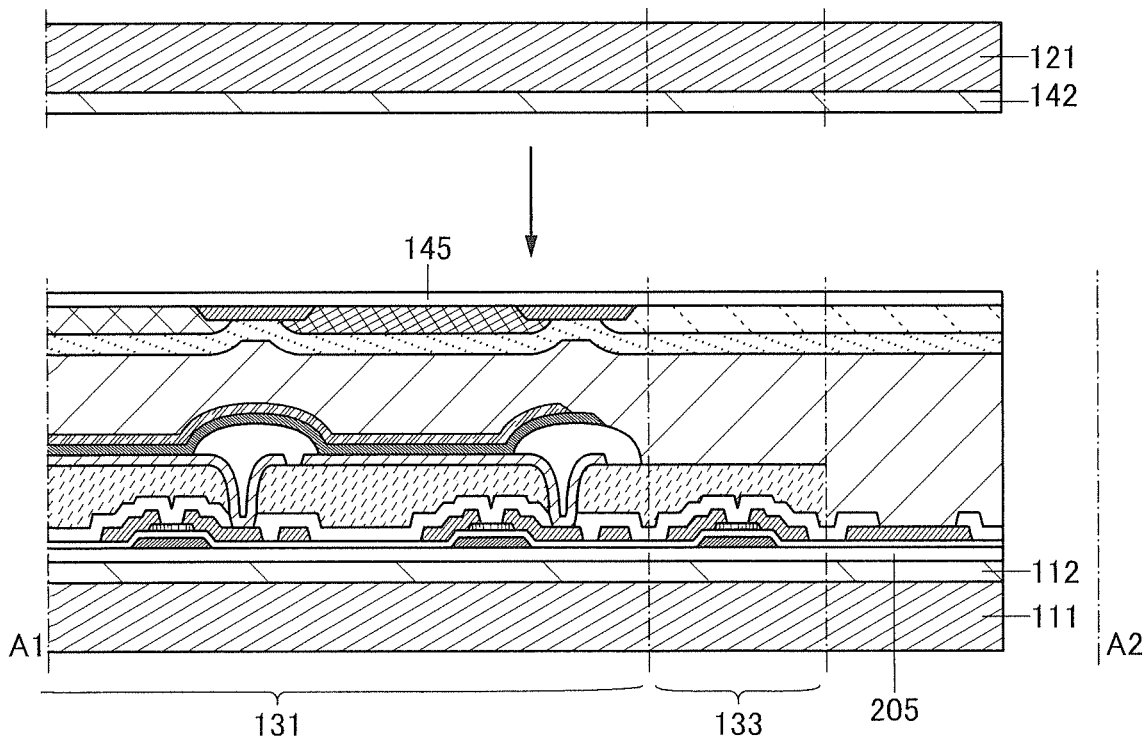

Next, the substrate 121 is attached to the insulating layer 145 with the bonding layer 142 therebetween (see FIG. 13B). The bonding layer 142 can be formed using a material similar to that of the bonding layer 120. The substrate 121 can be formed using a material similar to that of the substrate 111.

[Formation of Opening]

Figure 14A:
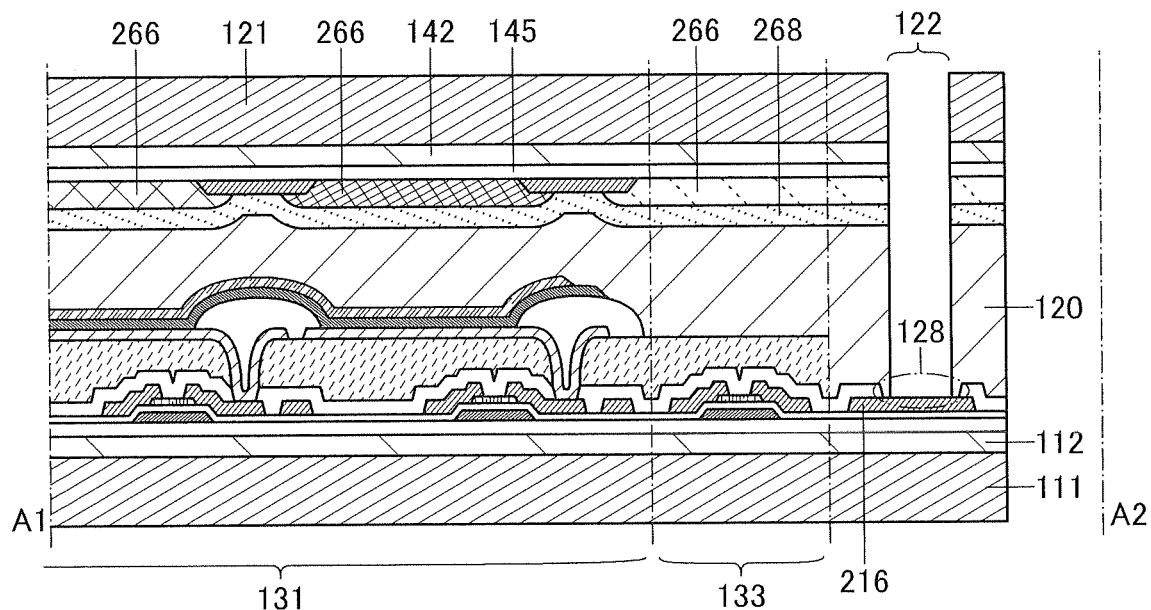
FIGS. 14A and 14B are cross-sectional views illustrating an example of a method for fabricating a display device.

Next, the substrate 121, the bonding layer 142, the insulating layer 145, the coloring layer 266, the overcoat layer 268, and the bonding layer 120 in a region overlapping with the terminal electrode 216 and the opening 128 are removed to form the opening 122 (see FIG. 14A). A surface of the terminal electrode 216 is partly exposed by the formation of the opening 122.

[Formation of External Electrode]

Figure 14B:
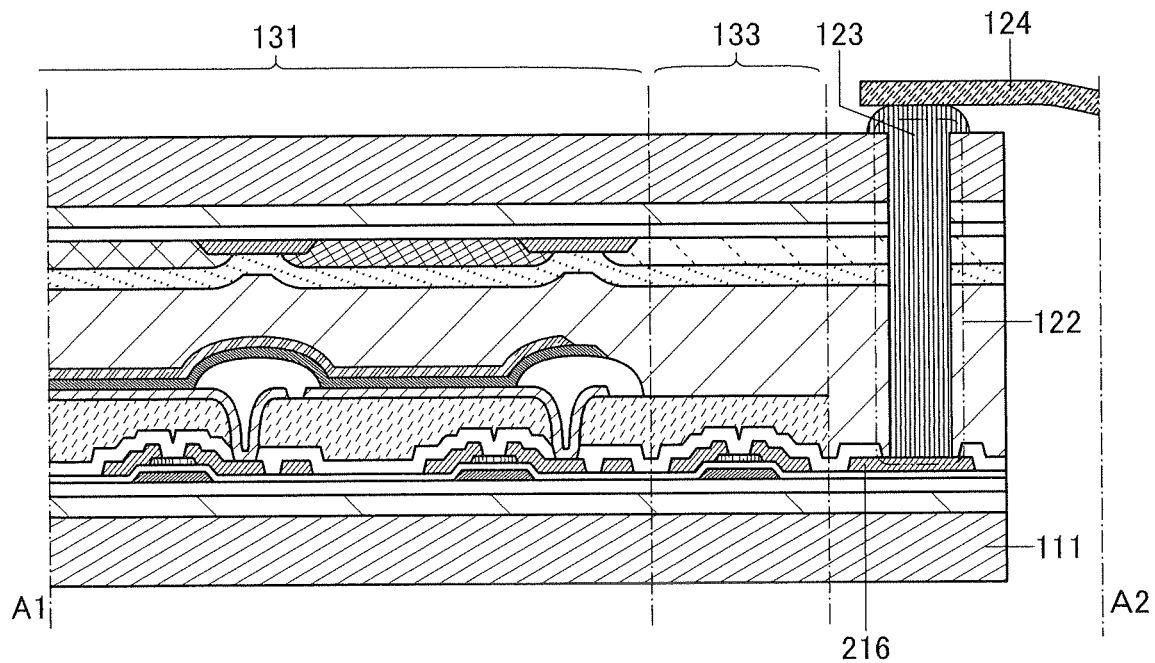

Next, the anisotropic conductive connection layer 123 is formed in and over the opening 122, and the external electrode 124 is formed over the anisotropic conductive connection layer 123 (see FIG. 14B). The external electrode 124 is electrically connected to the terminal electrode 216 through the anisotropic conductive connection layer 123. Power or a signal is supplied to the display device 100 through the external electrode 124 and the terminal electrode 216. For example, a flexible printed circuit (FPC) or a tape carrier package (TCP) can be used as the external electrode 124. The TCP is, for example, a tape automated bonding (TAB) tape mounted with a semiconductor chip on which an integrated circuit is formed. The semiconductor chip is electrically connected to the terminal electrode 216 through the TAB tape.

The anisotropic conductive connection layer 123 can be formed using any of various anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting, light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

Note that a metal wire can also be used as the external electrode 124. Although the anisotropic conductive connection layer 123 may be used to connect the metal wire and the terminal electrode 216 to each other, the connection may be performed by a wire bonding method without using the anisotropic conductive connection layer 123. Alternatively, the metal wire and the terminal electrode 216 may be connected to each other by a soldering method.

Figure 15A:
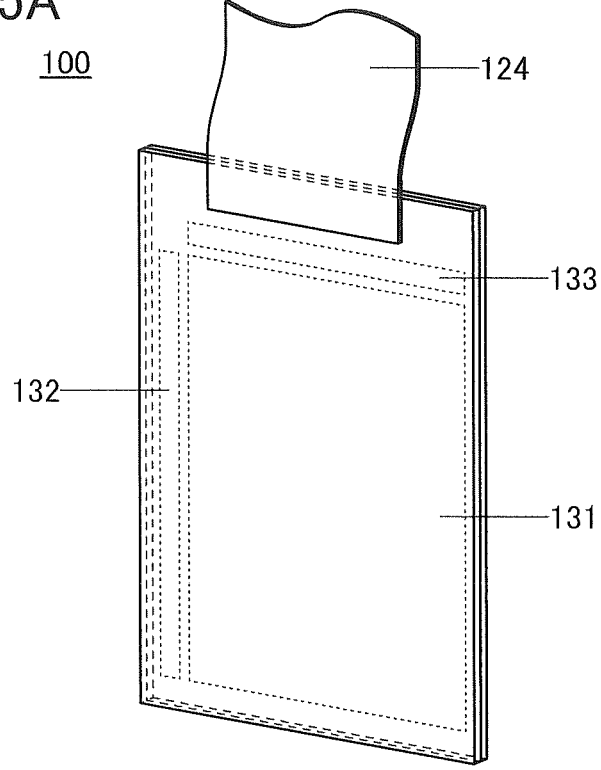
FIGS. 15A and 15B each illustrate one embodiment of a display device.
Figure 15B:
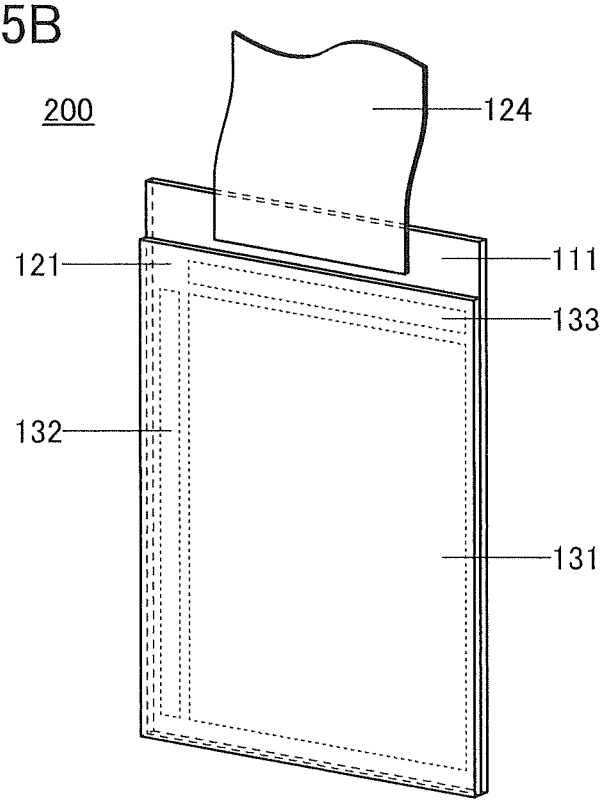

In the above-described manner, the display device 100 to which the external electrode 124 is connected can be fabricated. FIG. 15A is a perspective view of the display device 100 to which the external electrode 124 is connected. Note that the substrate 121 may be formed to cover the display region 131, the circuit 132, and the circuit 133 and not to cover the other regions. An example of a display device having such a structure is illustrated in FIG. 15B. A display device 200 illustrated in FIG. 15B is different from the display device 100 in that the substrate 121 is not provided in a connection region of the external electrode 124. Therefore, the external shapes of the substrate 111 and the substrate 121 included in the display device 200 are different.

[Formation of Layer 147]

Next, the display device 100 is covered with the layer 147. An example of a method for forming the layer 147 that covers the display device 100 is described with reference to FIGS. 16A to 16C. A metallic mold 191 illustrated in FIG. 16A has a depressed portion 192. A metallic mold 193 has a depressed portion 194. The depressed portion 192 and the depressed portion 194 are preferably similar in shape. The surfaces of the depressed portion 192 and the depressed portion 194 preferably have high planarity by being subjected to mirror finishing or the like.

First, the metallic mold 191 and the metallic mold 193 are overlapped such that the depressed portion 192 and the depressed portion 194 face each other. Next, the display device 100 to which the external electrode 124 is connected is disposed in a space surrounded by the depressed portion 192 and the depressed portion 194 (see FIG. 16B).

Figure 16A:
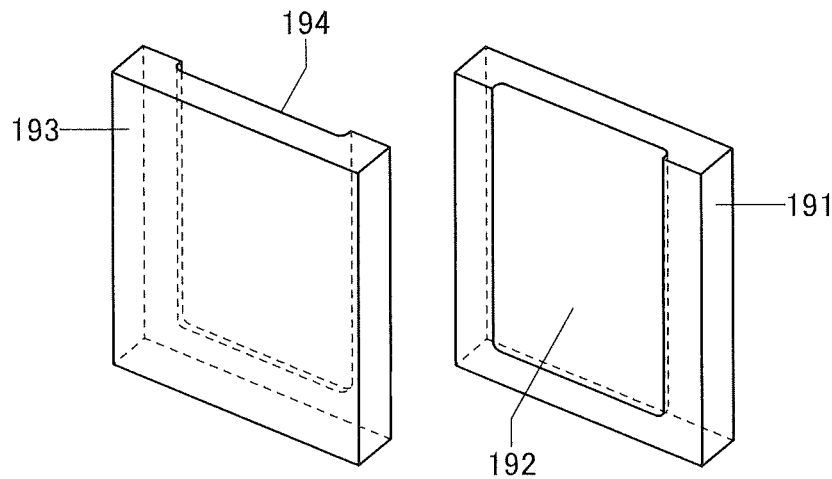
FIGS. 16A to 16C illustrate an example of a method for fabricating a display device.
Figure 16B:
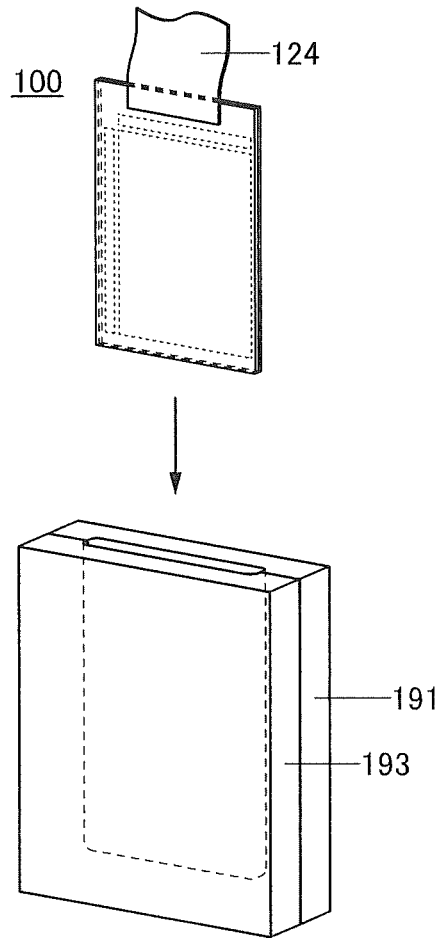
Figure 16C:
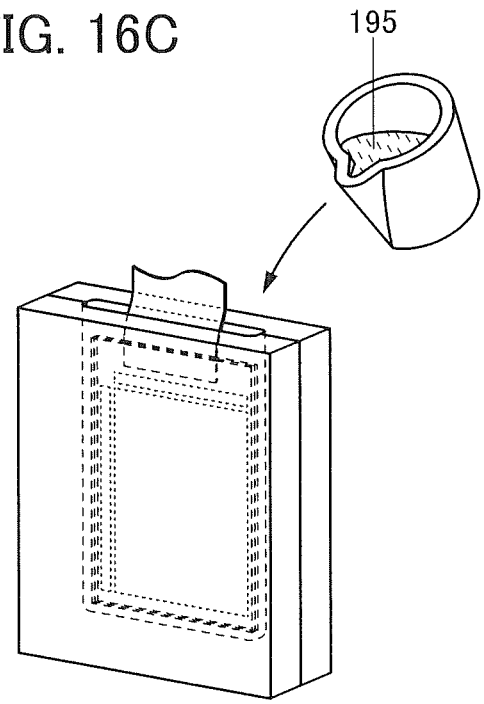
Figure 17:
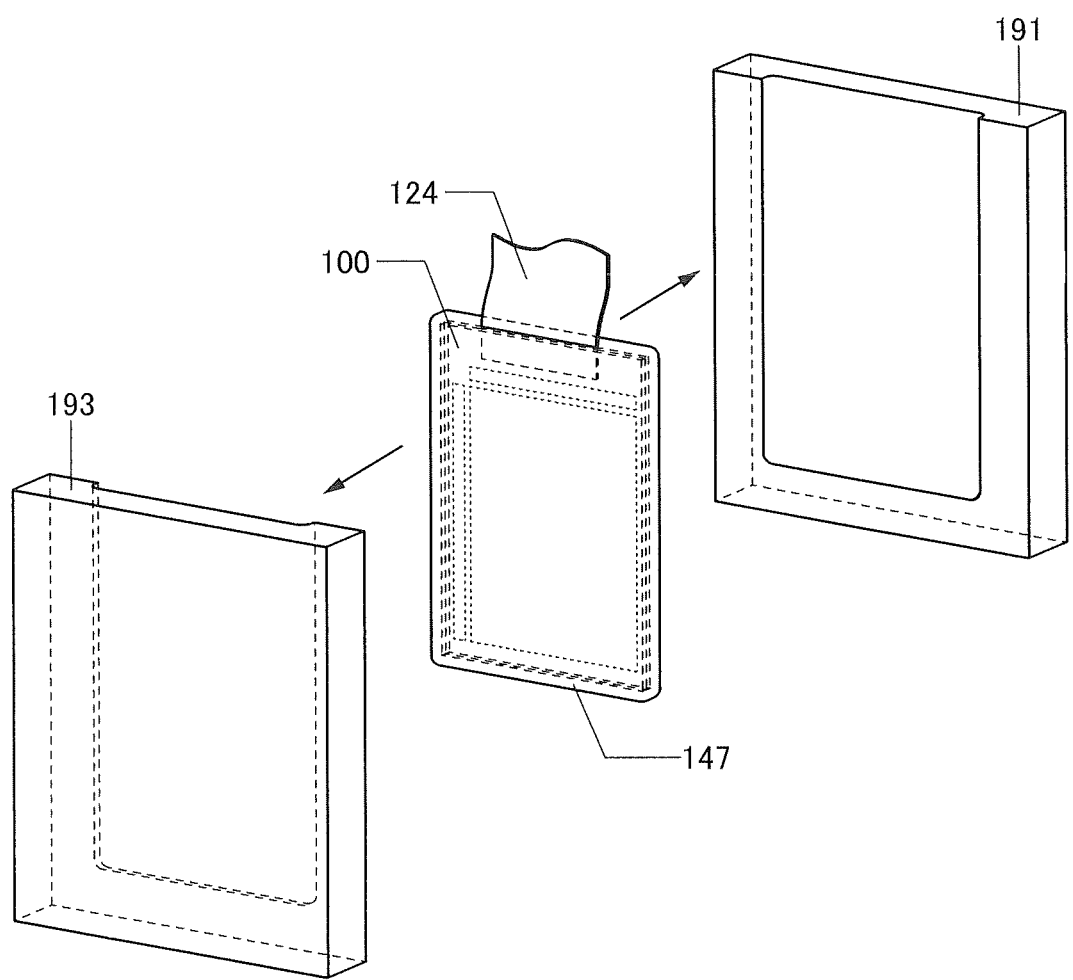
FIG. 17 illustrates an example of a method for fabricating a display device.

Next, the space surrounded by the depressed portion 192 and the depressed portion 194 is filled with a liquid filler 195 (see FIG. 16C). As the filler 195, it is preferable to use a high molecular material that exhibits a light transmitting property after being cured. As the filler 195, a single-component-type material that does not need a curing agent or a two-component-type material that is cured by being mixed with a curing agent can be used, for example. Alternatively, a material that is cured by heating, irradiation with light such as ultraviolet light can be used. A desiccant that inhibits permeation of moisture may be added to the filler 195.

In this embodiment, a two-component-type material that becomes light-transmitting silicone rubber after being cured is used as the filler 195.

The filler 195 is cured to have the shape of the depressed portion 192 and the depressed portion 194, whereby the layer 147 can be formed. After the formation of the layer 147, the metallic mold 191 and the metallic mold 193 are separated (see FIG. 17). Note that it is preferable to apply a remover onto surfaces of the depressed portion 192 and the depressed portion 194 before the space is filled with the filler 195, in which case the layer 147 can be separated easily from the metallic mold 191 and the metallic mold 193.

FIG. 18A1 is a perspective view of the display device 100 to which the external electrode 124 is connected and which is covered with the layer 147. FIG. 18A2 is a cross-sectional view taken along the dashed-dotted line H1-H2 in FIG. 18A1. With the layer 147 that covers the display device 100, the display device is less likely to be broken even when being bent and extended repeatedly. The layer 147 that covers the display device 100 is seamless. By covering the edges of the substrate 111 and the substrate 121 with the layer 147, entry of impurity such as moisture from the edges can be prevented, whereby the display device 100 can have high reliability and high display quality.

FIG. 18B1 is a perspective view of the display device 200 to which the external electrode 124 is connected and which is covered with the layer 147. FIG. 18B2 is a cross-sectional view taken along the dashed-dotted line H1-H2 in FIG. 18A1. In the case where the substrate 111 and the substrate 121 have different external dimensions as in the display device 200, edges (side surfaces) of one of the substrate 111 and the substrate 121 may be covered with the layer 147. By covering the side surfaces of at least one of the substrate 111 and the substrate 121 with the layer 147, an outer periphery of a portion where the substrate 111 and the substrate 121 overlap each other is covered with the layer 147. Therefore, impurity such as moisture can be prevented from entering the display region 131, whereby the display device 200 can have high reliability and high display quality. Alternatively, as illustrated in FIG. 18B3, the layer 147 may be provided to cover both of the substrates 111 and 121 having different external dimensions. FIG. 19 is a detailed cross-sectional view taken along the dashed-dotted line H5-H6 in FIG. 18B1.

<Modification Example of Display Device>

Figure 20A:
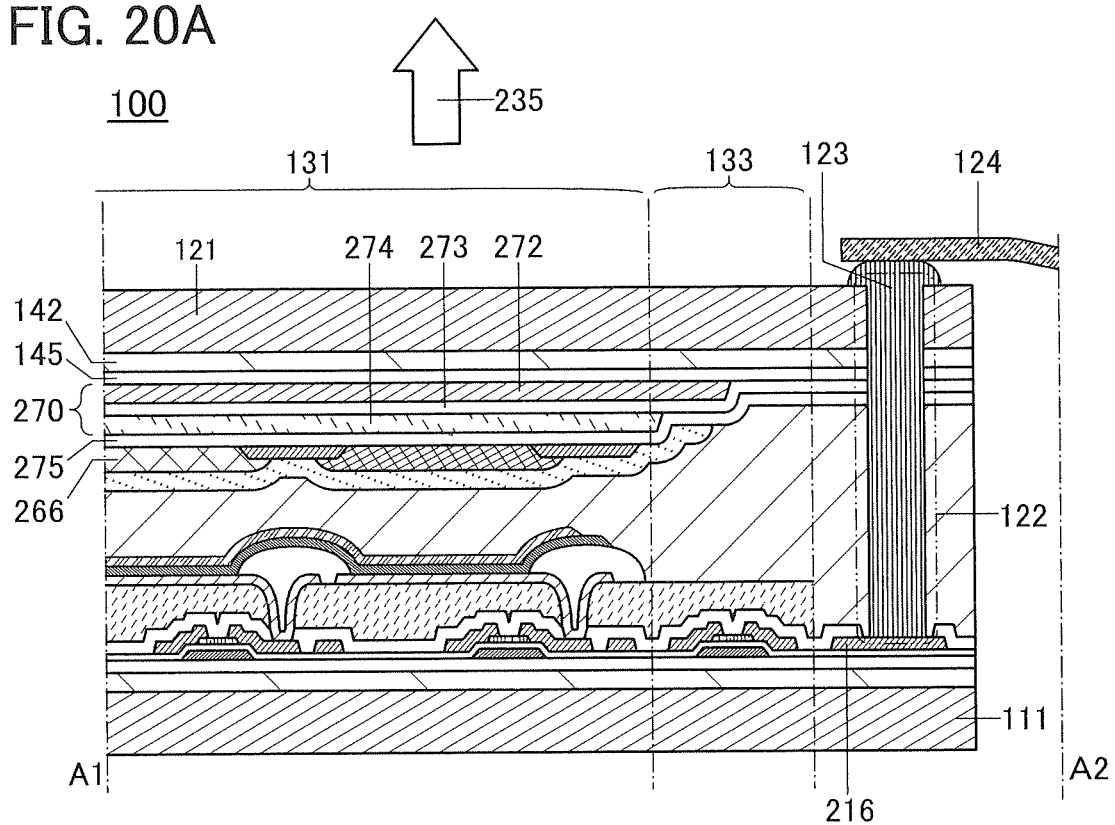
FIGS. 20A and 20B are cross-sectional views illustrating one embodiment of a display device.

FIG. 20A is a cross-sectional view of the display device 100 including a touch sensor 270 between the substrate 121 and the coloring layer 266. Specifically, the display device 100 illustrated in FIG. 20A includes an electrode 272, an insulating layer 273, an electrode 274, and an insulating layer 275 between the insulating layer 145 and the coloring layer 266. The electrodes 272 and 274 are preferably formed with a light-transmitting conductive material. The insulating layer 273 and the insulating layer 275 can be formed using a material and a method similar to those of the insulating layer 205. The touch sensor 270 includes the electrode 272 and the electrode 274. Although an example in which the touch sensor 270 is a capacitance touch sensor is described in this embodiment, the touch sensor 270 may be a resistive touch sensor. Examples of the capacitive touch sensor are of a surface capacitive type and of a projected capacitive type. Alternatively, an active matrix touch sensor using an active element such as a transistor can be used.

Note that a low resistance material is preferably used for a conductive film such as the electrodes 272 and 274, i.e., a wiring or an electrode, included in the touch sensor. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. In the case of using an Ag nanowire, a light transmittance of 89% or more and a sheet resistance of 40 ohm/square or more and 100 ohm/square or less can be achieved. Since such a material provides a high light transmittance, the metal nanowire, the metal mesh, a carbon nanotube, graphene, or the like may be used for an electrode of the display element, such as a pixel electrode or a common electrode.

Alternatively, one or more of layers each formed using a material having a specific function, such as an anti-reflection layer, a light diffusion layer, a microlens array, a prism sheet, a retardation plate, or a polarizing plate, (hereinafter referred to as "functional layers") may be provided on the outside of the substrate 111 or the substrate 121 through which light 235 is emitted. As the anti-reflection layer, for example, a circularly polarizing plate or the like can be used. With the functional layer, a display device having a higher display quality can be achieved. Moreover, power consumption of the display device can be reduced. As the functional layer, a substrate including a touch sensor may be provided to overlap with the display device 100.

Figure 20B:
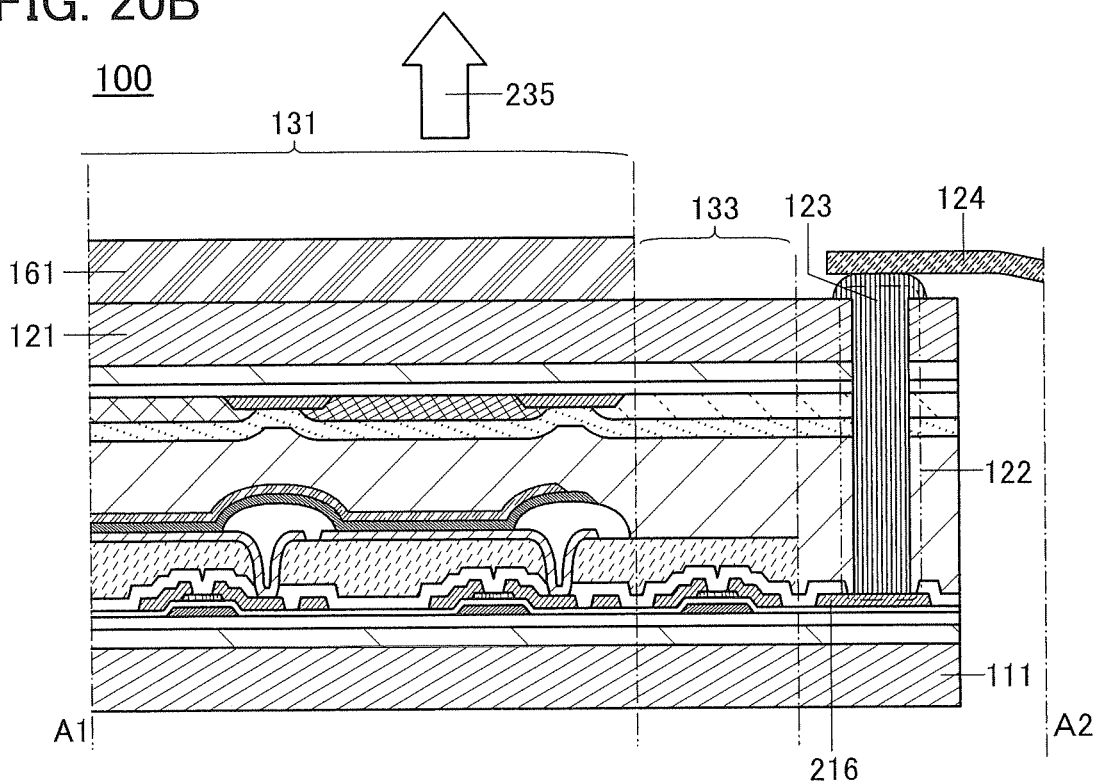

FIG. 20B is a cross-sectional view of the display device 100 having a top-emission structure including a functional layer 161. The functional layer 161 is provided on an outer surface of the substrate 121. Note that in the case where the display device 100 has a bottom-emission structure, the functional layer 161 may be provided on an outer surface of the substrate 111. In the case where the display device 100 has a dual-emission structure, the functional layers 161 may be provided on the outer surfaces of the substrate 111 and the substrate 121.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

Figure 21:
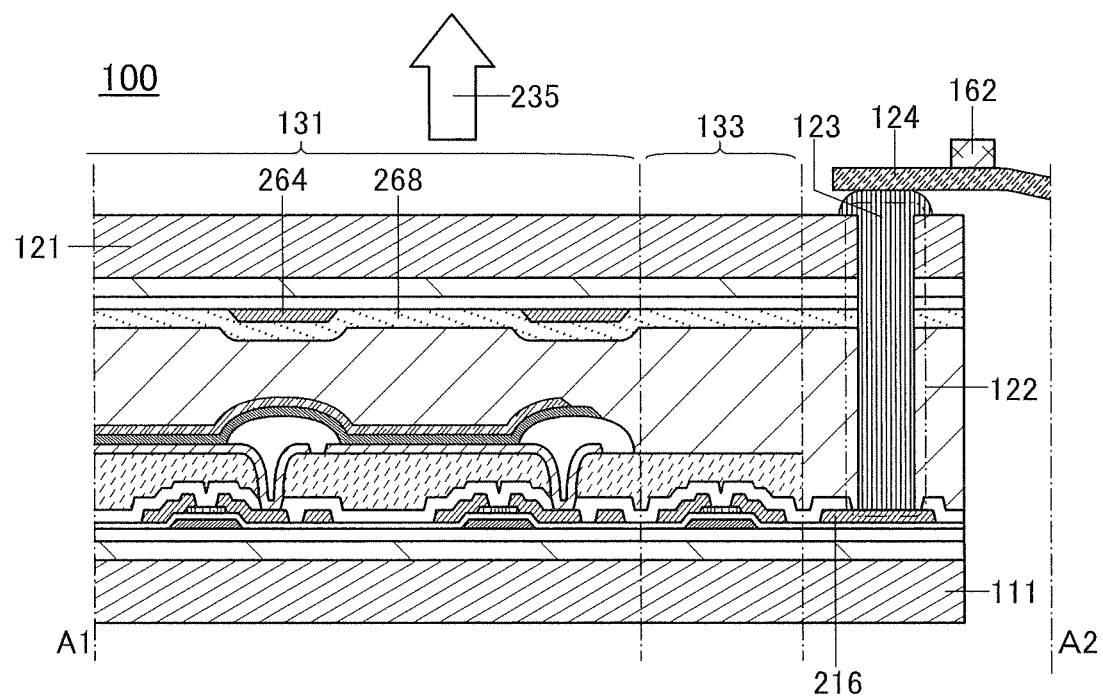
FIG. 21 is a cross-sectional view illustrating one embodiment of a display device.

In the case where the display device performs monochrome display or the case where the display device is used as a lighting device, the coloring layer 266 is not necessarily provided as illustrated in FIG. 21. According to the case, the light-blocking layer 264 and the overcoat layer 268 may be omitted. In the case where the light-emitting element 125 has a micro optical resonator structure to be described later, the coloring layer 266 may be omitted. A semiconductor chip 162 may be provided over the external electrode 124.

This embodiment can be implemented in an appropriate combination with any of the structures described in the other embodiments.

Embodiment 3

In this embodiment, a structure example of a transistor that can be used in place of the transistor described in the above embodiments will be described with reference to FIG. 22A1 to FIG. 27C.

Note that a conductive layer such as an electrode, a semiconductor layer, an insulating layer, a substrate, and the like used in a transistor disclosed in this embodiment can be formed using a material and a method disclosed in any of the other embodiments. For example, the semiconductor layer 242 can be formed using a material and a method similar to those of the semiconductor layer 208.

[Bottom-Gate Transistor]

A transistor 410 shown in FIG. 22A1 as an example is a channel-protective transistor that is a type of bottom-gate transistor. The transistor 410 includes an electrode 246 over a substrate 271 with an insulating layer 109 positioned therebetween. The transistor 410 includes a semiconductor layer 242 over the electrode 246 with an insulating layer 116 positioned therebetween. The electrode 246 can function as a gate electrode, and be formed using a material and a method similar to those of the gate electrode 206. The insulating layer 116 can function as a gate insulating layer, and be formed using a material and a method similar to those of the gate insulating layer 207.

The transistor 410 includes an insulating layer 209 that can function as a channel protective layer over a channel formation region in the semiconductor layer 242. The insulating layer 209 can be formed using a material and a method similar to those of the insulating layer 116. The transistor 410 includes an electrode 244 and an electrode 245 which are partly in contact with the semiconductor layer 242 and over the insulating layer 116. Part of the electrode 244 and part of the electrode 245 are formed over the insulating layer 209. One of the electrode 244 and the electrode 245 functions as a source electrode, and the other thereof functions as a drain electrode. The electrode 244 and the electrode 245 can be formed using a material and a method similar to those of the source electrode 209a and the drain electrode 209b.

With the insulating layer 209 provided over the channel formation region, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245. With one embodiment of the present invention, a transistor with favorable electrical characteristics can be provided.

The transistor 410 includes the layer 210 over the electrode 244, the electrode 245, and the insulating layer 209.

In the case where an oxide semiconductor is used for the semiconductor layer 242, a material which is capable of removing oxygen from part of the semiconductor layer 242 to generate oxygen vacancies is preferably used for regions of the electrodes 224 and 225 which are in contact with at least the semiconductor layer 242. The carrier concentration of the regions of the semiconductor layer 242 in which oxygen vacancies are generated is increased, so that the regions become n-type regions (n$^+$ layers). Accordingly, the regions can function as a source region and a drain region. Examples of the material which is capable of removing oxygen from the oxide semiconductor to generate oxygen vacancies include tungsten and titanium.

Formation of the source region and the drain region in the semiconductor layer 242 makes it possible to reduce contact resistance between the semiconductor layer 242 and each of the electrodes 224 and 225. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 224 and between the semiconductor layer 242 and the electrode 225. The layer that functions as an n-type semiconductor or a p-type semiconductor can function as a source region or a drain region in a transistor.

A transistor 411 illustrated in FIG. 22A2 is different from the transistor 410 in that an electrode 213 that can function as a back gate electrode is provided over the insulating layer 210. The electrode 213 can be formed using a material and a method that are similar to those of the gate electrode 206.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 246 and 213 can both function as a gate electrode. Thus, the insulating layers 116, 209, and 210 can all function as a gate insulating layer.

In the case where one of the electrode 246 and the electrode 213 is simply referred to as a "gate electrode", the other can be referred to as a "back gate electrode". For example, in the transistor 411, in the case where the electrode 213 is referred to as a "gate electrode", the electrode 246 is referred to as a "back gate electrode". In the case where the electrode 213 is used as a "gate electrode", the transistor 411 is a kind of bottom-gate transistor. Furthermore, one of the electrode 246 and the electrode 213 may be referred to as a "first gate electrode", and the other may be referred to as a "second gate electrode".

By providing the electrode 246 and the electrode 213 with the semiconductor layer 242 provided therebetween and setting the potentials of the electrode 246 and the electrode 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a highly integrated semiconductor device can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 213 each have a function of blocking an electric field generated outside, charges of charged particles and the like generated on the insulating layer 109 side or above the electrode 213 do not influence the channel formation region in the semiconductor layer 242. Therefore, degradation in a stress test (e.g., a negative gate bias temperature (−GBT) stress test in which negative charges are applied to a gate) can be reduced, and changes in the rising voltages of on-state current at different drain voltages can be suppressed. Note that this effect is caused when the electrodes 246 and 213 have the same potential or different potentials.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is small, the transistor has higher reliability.

By providing the electrode 246 and the electrode 213 and setting the potentials of the electrode 246 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 420 shown in FIG. 22B1 as an example is a channel-protective transistor that is a type of bottom-gate transistor. The transistor 420 has substantially the same structure as the transistor 410 but is different from the transistor 410 in that the insulating layer 209 covers the semiconductor layer 242. The semiconductor layer 242 is electrically connected to the electrode 244 in an opening which is formed by selectively removing part of the insulating layer 209 overlapping with the semiconductor layer 242. The semiconductor layer 242 is electrically connected to the electrode 245 in the opening which is formed by selectively removing part of the insulating layer 209 overlapping with the semiconductor layer 242. A region of the insulating layer 209 which overlaps with the channel formation region can function as a channel protective layer.

A transistor 421 illustrated in FIG. 22B2 is different from the transistor 420 in that the electrode 213 that can function as a back gate electrode is provided over the insulating layer 210.

With the insulating layer 209, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245.

The length between the electrode 244 and the electrode 246 and the length between the electrode 245 and the electrode 246 in the transistors 420 and 421 are longer than those in the transistors 410 and 411. Thus, the parasitic capacitance generated between the electrode 244 and the electrode 246 can be reduced. Moreover, the parasitic capacitance generated between the electrode 245 and the electrode 246 can be reduced.

A transistor 425 illustrated in FIG. 22C1 is a channel-etched transistor that is a type of bottom-gate transistor. In the transistor 425, the electrodes 244 and 245 are formed without using the insulating layer 209, and therefore the semiconductor layer 242 might be partly exposed and etched when the electrodes 244 and 245 are formed. However, since the insulating layer 209 is not provided, the productivity of the transistor can be increased.

A transistor 426 illustrated in FIG. 22C2 is different from the transistor 420 in that an electrode 213 that can function as a back gate electrode is provided over the insulating layer 210.

[Top-Gate Transistor]

A transistor 430 shown in FIG. 23A1 as an example is a type of top-gate transistor. The transistor 430 includes the semiconductor layer 242 over the substrate 271 with the insulating layer 109 positioned therebetween; the electrode 244 in contact with part of the semiconductor layer 242 and the electrode 245 in contact with part of the semiconductor layer 242, over the semiconductor layer 242 and the insulating layer 109; the insulating layer 116 over the semiconductor layer 242 and the electrodes 244 and 245; and the electrode 246 over the insulating layer 116.

Since, in the transistor 430, the electrode 246 overlaps with neither the electrode 244 nor the electrode 245, the parasitic capacitance generated between the electrode 246 and the electrode 244 and the parasitic capacitance generated between the electrode 246 and the electrode 245 can be reduced. After the formation of the electrode 246, an impurity element 255 is added to the semiconductor layer 242 using the electrode 246 as a mask, so that an impurity region can be formed in the semiconductor layer 242 in a self-aligned manner (see FIG. 23A3). With one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one element of a Group 13 element and a Group 15 element can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 23A2 is different from the transistor 430 in that the electrode 213 and an insulating layer 217 are included. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 23B1 as an example is a type of top-gate transistor. The transistor 440 is different from the transistor 430 in that the semiconductor layer 242 is formed after the formation of the electrode 244 and the electrode 245. A transistor 441 shown in FIG. 23B2 as an example is different from the transistor 440 in that it includes the electrode 213 and the insulating layer 217. Thus, in the transistors 440 and 441, part of the semiconductor layer 242 is formed over the electrode 244 and another part of the semiconductor layer 242 is formed over the electrode 245.

The transistor 441 as well as the transistor 411 has large on-state current for the area occupied thereby. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

In the transistors 440 and 441, after the formation of the electrode 246, the impurity element 255 is added to the semiconductor layer 242 using the electrode 246 as a mask, so that an impurity region can be formed in the semiconductor layer 242 in a self-aligned manner.

A transistor 442 illustrated in FIG. 24A1 as an example is a type of top-gate transistor. The transistor 442 includes the electrode 244 and the electrode 245 over the insulating layer 210. The electrode 244 and the electrode 245 are electrically connected to the semiconductor layer 242 through the openings formed in the insulating layer 210.

In the transistor 442, the insulating layer 116 in a region that does not overlap with the electrode 246 is partly removed. The insulating layer 116 included in the transistor 442 is partly extended across the ends of the electrode 246.

The impurity element 255 is added to the semiconductor layer 242 using the electrode 246 and the insulating layer 116 as masks, so that an impurity region can be formed in the semiconductor layer 242 in a self-aligned manner (see FIG. 24A3).

At this time, the impurity element 255 is not added to the semiconductor layer 242 in a region overlapping with the electrode 246, and the impurity element 255 is added to the semiconductor layer 242 in a region that does not overlap with the electrode 246. The semiconductor layer 242 in region to which the impurity element 255 is added through the insulating layer 116 has a lower impurity concentration than a region to which the impurity element 255 is added without through the insulating layer 116. Thus, a lightly doped drain (LDD) region is formed in the semiconductor layer 242 in a region adjacent to the electrode 246 when seen from the above.

A transistor 443 illustrated in FIG. 24A2 is different from the transistor 442 in that the transistor 443 includes an electrode 223 over the substrate 271. The electrode 223 and the semiconductor layer 242 overlap with each other with the insulating layer 109 positioned therebetween. The electrode 223 can function as a back gate electrode.

As in a transistor 444 illustrated in FIG. 24B1 and a transistor 445 illustrated in FIG. 24B2, the insulating layer 116 in a region that does not overlap with the electrode 246 may be completely removed. Alternatively, as in a transistor 446 illustrated in FIG. 24C1 and a transistor 447 illustrated in FIG. 24C2, the insulating layer 116 except for the insulating layer 116 overlapping the opening portion may be left without being removed.

In the transistors 444 to 447, after the formation of the electrode 246, the impurity element 255 is added to the semiconductor layer 242 using the electrode 246 as a mask, so that an impurity region can be formed in the semiconductor layer 242 in a self-aligned manner.

With one embodiment of the present invention, a transistor with favorable electrical characteristics can be provided. Furthermore, with one embodiment of the present invention, a highly integrated semiconductor device can be provided.

[S-Channel Transistor]

FIGS. 25A to 25C illustrate an example of a structure of a transistor including an oxide semiconductor layer as the semiconductor layer 242. In a transistor 450 illustrated in FIGS. 25A to 25C, a semiconductor layer 242b is formed over a semiconductor layer 242a, and a semiconductor layer 242c covers a top surface and a side surface of the semiconductor layer 242b and a side surface of the semiconductor layer 242a. FIG. 25A is a top view of the transistor 450. FIG. 25B is a cross-sectional view (in the channel length direction) taken along the dashed-dotted line X1-X2 in FIG. 25A. FIG. 25C is a cross-sectional view (in the channel width direction) taken along the dashed-dotted line Y1-Y2 in FIG. 25A.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf and corresponds to a metal element whose strength of bonding with oxygen is higher than that of In).

The semiconductor layer 242a and the semiconductor layer 242c are preferably formed using a material containing one or more kinds of metal elements contained in the semiconductor layer 242b. With use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, further preferably greater than or equal to 3 nm and less than or equal to 50 nm.

In the case where the semiconductor layer 242b is an In-M-Zn oxide and the semiconductor layer 242a and the semiconductor layer 242c are each an In-M-Zn oxide, the semiconductor layer 242a and the semiconductor layer 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layer 242a, the semiconductor layer 242c, and the semiconductor layer 242b are determined so that $y_1/x_1$ is large than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. At this time, $y_1$ is preferably greater than or equal to $x_1$ in the semiconductor layer 242b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than that in the semiconductor layer 242b.

In the case where the semiconductor layer 242a and the semiconductor layer 242c are each an In-M-Zn oxide, the percentages of contained In and an element M, not taking Zn and O into consideration, is preferably as follows: the content percentage of In is lower than 50 atomic % and the percentage of M is higher than or equal to 50 atomic %. The content percentages of In and M are further preferably as follows: the content percentage of In is lower than 25 atomic % and the content percentage of M is higher than or equal to 75 atomic %. In the case of using an In-M-Zn oxide for semiconductor layer 242b, the content percentages of In and element M, not taking Zn and O into consideration, are preferably such that the percentage of In is higher than or equal to 25 atomic % and the percentage of M is lower than 75 atomic %. The content percentages In and element M are further preferably such that the percentage of In is higher than or equal to 34 atomic % and the percentage of M is lower than 66 atomic %.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layers 242a, 242b, and 242c may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to obtained a highly purified semiconductor layer; accordingly, the semiconductor layer 242b can be regarded as an intrinsic or substantially intrinsic semiconductor layer. Furthermore, it is preferable that at least the channel formation region of the semiconductor layer 242b be regarded as an intrinsic or substantially intrinsic semiconductor layer.

Note that the substantially intrinsic oxide semiconductor layer refers to an oxide semiconductor layer in which the carrier density is lower than $1\times10^{17}/cm^3$, lower than $1\times10^{15}/cm^3$, or lower than $1\times10^{13}/cm^3$.

[Energy Band Structure of Oxide Semiconductor]

Figure 29:
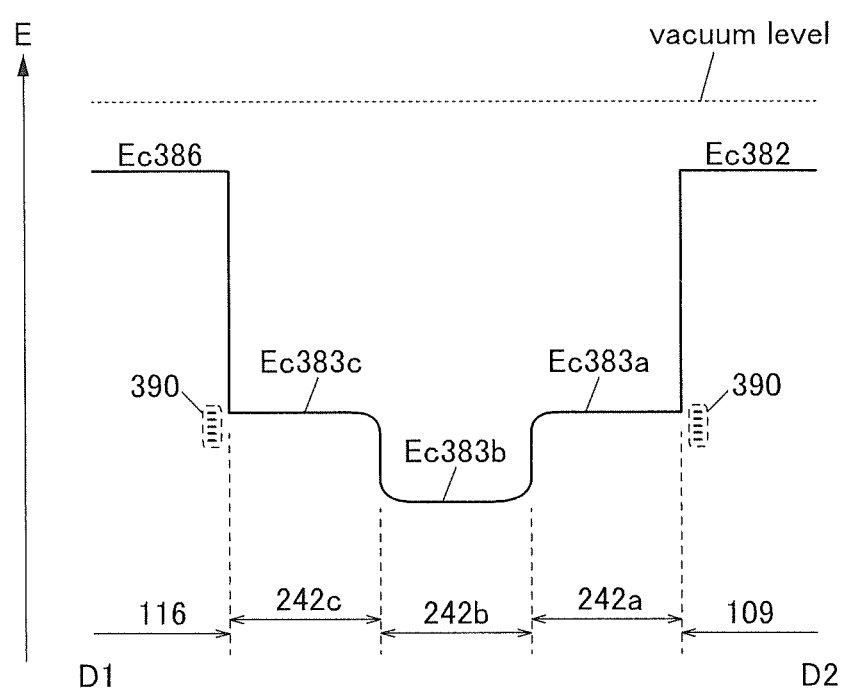
FIG. 29 illustrates an energy band structure.

The function and effect of the semiconductor layer 242 that is a stacked layer including the semiconductor layer 242a, the semiconductor layer 242b, and the semiconductor layer 242c is described with an energy band structure diagram shown in FIG. 29. FIG. 29 is the energy band structure diagram showing a portion along dashed-dotted line D1-D2 in FIG. 25B. Thus, FIG. 29 shows the energy band structure of a channel formation region of the transistor 450.

In FIG. 29, Ec382, Ec383a, Ec383b, Ec383c, and Ec386 are the energies of bottoms of the conduction band in the insulating layer 109, the semiconductor layer 242a, the semiconductor layer 242b, the semiconductor layer 242c, and the insulating layer 116, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 109 and the insulating layer 116 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 242a and the semiconductor layer 242b and the vicinity of the interface between the semiconductor layer 242b and the semiconductor layer 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the above energy band structure. Therefore, even when an interface state exists at an interface between the semiconductor layer 242a and the insulating layer 107 or an interface between the semiconductor layer 242c and the insulating layer 116, the interface state hardly influences the transfer of the electrons. In addition, the interface state does not exist or hardly exists at an interface between the semiconductor layer 242a and the semiconductor layer 242b and at an interface between the semiconductor layer 242c and the semiconductor layer 242b; thus, transfer of electrons are not prohibited in the region. Consequently, the transistor 450 having the above stacked oxide semiconductors can have high field-effect mobility.

Note that although trap states 390 due to impurities or defects might be formed in the vicinity of the interface between the semiconductor layer 242a and the insulating layer 109 and in the vicinity of the interface between the semiconductor layer 242c and the insulating layer 116 as shown in FIG. 29, the semiconductor layer 242b can be separated from the trap states owing to the existence of the semiconductor layer 242a and the semiconductor layer 242c.

In particular, in the transistor 450 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, whereby the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be greater than or equal to 0.1 eV, further preferably greater than or equal to 0.15 eV, in which case a change in the threshold voltage of the transistor can be reduced and the transistor can have favorable electrical characteristics.

Each of the band gaps of the semiconductor layer 242a and the semiconductor layer 242c is preferably larger than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small amount of off-state current. Specifically, the off-state current per micrometer of channel width at room temperature can be less than $1\times10^{-20}$ A, preferably less than $1\times10^{-22}$ A, further preferably less than $1\times10^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device or an imaging device with low power consumption can be provided.

A transistor using an oxide semiconductor in a semiconductor layer (also referred to as OS transistor) has a significantly low off-state current. Therefore, for example, when an OS transistor is used as the transistor 431, the capacitor 233 can be small. Alternatively, parasitic capacitance of the transistor or the like can be used instead of the capacitor 233 without providing the capacitor 233. Therefore, an area occupied by the pixels 130 can be reduced, which leads to high definition of the display region 131, whereby the display quality of the display device 100 can be improved. Moreover, power consumption of the display device 100 can be reduced. In addition, the display device 100 with high reliability can be provided.

The transistor 450 illustrated in FIGS. 25A to 25C is described again. A semiconductor layer 242b is provided over a projecting portion of the insulating layer 109, in which case the electrode 243 can cover a side surface of the semiconductor layer 242b. That is, the transistor 450 has a structure in which the semiconductor layer 242b is electrically surrounded by an electric field of the electrode 243. Such a structure of a transistor in which a semiconductor layer where a channel is formed is electrically surrounded by an electric field of a conductive film is referred to as a surrounded channel (s-channel) structure. A transistor having an s-channel structure is referred to as an s-channel transistor.

In the s-channel transistor, a channel is formed in the whole (bulk) of the semiconductor layer 242b in some cases. In the s-channel transistor, the drain current of the transistor can be increased, so that a larger amount of on-state current can be obtained. Furthermore, the entire channel formation region of the semiconductor layer 242b can be depleted by the electric field of the electrode 243. Accordingly, the off-state current of the s-channel transistor can be further reduced.

When the projecting portion of the insulating layer 109 is increased in height, and the channel width is shortened, the effects of the s-channel structure to increase the on-state current and reduce the off-state current can be enhanced. Part of the semiconductor layer 242a exposed in the formation of the semiconductor layer 242b may be removed. In this case, the side surfaces of the semiconductor layer 242a and the semiconductor layer 242b are aligned to each other in some cases.

Figure 26A:
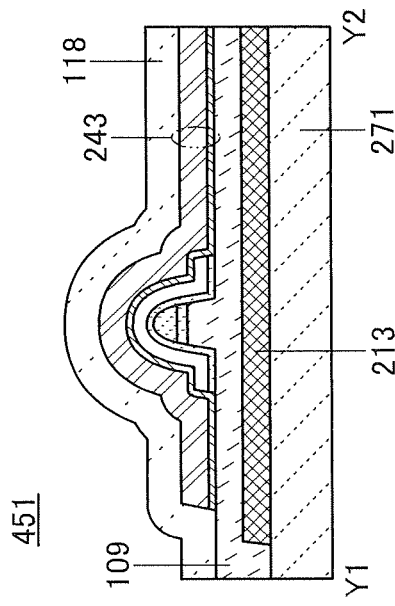
FIGS. 26A to 26C illustrate one embodiment of a transistor.
Figure 26C:
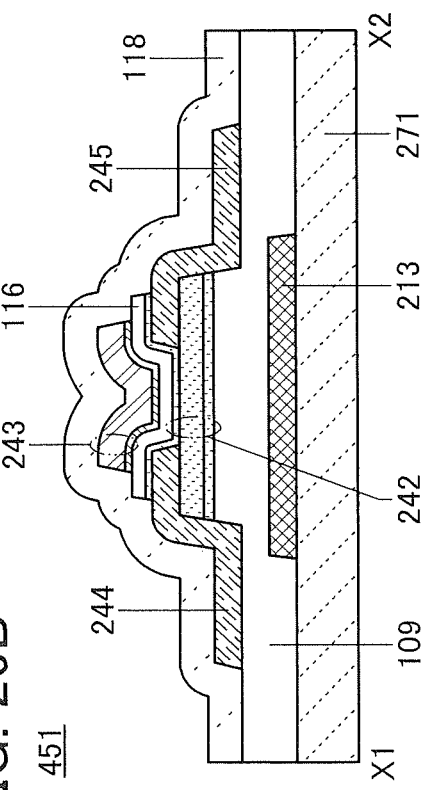
Figure 26B:
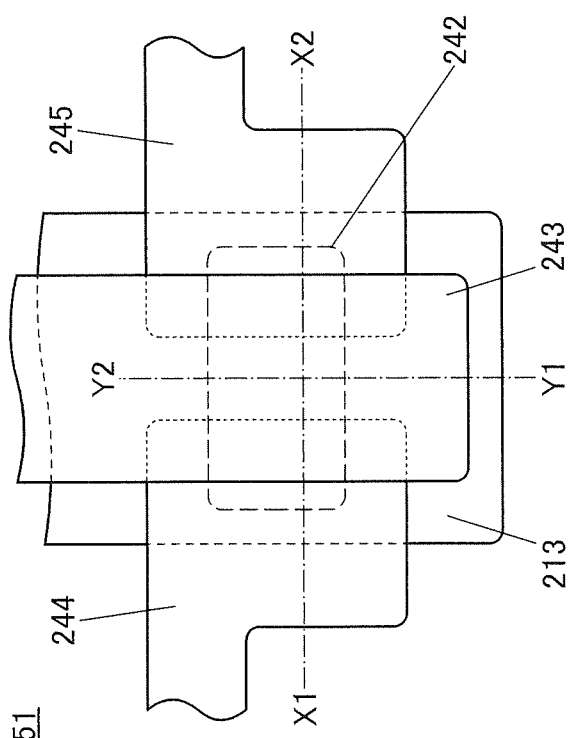

As in a transistor 451 illustrated in FIGS. 26A to 26C, the electrode 213 may be provided under the semiconductor layer 242 with an insulating layer positioned therebetween. FIG. 26A is a top view of a transistor 451. FIG. 26B is a cross-sectional view taken along the dashed-dotted line X1-X2 in FIG. 26A. FIG. 26C is a cross-sectional view taken along the dashed-dotted line Y1-Y2 in FIG. 26A.

Figure 27A:
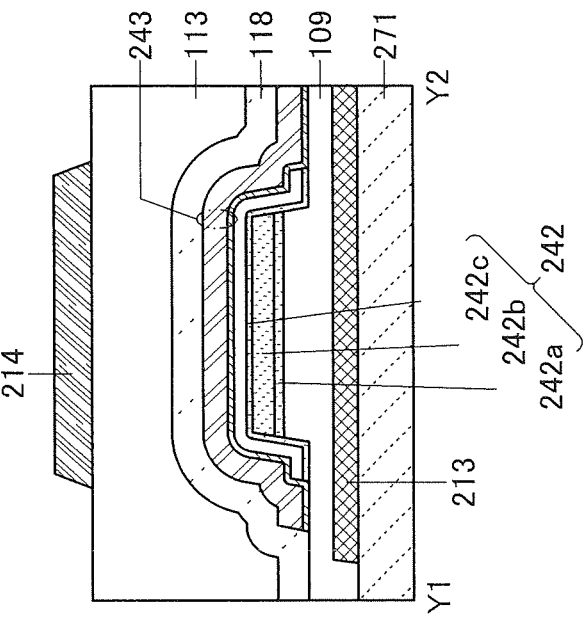
FIGS. 27A to 27C illustrate one embodiment of a transistor.
Figure 27B:
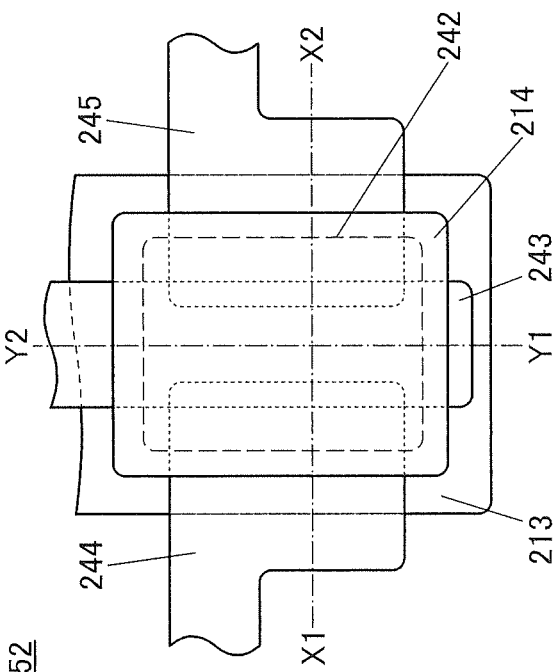
Figure 27C:
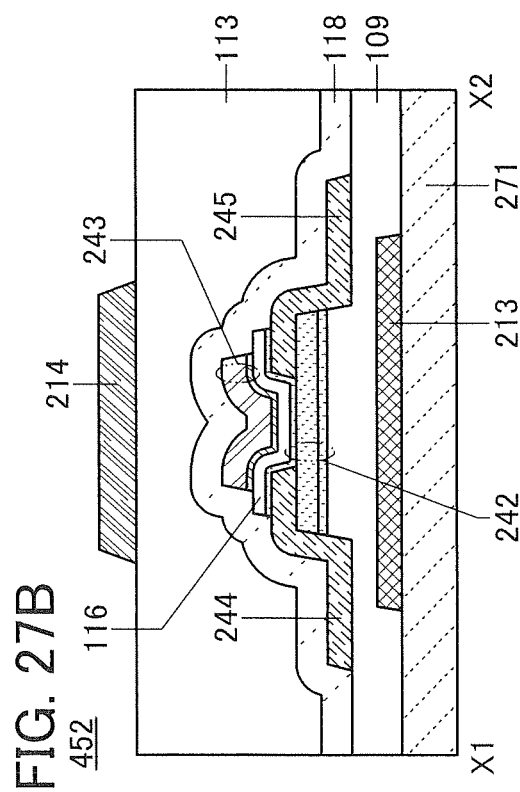

As in the transistor 452 illustrated in FIGS. 27A to 27C, a layer 214 may be provided over the electrode 243. FIG. 27A is a top view of the transistor 452. FIG. 27B is a cross-sectional view taken along the dashed-dotted line X1-X2 in FIG. 27A. FIG. 27C is a cross-sectional view taken along the dashed-dotted line Y1-Y2 in FIG. 27A.

Although the layer 214 is provided over the insulating layer 109 in FIGS. 27A to 27C, the layer 214 may be provided over the insulating layer 210. The layer 214 formed with a material with a light-blocking property can prevent a change in transistor characteristics, a decrease in reliability, or the like caused by light irradiation. In the case where the layer 214 is formed larger than at least the semiconductor layer 242b and covers the semiconductor layer 242b, the above-described effects can be enhanced. The layer 214 can be formed with an organic material, an inorganic material, or a metal material. In the case where the layer 214 is formed with a conductive material, the layer 214 may be supplied with voltage or may be electrically floating.

Figure 28C:
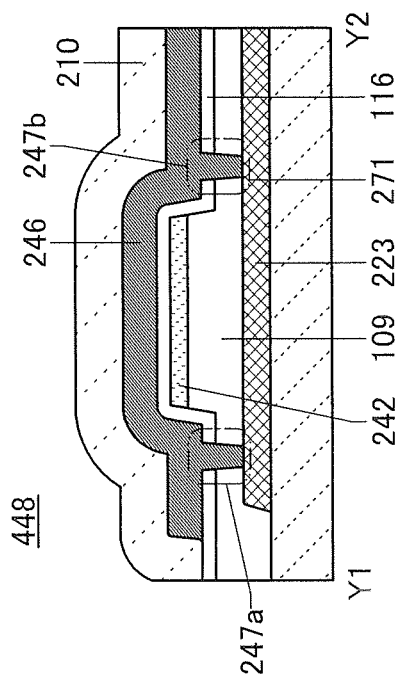
FIGS. 28A to 28C illustrate one embodiment of a transistor.
Figure 28A:
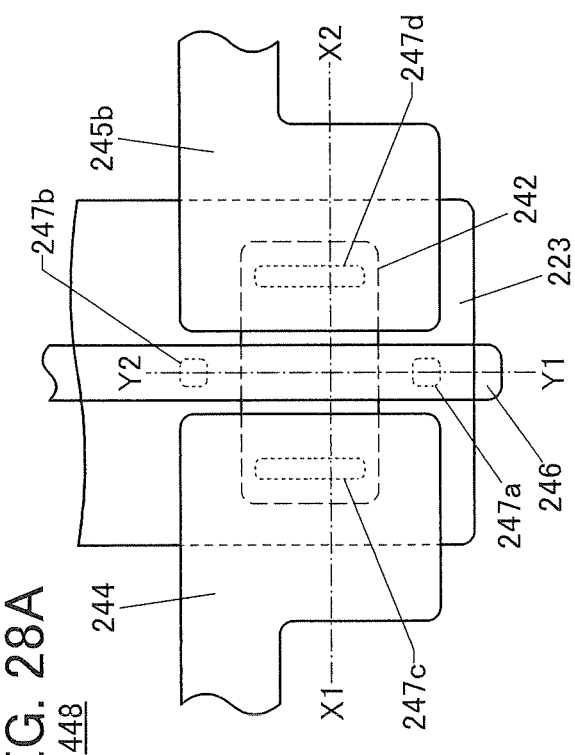
Figure 28B:
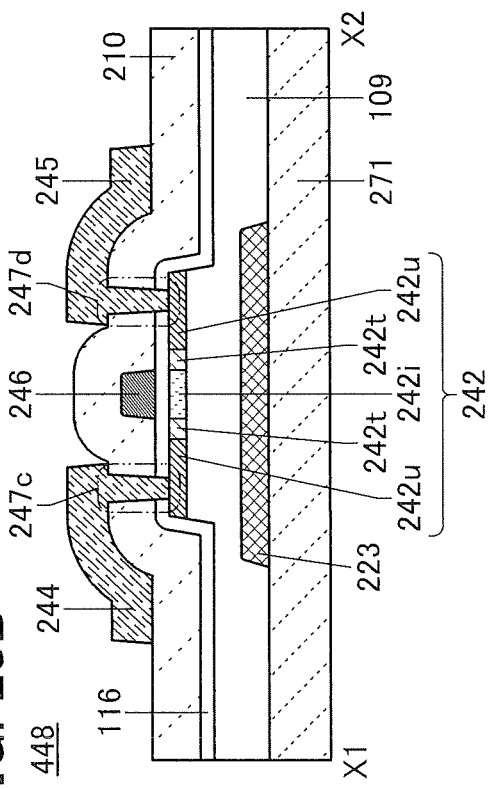

FIGS. 28A to 28C illustrate an example of a transistor with an s-channel structure. A transistor 448 in FIGS. 28A to 28C has almost the same structure as the transistor 447. In the transistor 448, the semiconductor layer 242 is formed over the projecting portion of the insulating layer 109. The transistor 448 is a kind of top-gate transistor having a back-gate electrode. FIG. 28A is a top view of the transistor 448. FIG. 28B is a cross-sectional view taken along the dashed-dotted line X1-X2 in FIG. 28A. FIG. 28C is a cross-sectional view taken along the dashed-dotted line Y1-Y2 in FIG. 28A.

FIGS. 28A to 28C illustrate an example in which an inorganic semiconductor layer such as a silicon layer is used as the semiconductor layer 242 in the transistor 448. In FIGS. 28A to 28C, the semiconductor layer 242 includes a semiconductor layer 242i overlapping with the gate electrode 246, two semiconductor layers 242t, and two semiconductor layers 242u. The semiconductor layer 242i is sandwiched between the two semiconductor layers 242t. The semiconductor layer 242i and the two semiconductor layers 242t are sandwiched between the two semiconductor layers 242u.

A channel is formed in the semiconductor layer 242i when the transistor 448 is on. Therefore, the semiconductor layer 242i serves as a channel formation region. The semiconductor layers 242t serve as low concentration impurity regions (i.e., LDD). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244 formed over the insulating layer 210 is electrically connected to one of the semiconductor layers 242u through an opening 247c formed in the insulating layer 116 and the insulating layer 210. An electrode 245 formed over the insulating layer 210 is electrically connected to the other of the semiconductor layers 242u through an opening 247d formed in the insulating layer 116 and the insulating layer 210.

The electrode 243 formed over the insulating layer 116 is electrically connected to the electrode 223 through an opening 247a and an opening 247b formed in the insulating layer 116 and the insulating layer 109. Therefore, the same potential is applied to the electrode 246 and the electrode 223. One or both of the openings 247a and 247b are not necessarily provided. In the case neither the opening 247a nor the opening 247b are provided, different potentials can be applied to the electrode 223 and the electrode 246.

This embodiment can be implemented in an appropriate combination with any of the structures described in the other embodiments.

Embodiment 4

In this embodiment, structure examples of a light-emitting element that can be applied to the light-emitting element 125 are described. Note that an EL layer 320 described in this embodiment corresponds to the EL layer 117 described in the above embodiment.

<Structure of Light-Emitting Element>

Figure 30A:
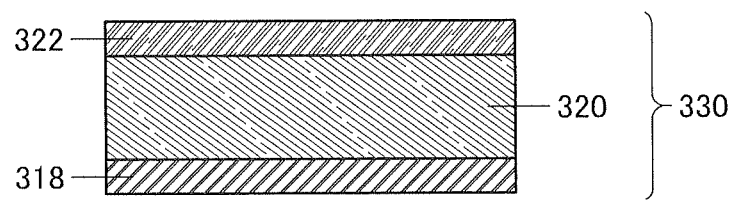
FIGS. 30A and 30B each illustrate a structure example of a light-emitting element.

In a light-emitting element 330 illustrated in FIG. 30A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

The light-emitting element 330 illustrated in FIG. 30A emits light when current flows because of a potential difference applied between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 30B:
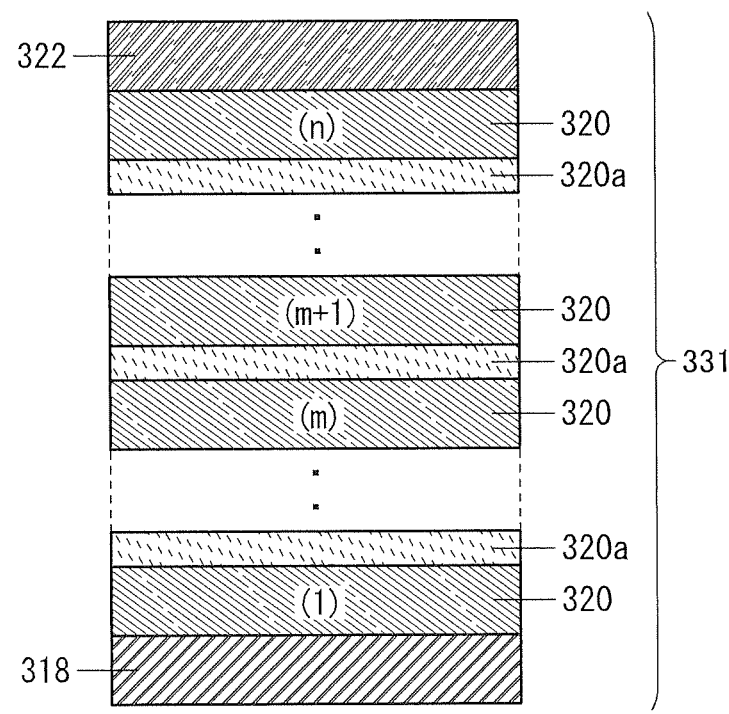

Note that a plurality of EL layers 320 may be stacked between the electrode 318 and the electrode 322 as in a light-emitting element 331 illustrated in FIG. 30B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have hole-transport properties higher than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to suffer the problem of energy transfer, quenching, or the like and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 30B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 30B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

This embodiment can be implemented in an appropriate combination with any of the structures described in the other embodiments.

Embodiment 5

In this embodiment, examples of an electronic device including the display device of one embodiment of the present invention are described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including the display device of one embodiment of the present invention, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 31A:
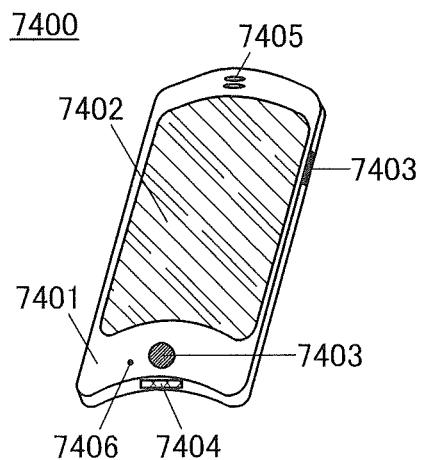
FIGS. 31A to 31F illustrate examples of electronic devices and lighting devices.

FIG. 31A is an example of a mobile phone (e.g., a smartphone). A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device of one embodiment of the present invention for the display portion 7402.

The mobile phone 7400 illustrated in FIG. 31A includes a touch sensor in the display portion 7402. When the display portion 7402 is touched with a finger or the like, data can be input into the mobile phone 7400. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 31B:
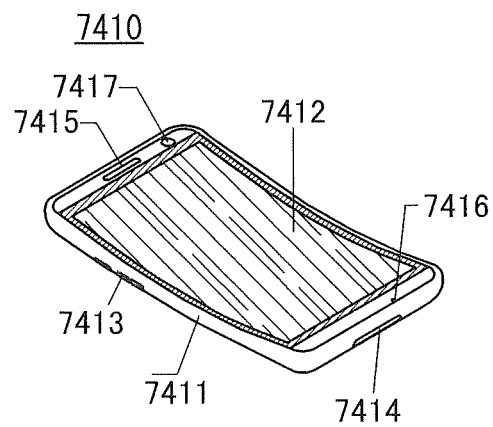

FIG. 31B illustrates an example of a mobile phone (e.g., smartphone). A mobile phone 7410 includes a housing 7411 provided with a display portion 7412, a microphone 7416, a speaker 7415, a camera 7417, an external connection portion 7414, an operation button 7413, and the like. In the case where a display device of one embodiment of the present invention is manufactured using a flexible substrate, the display device can be used for the display portion 7412 with a curved surface.

When the display portion 7412 of the cellular phone 7410 illustrated in FIG. 31B is touched with a finger or the like, data can be input to the cellular phone 7410. Operations such as making a call and creating an e-mail can be performed by touching the display portion 7412 with a finger or the like.

There are mainly three screen modes of the display portion 7412. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7412 so that characters displayed on the screen can be input. In this case, it is preferable to display a keyboard or number buttons on almost the entire screen of the display portion 7412.

The screen modes can be switched depending on the kind of images displayed on the display portion 7412. For example, when a signal of an image displayed on the display portion is a signal of moving image data, the screen mode may be switched to the display mode. When the signal is a signal of text data, the screen mode may be switched to the input mode.

In the input mode, if a touch sensor in the display portion 7412 judges that the input by touch on the display portion 7412 is not performed for a certain period, the screen mode may be switched from the input mode to the display mode.

When a detection device including a sensor (e.g., a gyroscope or an acceleration sensor) is provided inside the mobile phone 7410, the direction of display on the screen of the display portion 7412 can be automatically changed by determining the orientation of the mobile phone 7410 (whether the mobile phone is placed horizontally or vertically). Furthermore, the direction of display on the screen can be changed by touch on the display portion 7412 or operation with the operation button 7413 of the housing 7411.

Figure 31C:
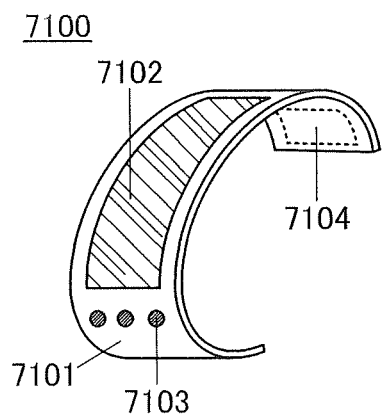

FIG. 31C is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 31D:
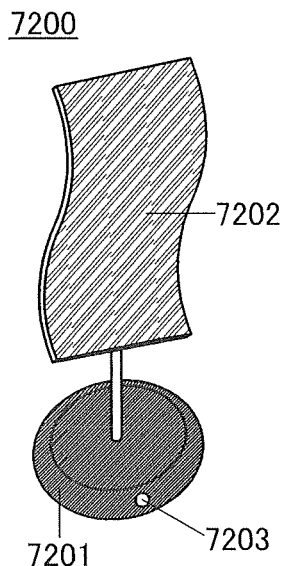
Figure 31E:
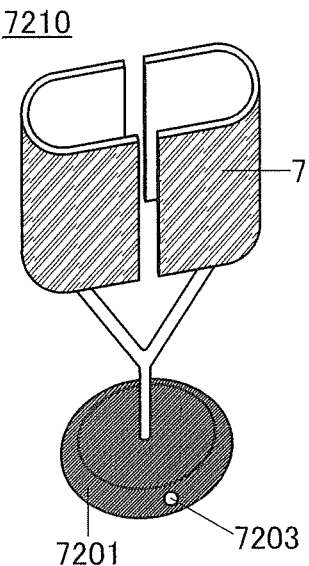
Figure 31F:
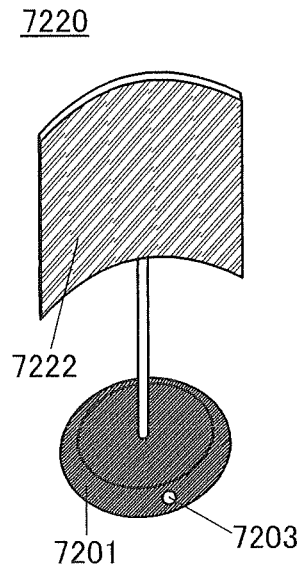

FIGS. 31D to 31F show examples of lighting devices. Lighting devices 7200, 7210, and 7220 each include a stage 7201 provided with an operation switch 7203 and a light-emitting portion supported by the stage 7201.

The lighting device 7200 illustrated in FIG. 31D includes a light-emitting portion 7202 with a wave-shaped light-emitting surface and thus is a good-design lighting device.

A light-emitting portion 7212 included in the lighting device 7210 illustrated in FIG. 31E has two convex-curved light-emitting portions symmetrically placed. Thus, light radiates from the lighting device 7210 in all directions.

The lighting device 7220 illustrated in FIG. 31F includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 32A:
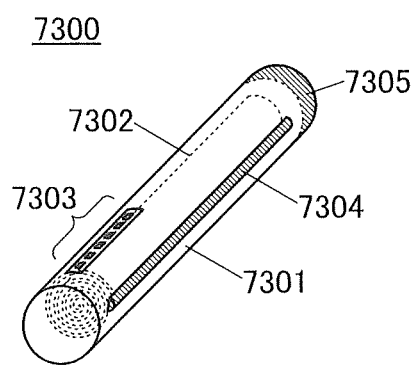
FIGS. 32A and 32B illustrate an example of an electronic device.

FIG. 32A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 32B:
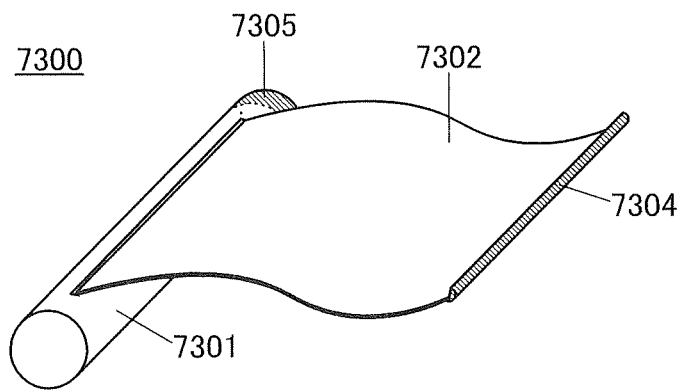

FIG. 32B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device which is flexible and highly reliable, which makes the display device 7300 lightweight and highly reliable.

Figure 33A:
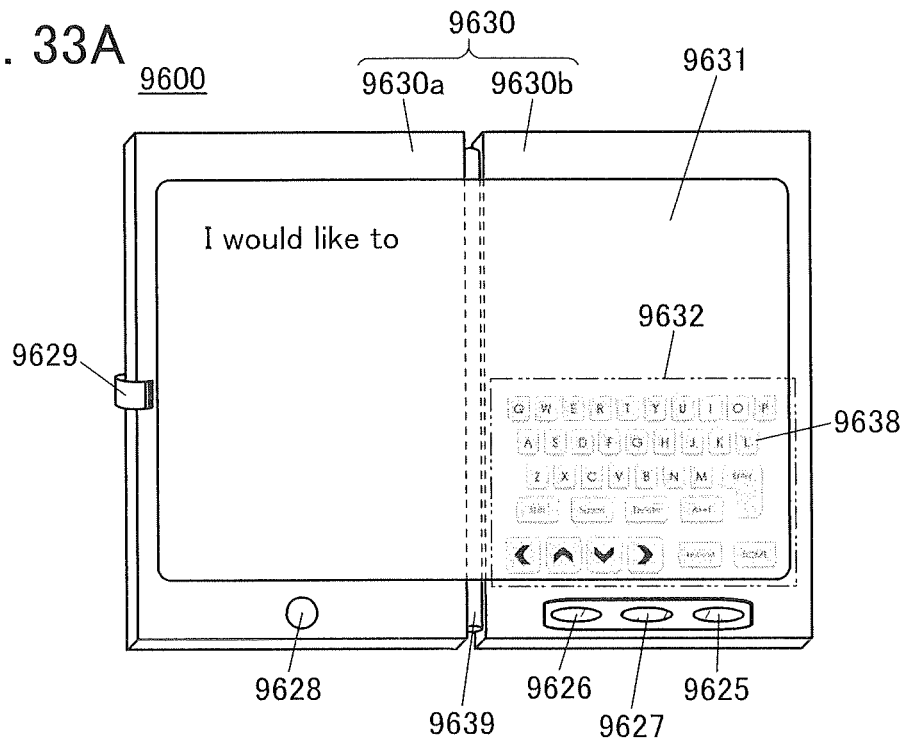
FIGS. 33A to 33C illustrate an example of an electronic device.
Figure 33B:
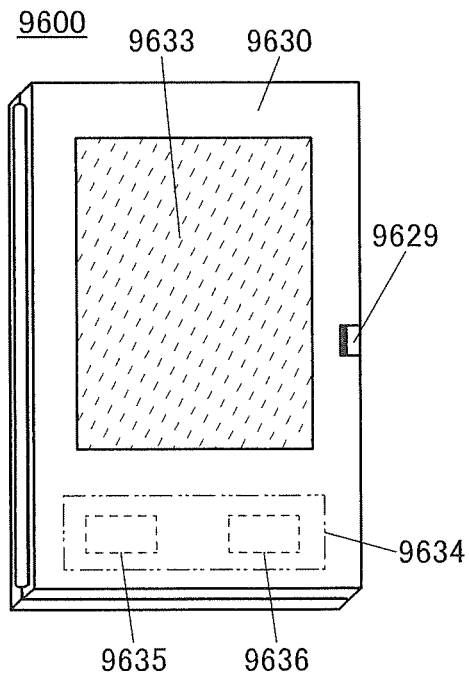

FIGS. 33A and 33B show a double foldable tablet terminal 9600 as an example. FIG. 33A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630*a* and a housing 9630*b*, which are connected with a hinge portion 9639. The hinge portion 9639 makes the housing 9630 double foldable.

The display portion 9631 is provided on the housing 9630*a*, the housing 9630*b*, and the hinge portion 9639. By the use of the display device disclosed in this specification and the like for the display portion 9631, the tablet terminal in which the display portion 9631 is foldable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between a portrait mode and a landscape mode, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 33B illustrates the tablet terminal 9600 which is folded. The tablet terminal 9600 includes the housing 9630, a solar cell 9633, and a charge and discharge control circuit 9634. As an example, FIG. 33B illustrates the charge and discharge control circuit 9634 including a battery 9635 and a DC-DC converter 9636.

By including the display device of one embodiment of the present invention, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 33A and 33B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or both surfaces of the housing 9630, in which case the battery 9635 can be charged efficiently. When a lithium ion battery is used as the battery 9635, there is an advantage of downsizing or the like.

Figure 33C:
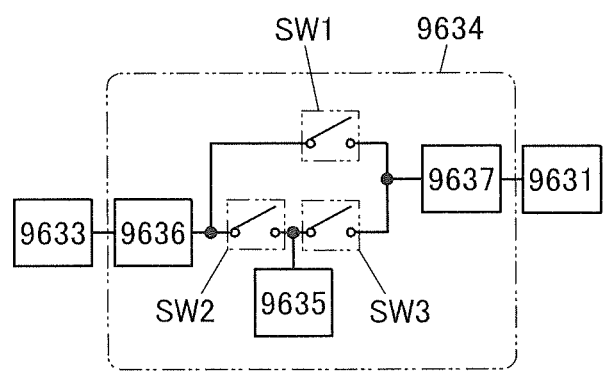

The structure and operation of the charge and discharge control circuit 9634 illustrated in FIG. 33B is described with reference to a block diagram of FIG. 33C. FIG. 33C illustrates the solar cell 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge and discharge control circuit 9634 illustrated in FIG. 33B.

First, description is made on an example of the operation in the case where power is generated by the solar cell 9633 with the use of external light. The voltage of the power generated by the solar cell is raised or lowered by the DC-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

It is needless to say that one embodiment of the present invention is not limited to the above-described electronic devices and lighting devices as long as the display device of one embodiment of the present invention is included.

Figure 34A:
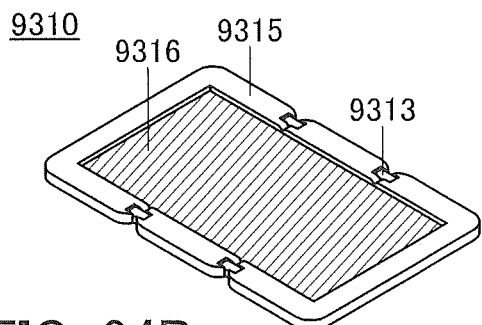
FIGS. 34A to 34I illustrate examples of electronic devices.
Figure 34B:
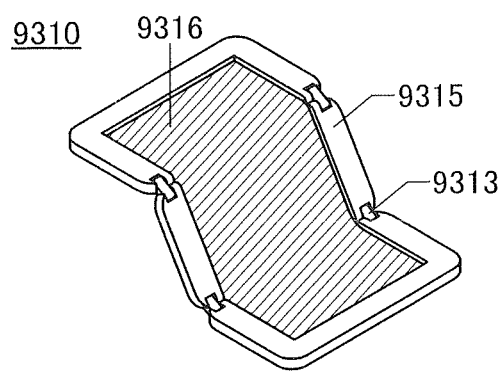
Figure 34C:
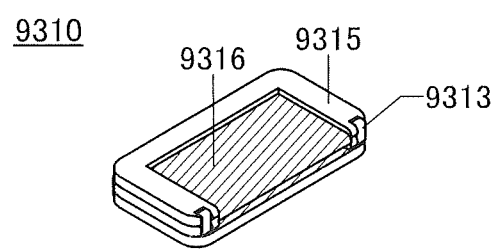

FIGS. 34A to 34C illustrate a foldable portable information terminal 9310 as an example of an electronic device. FIG. 34A illustrates the portable information terminal 9310 that is opened. FIG. 34B illustrates the portable information terminal 9310 that is being opened or being folded. FIG. 34C illustrates the portable information terminal 9310 that is folded. The portable information terminal 9310 includes a display panel 9316, housings 9315, and hinges 9313. The portable information terminal 9310 is highly portable when folded. When the portable information terminal 9310 is opened, a seamless large display region is obtained; thus, the display image is highly browsable.

The display panel 9316 included in the portable information terminal 9310 is supported by the three housings 9315 joined together by the hinges 9313. The display panel 9316 can be folded at the hinges 9313. The portable information terminal 9310 can be reversibly changed in shape from an opened state to a folded state. The display device of one embodiment of the present invention can be used for the display panel 9316. For example, a display device that can be bent with a radius of curvature of greater than or equal to 1 mm and less than or equal to 150 mm can be used. The display panel 9316 may include a touch sensor.

Note that in one embodiment of the present invention, a sensor that senses whether the display panel 9316 is in a folded state or an unfolded state may be used. The operation of a folded portion (or a portion that becomes invisible by a user by folding) of the display panel 9316 may be stopped by a control device through the acquisition of data indicating the folded state of the touch panel. Specifically, display of the portion may be stopped. In the case where a touch sensor is included, detection by the touch sensor may be stopped.

Similarly, the control device of the display panel 9316 may acquire data indicating the unfolded state of the display panel 9316 to resume displaying and sensing by the touch sensor.

Figure 34D:
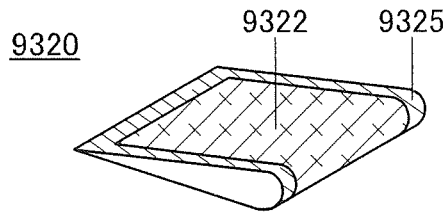
Figure 34E:
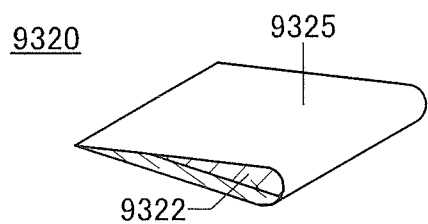

FIGS. 34D and 34E each illustrate a foldable portable information terminal 9320. FIG. 34D illustrates the portable information terminal 9320 that is folded so that a display portion 9322 is on the outside. FIG. 34E illustrates the portable information terminal 9320 that is folded so that the display portion 9322 is on the inside. When the portable information terminal 9320 is not used, the portable information terminal 9320 is folded so that a non-display portion 9325 faces the outside, whereby the display portion 9322 can be prevented from being contaminated or damaged. The display device of one embodiment of the present invention can be used for the display portion 9322.

Figure 34F:
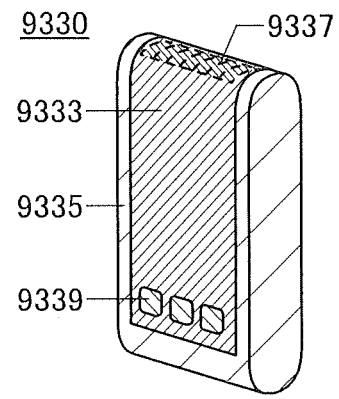
Figure 34G:
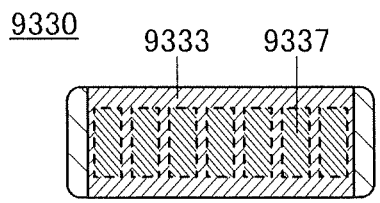
Figure 34H:
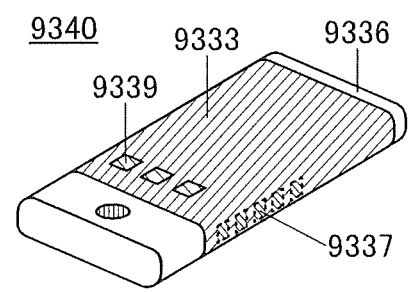

FIG. 34F is a perspective view illustrating an external shape of a portable information terminal 9330. FIG. 34G is a top view of the portable information terminal 9330. FIG. 34H is a perspective view illustrating an external shape of a portable information terminal 9340.

The portable information terminals 9330 and 9340 each function as, for example, one or more of a telephone set, a notebook, and an information browsing system. Specifically, the portable information terminals 9330 and 9340 each can be used as a smartphone.

The portable information terminals 9330 and 9340 can display characters and image information on their plurality of surfaces. For example, one or more operation buttons 9339 can be displayed on the front surface (FIG. 34F). In addition, information 9337 indicated by dashed rectangles can be displayed on the top surface (FIG. 34G) or on the side surface (FIG. 34H). Examples of the information 9337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 9339, an icon, or the like may be displayed in place of the information 9337. Although FIGS. 34F and 34G illustrate an example in which the information 9337 is displayed at the top and side surfaces, one embodiment of the present invention is not limited thereto. The information 9337 may be displayed, for example, on the bottom or rear surface.

For example, a user of the portable information terminal 9330 can see the display (here, the information 9337) with the portable information terminal 9330 put in a breast pocket of his/her clothes.

Specifically, a caller's phone number, name, or the like of an incoming call is displayed on the front surface of the portable information terminal 9330. Thus, the user can see the display without taking out the portable information terminal 9330 from the pocket and decide whether to answer the call.

The display device of one embodiment of the present invention can be used for a display portion 9333 mounted in each of a housing 9335 of the portable information terminal 9330 and a housing 9336 of the portable information terminal 9340. One embodiment of the present invention can provide a highly reliable display device having a curved display portion with a high yield.

Figure 34I:
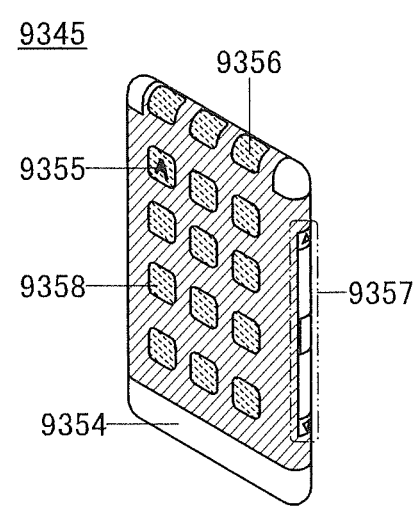

As in a portable information terminal 9345 illustrated in FIG. 34I, data may be displayed on three or more surfaces. Here, data 9355, data 9356, and data 9357 are displayed on different surfaces.

The display device of one embodiment of the present invention can be used for a display portion 9358 included in a housing 9354 of the portable information terminal 9345. One embodiment of the present invention can provide a highly reliable display device having a curved display portion with a high yield.

Figure 35A:
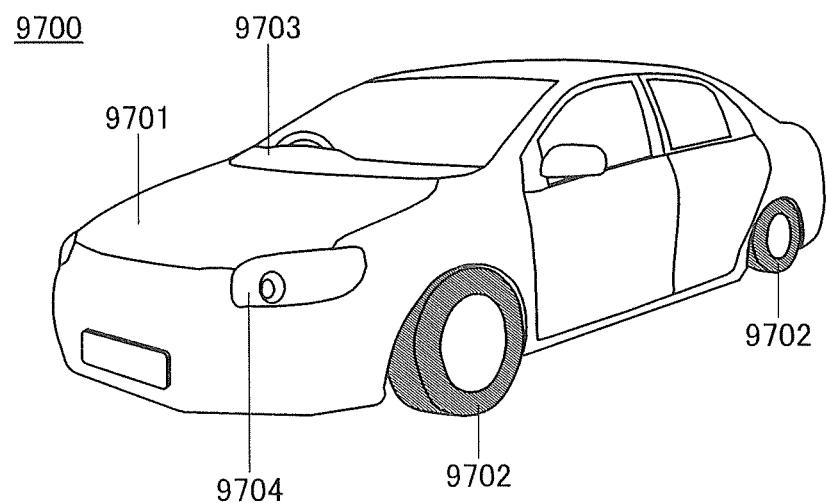
FIGS. 35A and 35B illustrate an example of an electronic device.
Figure 35B:
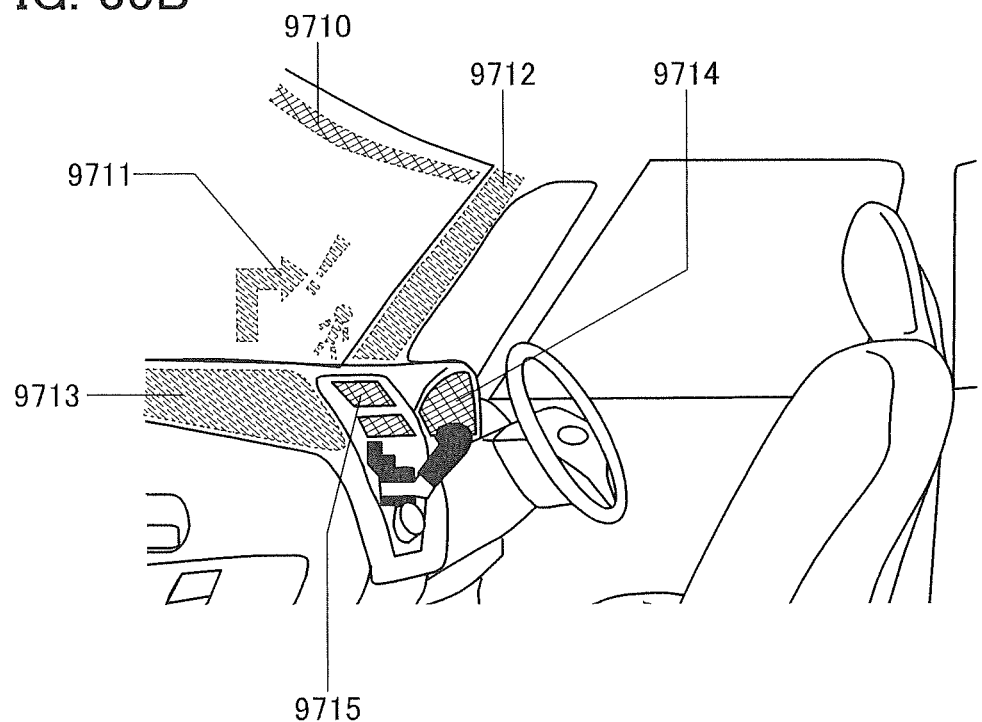

FIG. 35A is an external view of an automobile 9700. FIG. 35B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be used in display portions 9710 to 9715 illustrated in FIG. 35B.

The display portion 9710 and the display portion 9711 are display devices provided in an automobile windshield. The display device of one embodiment of the present invention can be a see-through display device, through which the opposite side can be seen, by using a light-transmitting conductive material for its electrodes. Such a see-through display device does not hinder driver's vision during driving the automobile 9700. Therefore, the display device of one embodiment of the present invention can be provided in the windshield of the automobile 9700. Note that in the case where a transistor or the like for driving the display device is provided in the display device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 36:
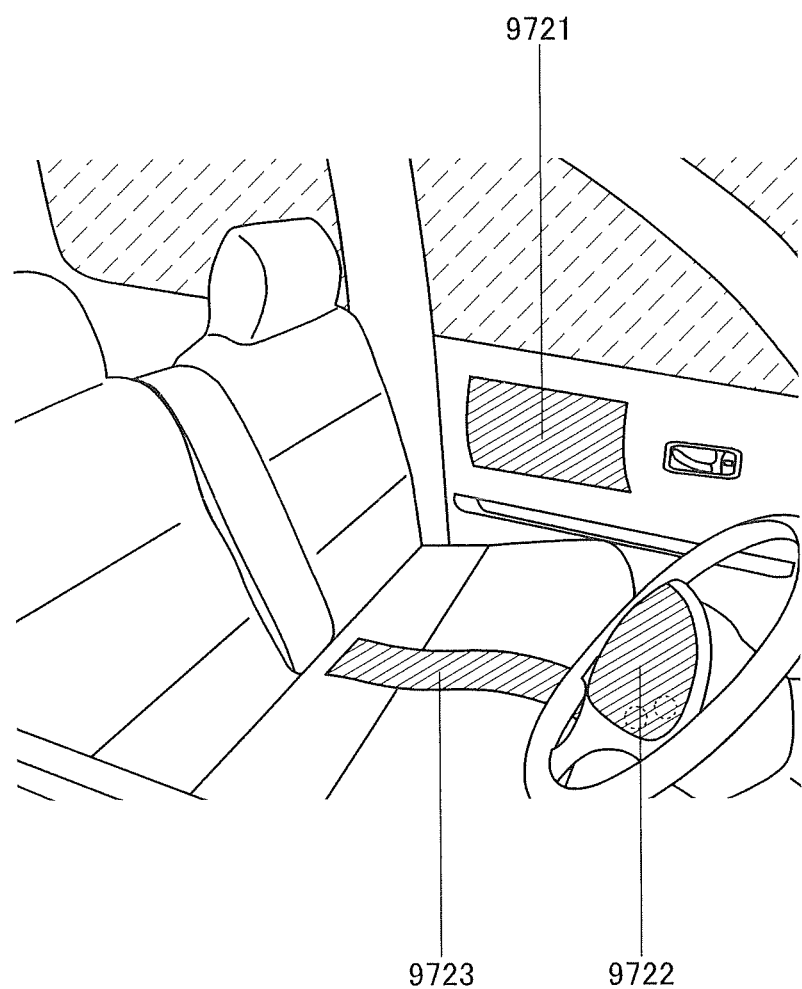
FIG. 36 illustrates an example of an electronic device.

FIG. 36 illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices. This embodiment can be implemented in an appropriate combination with any of the structures described in the other embodiments.

REFERENCE NUMERALS

100: display device, 101: substrate, 107: insulating layer, 109: insulating layer, 111: substrate, 112: bonding layer, 113: separation layer, 114: partition wall, 115: electrode, 116: insulating layer, 117: EL layer, 118: electrode, 119: insulating layer, 120: bonding layer, 121: substrate, 122: opening, 123: anisotropic conductive connection layer, 124: external electrode, 125: light-emitting element, 128: opening, 129: opening, 130: pixel, 131: display region, 132: circuit, 133: circuit, 134: transistor, 135: scan line, 136: signal line, 137: pixel circuit, 140: pixel, 141: element formation substrate, 142: bonding layer, 143: separation layer, 145: insulating layer, 147: layer, 152: circuit, 153: circuit, 161: functional layer, 162: semiconductor chip, 170: region, 171: element substrate, 181: counter substrate, 191: metallic mold, 192: depressed portion, 193: metallic mold, 194: depressed portion, 195: filler, 200: display device, 205: insulating layer, 206: gate electrode, 207: gate insulating layer, 208: semiconductor layer, 209: insulating layer, 210: insulating layer, 211: insulating layer, 213: electrode, 214: layer, 216: terminal electrode, 217: insulating layer, 219: wiring, 231: display region, 232: transistor, 233: capacitor, 235: light, 242: semiconductor layer, 243: electrode, 244: electrode, 245: electrode, 246: electrode, 252: transistor, 255: impurity element, 264: light-blocking layer, 266: coloring layer, 268: overcoat layer, 270: touch sensor, 271: substrate, 272: electrode, 273: insulating layer, 274: electrode, 275: insulating layer, 318: electrode, 320: EL layer, 322: electrode, 330: light-emitting element, 331: light-emitting element, 382: Ec, 386: Ec, 390: trap state, 410: transistor, 411: transistor, 420: transistor, 421: transistor, 430: transistor, 431: transistor, 432: liquid crystal element, 434: transistor, 435: node, 436: node, 437: node, 440: transistor, 441: transistor, 450: transistor, 451: transistor, 452: transistor, 7100: portable display device, 7101: housing, 7102: display portion, 7103: operation button, 7104: sending and receiving device, 7200: lighting device, 7201: stage, 7202: light-emitting portion, 7203: operation switch, 7210: lighting device, 7212: light-emitting portion, 7220: lighting device, 7222: light-emitting portion, 7300: display device, 7301: housing, 7302: display portion, 7303: operation button, 7304: display portion pull, 7305: control portion, 7400: mobile phone device, 7401: housing, 7402: display portion, 7403: operation button, 7404: external connection port, 7405: speaker, 7406: microphone, 7410: mobile phone device, 7411: housing, 7412: display portion, 7413: operation button, 7414: external connection portion, 7415: speaker, 7416: microphone, 7417: camera, 9310: portable information terminal, 9313: hinge, 9315: housing, 9316: display panel, 9320: portable information terminal, 9322: display portion, 9325: non-display portion, 9330: portable information terminal, 9333: display portion, 9335: housing, 9336: housing, 9337: information, 9339: operation button, 9340: portable information terminal, 9345: portable information terminal, 9354: housing, 9355: information, 9356: information, 9357: information, 9358: display portion, 9600: tablet terminal, 9625: switch, 9626: switch, 9627: power supply switch, 9628: operation switch, 9629: clasp, 9630: housing, 9631: display portion, 9632: region, 9633: solar cell, 9634: charge and discharge control circuit, 9635: battery, 9636: DC-DC converter, 9637: converter, 9638: operation key, 9639: hinge portion, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion, 130B: pixel, 130G: pixel, 130R: pixel, 130Y: pixel, 209a: source electrode, 209b: drain electrode, 242a: semiconductor layer, 242b: semiconductor layer, 242c: semiconductor layer, 320a: charge-generation layer, 383a: Ec, 383b: Ec, 383c: Ec, 9630a: housing, 9630b: housing This application is based on Japanese Patent Application serial no. 2014-152036 filed with Japan Patent Office on Jul. 25, 2014, the entire contents of which are hereby incorporated by reference.

The invention claimed is:
1. A semiconductor device comprising:
a first flexible substrate;
a first adhesive layer over the first flexible substrate;
a first insulating layer over the first adhesive layer;
a display portion having a light-emitting element over the first insulating layer;
a driver circuit over the first insulating layer;
a second adhesive layer over the display portion and the driver circuit;
a coloring layer over the second adhesive layer;
a second insulating layer over the coloring layer;
a third adhesive layer over the second insulating layer;

a second flexible substrate over the third adhesive layer, the second flexible substrate overlapping the first flexible substrate with the display portion and the driver circuit positioned therebetween;

a conductive layer in and over an opening provided in the second adhesive layer, the coloring layer, the second insulating layer, the third adhesive layer, and the second flexible substrate;

an external electrode electrically connected to the driver circuit via the conductive layer; and a first layer covering a bottom surface and side surfaces of the first flexible substrate, and a top surface and side surfaces of the second flexible substrate, wherein a Young's modulus of the first layer is smaller than a Young's modulus of each of the first flexible substrate and the second flexible substrate.

2. The semiconductor device according to claim 1, wherein a first part of the external electrode is covered with the first layer and a second part of the external electrode is not covered with the first layer.

3. The semiconductor device according to claim 1, wherein the Young's modulus of the first layer is less than or equal to one fiftieth of the Young's modulus of each of the first flexible substrate and the second flexible substrate.

4. The semiconductor device according to claim 1, wherein the Young's modulus of each of the first flexible substrate and the second flexible substrate is larger than or equal to 2 GPa and smaller than or equal to 20 GPa.

5. The semiconductor device according to claim 1, wherein the first layer has a light-transmitting property.

6. The semiconductor device according to claim 1, wherein the first layer is seamless.

7. The semiconductor device according to claim 1, wherein the first layer comprises one of silicone rubber and fluorine rubber.

8. The semiconductor device according to claim 1,
wherein the display portion comprises a transistor, and
wherein a channel formation region of the transistor comprises an oxide semiconductor.

9. The semiconductor device according to claim 1,
wherein the external electrode comprises a flexible printed circuit, and
wherein the external electrode projects from the first layer in a direction parallel to a long side of the second flexible substrate.

10. An electronic device comprising the semiconductor device according to claim 1, wherein the electronic device further comprises at least one of an antenna, a battery, an operation switch, a microphone, and a speaker.

11. The semiconductor device according to claim 1, further comprising a touch sensor provided between the display portion and the second flexible substrate.

12. The semiconductor device according to claim 1, further comprising a touch sensor provided over the second flexible substrate.

13. A semiconductor device comprising:
a first flexible substrate;
a first adhesive layer over the first flexible substrate;
a first insulating layer over the first adhesive layer;
a display portion having a light-emitting element over the first insulating layer;
a driver circuit over the first insulating layer;
a second adhesive layer over the display portion and the driver circuit;
a coloring layer over the second adhesive layer;
a second insulating layer over the coloring layer;
a third adhesive layer over the second insulating layer;
a second flexible substrate over the third adhesive layer, the second flexible substrate overlapping the first flexible substrate with the display portion and the driver circuit positioned therebetween;
a conductive layer in and over an opening provided in the second adhesive layer, the coloring layer, the second insulating layer, the third adhesive layer and the second flexible substrate;
an external electrode electrically connected to the driver circuit via the conductive layer; and
a first layer covering a first region of a bottom surface of the first flexible substrate, a top surface of the second flexible substrate, and side surfaces of at least one of the first flexible substrate and the second flexible substrate,
wherein a Young's modulus of the first layer is smaller than a Young's modulus of each of the first flexible substrate and the second flexible substrate.

14. The semiconductor device according to claim 13, wherein a first part of the external electrode is covered with the first layer and a second part of the external electrode is not covered with the first layer.

15. The semiconductor device according to claim 13, wherein the Young's modulus of each of the first flexible substrate and the second flexible substrate is larger than or equal to 2 GPa and smaller than or equal to 20 GPa.

16. The semiconductor device according to claim 13, wherein the Young's modulus of the first layer is less than or equal to one fiftieth of the Young's modulus of each of the first flexible substrate and the second flexible substrate.

17. The semiconductor device according to claim 13,
wherein the display portion comprises a transistor, and
wherein a channel formation region of the transistor comprises an oxide semiconductor.

18. The semiconductor device according to claim 13, wherein the first layer has a light-transmitting property.

19. The semiconductor device according to claim 13, wherein the first layer is seamless.

20. The semiconductor device according to claim 13, wherein the first layer comprises one of silicone rubber and fluorine rubber.

21. The semiconductor device according to claim 13,
wherein the external electrode comprises a flexible printed circuit, and
wherein the external electrode projects from the first layer in a direction parallel to a long side of the second flexible substrate.

22. An electronic device comprising the semiconductor device according to claim 13, wherein the electronic device further comprises at least one of an antenna, a battery, an operation switch, a microphone, and a speaker.

23. The semiconductor device according to claim 13, further comprising a touch sensor provided between the display portion and the second flexible substrate.

24. The semiconductor device according to claim 13, further comprising a touch sensor provided over the second flexible substrate.

* * * * *